US011238809B2

(12) United States Patent
Park et al.

(10) Patent No.: US 11,238,809 B2
(45) Date of Patent: Feb. 1, 2022

(54) SCAN SIGNAL DRIVER AND A DISPLAY DEVICE INCLUDING THE SAME

(71) Applicant: SAMSUNG DISPLAY CO., LTD., Yongin-si (KR)

(72) Inventors: Jun Hyun Park, Suwon-si (KR); Dong Woo Kim, Yongin-si (KR); An Su Lee, Seoul (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/901,079

(22) Filed: Jun. 15, 2020

(65) Prior Publication Data

US 2021/0056908 A1 Feb. 25, 2021

(30) Foreign Application Priority Data

Aug. 23, 2019 (KR) ........................ 10-2019-0103941

(51) Int. Cl.

| | |
|---|---|
| ***G09G 3/3266*** | (2016.01) |
| ***G09G 3/3225*** | (2016.01) |
| ***G09G 3/3275*** | (2016.01) |

(52) U.S. Cl.

CPC ......... *G09G 3/3266* (2013.01); *G09G 3/3225* (2013.01); *G09G 3/3275* (2013.01); *G09G 2310/08* (2013.01)

(58) Field of Classification Search

None

See application file for complete search history.

(56) References Cited

U.S. PATENT DOCUMENTS

| | | | |
|---|---|---|---|
| 10,825,539 | B2 | 11/2020 | Feng et al. |
| 2017/0186373 | A1 | 6/2017 | Nishikawa et al. |

(Continued)

FOREIGN PATENT DOCUMENTS

| | | |
|---|---|---|
| CN | 108682397 | 10/2018 |
| CN | 109920357 | 6/2019 |

(Continued)

OTHER PUBLICATIONS

Extended European Search Report issued in corresponding European Patent Application No. 20191887.7 dated May 10, 2021.

(Continued)

*Primary Examiner* — Christopher J Kohlman

(74) *Attorney, Agent, or Firm* — F. Chau & Associates, LLC

(57) ABSTRACT

A scan signal driver including: a plurality of stages for outputting scan signals and sensing signals, wherein a $k^{th}$ stage among the stages is connected to a $k^{th}$ scan signal line and a $k^{th}$ sensing signal line, and wherein the $k^{th}$ stage includes: a first output unit configured to output a scan clock signal input to a fit scan clock terminal to the $k^{th}$ scan signal line as a $k^{th}$ scan signal and to output a sensing clock signal input to a first sensing clock terminal to the $k^{th}$ sensing signal line as a k sensing signal when a pull-up node has a gate-on voltage; and a second output unit configured to output a carry clock signal input to a first carry clock terminal as a $k^{th}$ carry signal to a carry output terminal when the pull-up node has the gate-on voltage.

33 Claims, 56 Drawing Sheets

(56) References Cited

U.S. PATENT DOCUMENTS

| | | | | |
|---|---|---|---|---|
| 2018/0068631 | A1* | 3/2018 | Abe | G09G 3/20 |
| 2018/0337682 | A1 | 11/2018 | Takasugi et al. | |
| 2019/0130842 | A1 | 5/2019 | Jang et al. | |
| 2019/0164498 | A1 | 5/2019 | Jang | |
| 2019/0180691 | A1 | 6/2019 | Takasugi | |
| 2019/0189060 | A1* | 6/2019 | Takasugi | G09G 3/3266 |
| 2019/0206352 | A1 | 7/2019 | Wang et al. | |
| 2020/0035316 | A1 | 1/2020 | Feng et al. | |
| 2020/0302854 | A1 | 9/2020 | Yuan et al. | |

FOREIGN PATENT DOCUMENTS

| | | |
|---|---|---|
| CN | 109920387 | 6/2019 |
| CN | 109935187 | 6/2019 |
| CN | 109935211 | 6/2019 |
| JP | 2017173505 | 9/2017 |
| KR | 2018-0031879 | 3/2018 |

OTHER PUBLICATIONS

Electrical Engineering, "Nmos—Current Value Of Two Serial Transistors—Electrical Engineering Stack Exchange", 2017, 4 pages.

Partial European Search Report issued in corresponding European Patent Application No. 20191887.7 dated Jan. 12, 2021.

* cited by examiner

SCAN SIGNAL DRIVER AND A DISPLAY DEVICE INCLUDING THE SAME

CROSS-REFERENCE TO RELATED APPLICATION

This application claims priority under 35 U.S.C. § 119 to Korean Patent Application No. 10-2019-0103941 filed on Aug. 23, 2019, the disclosure of which is incorporated by reference herein in its entirety.

1. TECHNICAL FIELD

Exemplary embodiments of the present inventive concept relate to a scan signal driver and a display device including the same.

2. DESCRIPTION OF THE RELATED ART

As the information-oriented society evolves, display devices have become ubiquitous. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device.

A display device may include a display panel including data lines, scan signal lines, a plurality of pixels connected to the data lines and the scan signal lines, a scan signal driver for supplying scan signals to the scan signal lines, and a data driver for supplying data voltages or data signals to the data lines. The scan signal driver may be located in the non-display area of the display panel.

Recently, ultra-high-resolution display devices such as an 8K Ultra High Definition (UHD) television having the resolution of 7,680×4,320 have been developed. In such display devices, the number of pixels increases, and accordingly the area of the scan signal driver disposed in the non-display area of the display panel may increase. As a result, the non-display area of the display panel increases, and thus, the bezel width of the display device increases.

SUMMARY

According to an exemplary embodiment of the present inventive concept, a scan signal driver comprises a plurality of stages for outputting scan signals and sensing signals, wherein a $k^{th}$ stage among the stages is connected to a $k^{th}$ scan signal line and a $k^{th}$ sensing signal line, and wherein the $k^{th}$ stage comprises: a first output unit configured to output a scan clock signal input to a first scan clock terminal to the $k^{th}$ scan signal line as a $k^{th}$ scan signal and to output a sensing clock signal input to a first sensing clock terminal to the $k^{th}$ sensing signal line as a k sensing signal when a pull-up node has a gate-on voltage; and a second output unit configured to output a carry clock signal input to a first carry clock terminal as a $k^{th}$ carry signal to a carry output terminal when the pull-up node has the gate-on voltage.

According to an exemplary embodiment of the present inventive concept, a scan signal driver, comprises: a plurality of stages for outputting scan signals and sensing signals, wherein a first stage among the stages is connected to a first scan signal line and a first sensing signal line, and wherein the first stage comprises: a first output unit configured to output a scan clock signal input to a first scan clock terminal to the first scan signal line as a first scan signal and to output a sensing clock signal input to a first sensing clock terminal to the first sensing signal line as a first sensing signal when a pull-up node has a gate-on voltage; and a sensing controller configured to apply the gate-on voltage to the pull-up node during a vertical blank period of a frame period when a sensing control signal of the gate-on voltage is input to a sensing control terminal during an active period of the frame period.

According to an exemplary embodiment of the present inventive concept, a display device comprises: a display panel comprising data lines, scan signal lines and sensing signal lines, and pixels connected to the data lines, the scan signal lines and the sensing signal lines; a data driver for applying data voltages to the data lines; and a scan signal driver comprising a plurality of stages for applying scan signals to the scan signal lines and applying sensing signals to the sensing signal lines, wherein a first stage among the stages is connected to a first scan signal line and a first sensing signal line, and wherein the first stage comprises: a first output unit configured to output a scan clock signal input to a first scan clock terminal to the first scan signal line as a first scan signal and to output a sensing clock signal input to a first sensing clock terminal to the first sensing signal line as a first sensing signal when a pull-up node has a gate-on voltage; and a second output unit configured to output a carry clock signal input to a first carry clock terminal as a first carry signal to a carry output terminal when the pull-up node has the gate-on voltage.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
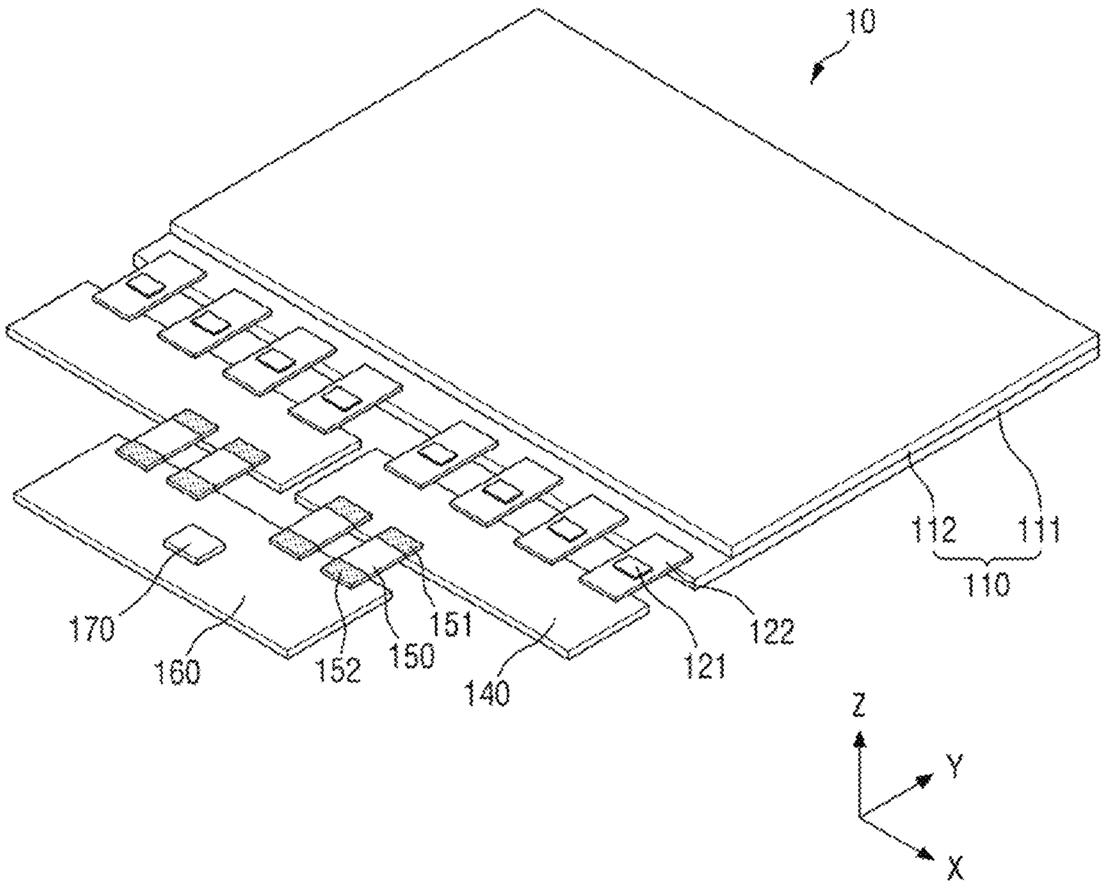
FIG. 1 is a perspective view of a display device according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each exemplary embodiment may be available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Figure 2A:
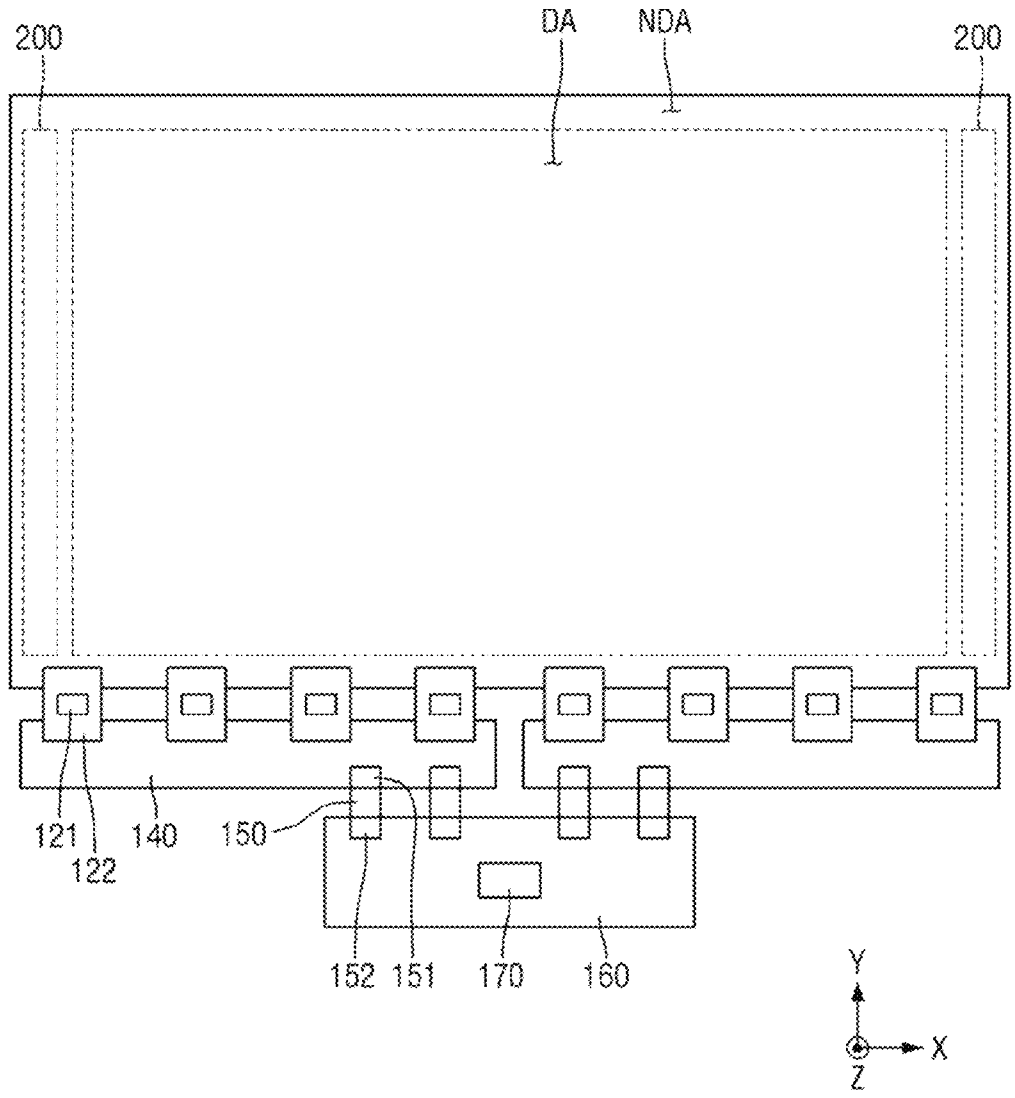
FIG. 2A is a plan view showing a display device according to an exemplary embodiment of the present inventive concept.
Figure 2B:
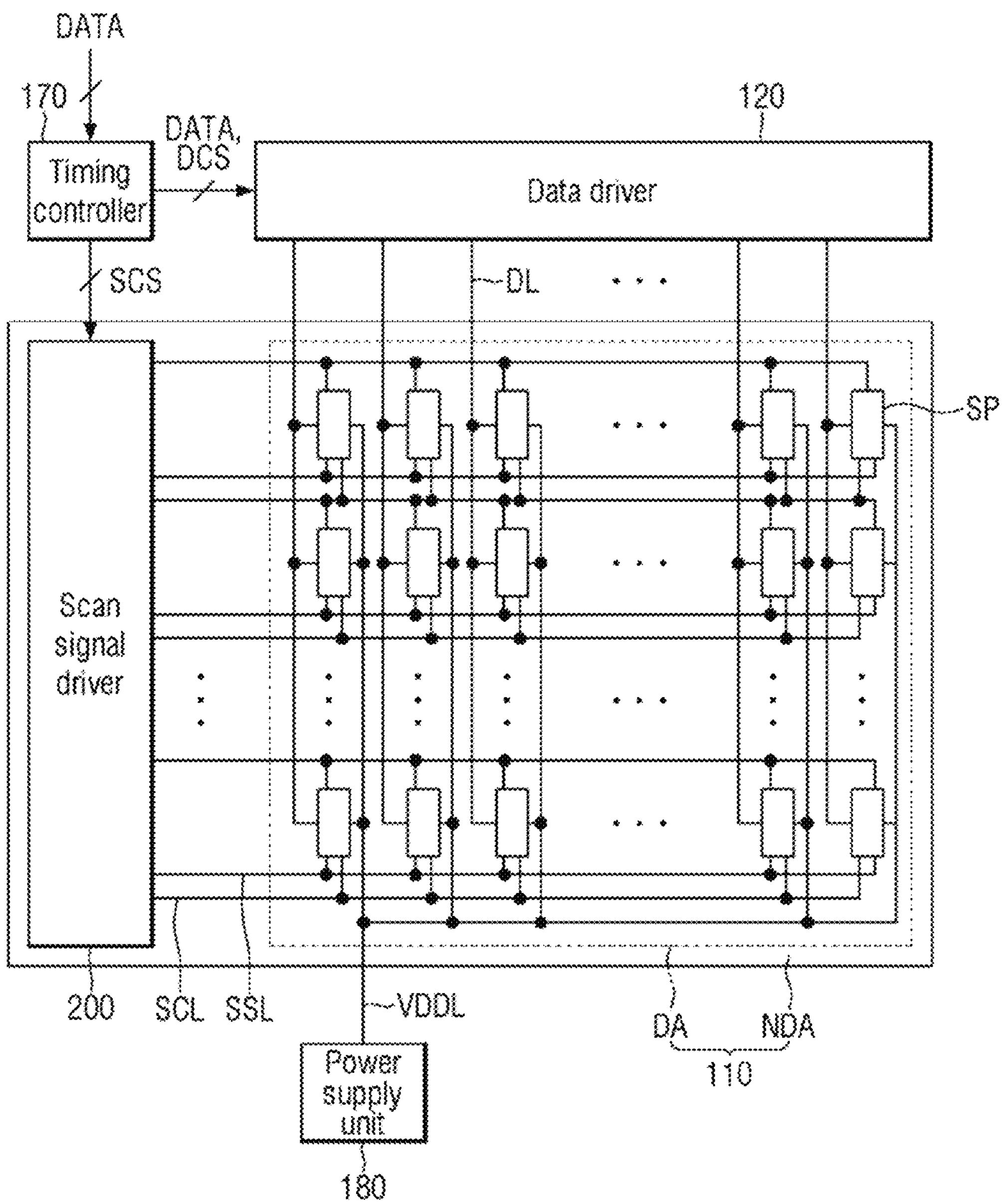
FIG. 2B is a block diagram showing a display device according to an exemplary embodiment of the present inventive concept.

FIG. 1 is a perspective view of a display device according to an exemplary embodiment of the present inventive concept. FIG. 2A is a plan view showing a display device according to an exemplary embodiment of the present inventive concept. FIG. 2B is a block diagram showing a display device according to an exemplary embodiment of the present inventive concept.

As used herein, the terms "above," "top" and "upper surface" may refer to an upper side of a display panel 110, e.g., the side indicated by the arrow in the z-axis direction, whereas the terms "below," "bottom" and "lower surface" may refer to a lower side of the display panel 110, e.g., the opposite side in the z-axis direction. As used herein, the terms "left side," "right side," "upper side" and "lower side" may indicate relative positions when the display panel 110 is viewed from the top. For example, the "left side" may refer to the opposite direction indicated by the arrow of the x-axis, the "right side" may refer to the direction indicated by the arrow of the x-axis, the "upper side" may refer to the direction indicated by the arrow of the y-axis, and the "lower side" may refer to the opposite direction indicated by the arrow of the y-axis.

As used herein, a display device 10 according to an exemplary embodiment of the present inventive concept is for displaying moving images or still images. The display device 10 may be used as the display screen of portable electronic devices such as a mobile phone, a smart phone, a tablet personal computer (PC), a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things (IoT). In the following description, although the display device 10 according to the exemplary embodiment of the present inventive concept is a middle- or large-sized display device including a plurality of source drivers 121, this is merely illustrative. For example, the display device 10 according to an exemplary embodiment of the present inventive concept may be a small-sized display device including a single source driver 121, and may include no flexible film, no source circuit board, and no cable. In addition, when the display device 10 is a small-sized display device, the source driver 121 and a timing controller 170 may be integrated into a single integrated circuit and disposed on a circuit board or attached on a first substrate 111 of the display panel 110. Examples of the middle- or large-sized display devices include monitors, television sets, etc., and examples of small-sized display devices include smart phones, tablet PCs, etc.

Referring to FIGS. 1, 2A and 2B, the display device 10 includes the display panel 110, a data driver 120 including source drivers 121, flexible films 122, source circuit boards 140, first cables 150, a control circuit board 160, a timing controller 170, a power supply 180, and a scan signal driver 200.

The display panel 110 may have a rectangular shape when viewed from the top. For example, the display panel 110 may have a rectangular shape having longer sides in a first direction (x-axis direction) and shorter sides in a second direction (y-axis direction) when viewed from the top as shown in FIG. 2A. The corners where the shorter sides in the first direction (x-axis direction) meet the longer sides in the second direction (y-axis direction) may be a right angle or may be rounded with a predetermined curvature. The shape of the display panel 110 when viewed from the top is not limited to a rectangular shape, but may be a different polygonal shape, a circular shape, or an elliptical shape. In addition, although the display panel 110 is flat in FIG. 2A, this is merely illustrative. For example, the display panel 110 may include a curved portion that is bent at a predetermined curvature.

The display panel 110 may include the first substrate 111 and a second substrate 112. The second substrate 112 may face the first substrate 111. The first substrate 111 and the second substrate 112 may be rigid or flexible. The first substrate 111 may be made of glass or plastic. The second substrate 112 may be formed of glass, plastic, an encapsulation film, or a barrier film. Alternatively, the second substrate 112 may be omitted.

In addition, the display panel 110 may be an organic light-emitting display panel using organic light-emitting diodes (LEDs), a quantum-dot light-emitting display panel including a quantum-dot light-emitting layer, an inorganic light-emitting display panel including an inorganic semiconductor, and a micro light-emitting display panel using micro light-emitting diodes. In the following description, an organic light-emitting display panel is employed as the display panel 110. It is to be understood, however, that the present inventive concept is not limited thereto.

The display panel 110 may include a display area DA where sub-pixels SP are located to display images, and a non-display area NDA which is the peripheral area of the display area DA. In the display area DA, scan signal lines SCL, sensing signal lines SSL, data lines DL and a first supply voltage line VDDL connected to the sub-pixels SP may be disposed, as well as the sub-pixels SP. The scan signal lines SCL and the sensing signal lines SSL may extend in the first direction (x-axis direction) in the display area DA. The data lines DL may extend in the second direction (y-axis direction) crossing the first direction (x-axis direction) in the display area DA. The first supply voltage line VDDL may extend in the second direction (y-axis direction) in the display area DA.

Each of the sub-pixels SP may be connected to one of the scan signal lines SCL, one of the data lines DL and one of the sensing signal lines SSL. In FIG. 2A, each of the sub-pixels SP is connected to one scan signal line SCL, one data line DL and one sensing signal line SSL, but the present inventive concept is not limited thereto. The sub-pixels SP may be commonly connected to the first supply voltage line VDDL.

Each of the sub-pixels SP may include a driving transistor, at least one switching transistor, a light-emitting element, and a capacitor. The switching transistor may be turned on in response to a scan signal from a scan signal line SCL, so that the data voltage from the data line DL may be applied to the gate electrode of the driving transistor. When the data voltage is applied to the gate electrode of the driving transistor, the driving transistor may supply a driving current to the light-emitting element, so that light can be emitted. The driving transistor and the at least one switching transistor may be thin-film transistors. The light-emitting element may emit light in accordance with the driving current from the driving transistor. The light-emitting element may be an organic light-emitting diode including a first electrode, an organic emissive layer, and a second electrode. The capacitor can keep the data voltage applied to the gate electrode of the driving transistor constant.

The non-display area NDA may include the area from the outer side of the display area DA to the edge of the display panel 110. In the non-display area NDA, the scan signal driver 200 for applying scan signals to the scan signal lines SCL and applying the sensing signals to the sensing signal lines SSL may be disposed.

The scan signal driver 200 may be connected to the display panel 100 through a plurality of scan control lines SCL. The scan signal driver 200 may receive scan control signals SCS from the timing controller 170. The scan control signals SCS may include a plurality of clock signals, a sensing control signal, a gate-on voltage, and a gate-off voltage. The scan signal driver 200 may generate scan signals and sensing signals according to the scan control signals SCS, and may output the scan signals and the sensing signals to the scan signal lines SCL and the sensing signal lines SSL. The scan signal driver 200 is arranged in each of the non-display areas NDA on both sides of the display area DA, for example, on the left and right sides of the display area DA in the example shown in FIG. 2A, but the present inventive concept is not limited thereto. For example, the scan signal driver 200 may be arranged in the non-display area NDA on one side of the display area DA, e.g., on the left side or the right side of the display area DA.

One end of each of the flexible films 122 may be attached on a first surface of the first substrate 111 of the display panel 110 while the other end of each of the flexible films 122 may be attached on a surface of the respective source circuit boards 140. For example, since the second substrate 112 is smaller than the first substrate 111, one side of the first substrate 111 may not covered by the second substrate 112 and may be exposed. The flexible films 122 may be attached to the side of the first substrate 111 that exposed by not being covered by the second substrate 112. Each of the flexible films 122 may be attached to a first surface of the first substrate 111 and the surface of the respective source circuit boards 140 using an anisotropic conductive film.

Each of the flexible films 122 may be a tape carrier package or a chip-on-film. The flexible films 122 may be bent so that they are located below the first substrate 111. In this case, the source circuit boards 140, the first cables ISO and the control circuit board 160 may be disposed on the lower surface of the display panel 110. Although FIGS. 1 and 2A illustrate that the eight flexible films 122 are attached on the first substrate 111 of the display panel 110, the number of the flexible films 122 is not limited to eight.

The source drivers 121 of the data driver 120 may be disposed on one surface of the respective flexible films 122. Each of the source drivers 121 may be implemented as an integrated circuit (IC). The data driver 120 converts digital video data DATA into analog data voltages according to the source control signal DCS from the time controller 170 and supplies the analog data voltages to the data lines through the flexible films 122.

Each of the source circuit boards 140 may be connected to the control circuit board 160 via the first cables 150. Each of the source circuit boards 140 may include first connectors 151 for connecting to the first cables 150. Each of the source circuit boards 140 may be a flexible printed circuit board or a printed circuit board. The first cables 150 may be flexible cables.

The control circuit board 160 may be connected to the source circuit boards 140 via the first cables 150. To accomplish this, the control circuit board 160 may include second connectors 152 for connecting to the first cables 150. The control circuit board 160 may be a flexible printed circuit board or a printed circuit board.

Although the four first cables 150 connect the source circuit boards 140 with the control circuit board 160 in the example shown in FIGS. 1 and 2A, the number of the first cables 150 is not limited to four. In addition, although the two source circuit boards 140 are shown in FIGS. 1 and 2A, the number of the source circuit boards 140 is not limited two.

In addition, when there are a small number of the flexible films 122, the source circuit boards 140 may be eliminated. In this case, the flexible films 122 may be connected directly to the control circuit board 160.

The timing controller 170 may be disposed on one surface of the control circuit board 160. The timing controller 170 may be implemented as an integrated circuit. The timing controller 170 receives digital video data DATA and timing signals from a system-on-chip of the system circuit board. The timing controller 170 may generate the source control signal DCS for controlling the timing of the source drivers 121 of the data driver 120 and the scan control signals SCS for controlling the timing of the scan signal driver 200 according to the timing signals. The timing controller 170 may output the scan control signals SCS to the scan signal driver 200, and may output the digital video data DATA and the source control signal DCS to the data driver 120.

The power supply 180 may generate a first supply voltage and supply the first supply voltage to the first supply voltage line VDDL. In addition, the power supply 180 may generate a second supply voltage and supply the second supply voltage to the cathode electrode of the organic light-emitting diode of each of the sub-pixels SP. The first driving voltage may be a high-level voltage for driving the organic light-emitting diode, and the second driving voltage may be a low-level voltage for driving the organic light-emitting diode. In other words, the first driving voltage may have a higher level than that of the second driving voltage. In addition, the power supply 180 may generate a reference voltage and supply the reference voltage to a reference voltage line connected to each of the sub-pixels SP.

Figure 3:
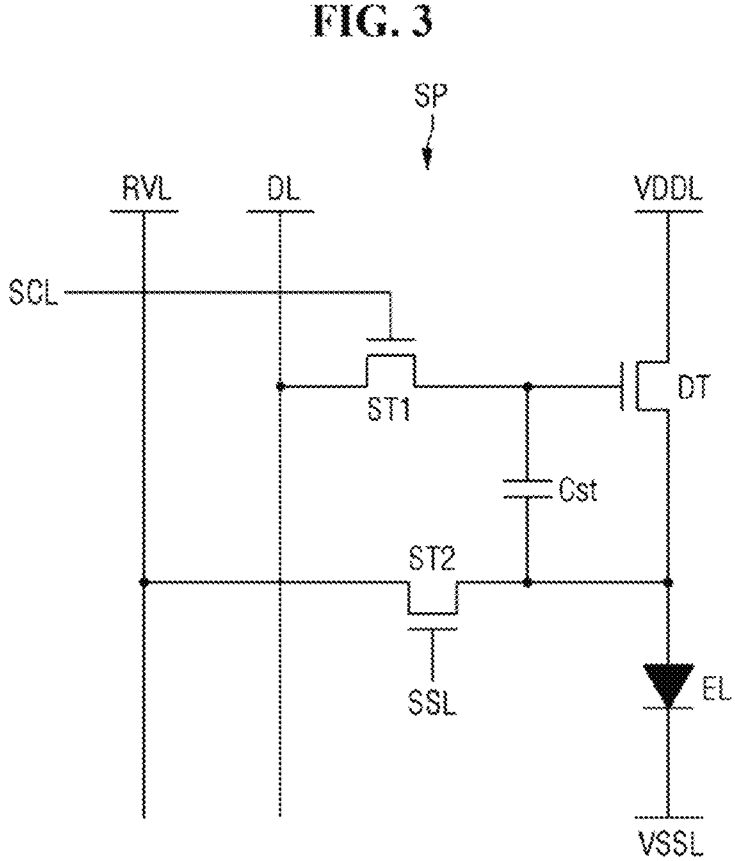
FIG. 3 is a circuit diagram showing a sub-pixel according to an exemplary embodiment of the present inventive concept in detail.

FIG. 3 is a circuit diagram showing a sub-pixel according to an exemplary embodiment of the present inventive concept in detail.

Referring to FIG. 3, a sub-pixel SP may include a light-emitting element EL, a driving transistor DT, a first switching transistor ST1, a second switching transistor ST2, and a capacitor Cst.

The light-emitting element EL emits light in proportion to the current supplied through the driving transistor DT. The light-emitting element EL may be, but is not limited to, an organic light-emitting diode. For example, the light-emitting element EL may be a quantum-dot light-emitting diode, an inorganic light-emitting diode, or a micro light-emitting diode. When the light-emitting element EL is an organic light-emitting diode, it may include an anode electrode, a hole transporting layer, an organic light-emitting layer, an electron transporting layer, and a cathode electrode. When a voltage is applied to the anode electrode and the cathode electrode, the holes and electrons move to the organic light-emitting layer through the hole transporting layer and the electron transporting layer, respectively, such that they combine in the organic light-emitting layer to emit light. The anode electrode of the light-emitting element EL may be connected to the source electrode of the driving transistor DT, and the cathode electrode of the light-emitting element EL may be connected to a second supply voltage line VSSL from which a low-level voltage lower than the high-level voltage is applied.

The driving transistor DT adjusts a current flowing from the first supply voltage line VDDL from which the first supply voltage is supplied to the light-emitting element EL according to the voltage difference between the gate electrode and the source electrode of the driving transistor DT. The gate electrode of the driving transistor DT may be connected to a first electrode of the first switching transistor ST1, the source electrode of the driving transistor DT may be connected to the anode electrode of the light-emitting element EL, and the drain electrode of the driving transistor DT may be connected to the first supply voltage line VDDL to which a high-level voltage is applied.

The first switching transistor ST1 is turned on by the scan signal of the scan signal line SCL to connect the data line DL with the gate electrode of the driving transistor DT. The gate electrode of the first switching transistor ST1 may be connected to the scan signal line SCL, the first electrode of the first switching transistor ST1 may be connected to the gate electrode of the driving transistor DT, and the second electrode of the first switching transistor ST1 may be connected to the data line DL.

The second switching transistor ST2 is turned on by the sensing signal of the sensing signal line SSL to connect a reference voltage line RVL to the source electrode of the driving transistor DT. The gate electrode of the second switching transistor ST2 may be connected to the sensing signal line SSL, the first electrode of the second switching transistor ST2 may be connected to the reference voltage line RVL, and the second electrode of the second switching transistor ST2 may be connected to the source electrode of the driving transistor DT.

One of the first electrode and the second electrode of each of the first and second switching transistors ST and ST2 may be a source electrode, while the other may be a drain electrode.

The capacitor Cst may be arranged between the gate electrode and the source electrode of the driving transistor DT. The capacitor Cst stores the voltage equal to the difference between the gate voltage and the source voltage of the driving transistor DT.

The driving transistor DI and the first and second switching transistors ST and ST2 may be thin-film transistors. In addition, although FIG. 3 shows that each of the driving transistor DT and the first and second switching transistors ST1 and ST2 is implemented as an n-type metal oxide semiconductor field effect transistor (MOSFET), it is to be noted that the present inventive concept is not limited thereto. The driving transistor DT and the first and second switching transistors ST1 and ST2 may be implemented as a p-type MOSFET.

Figure 4:
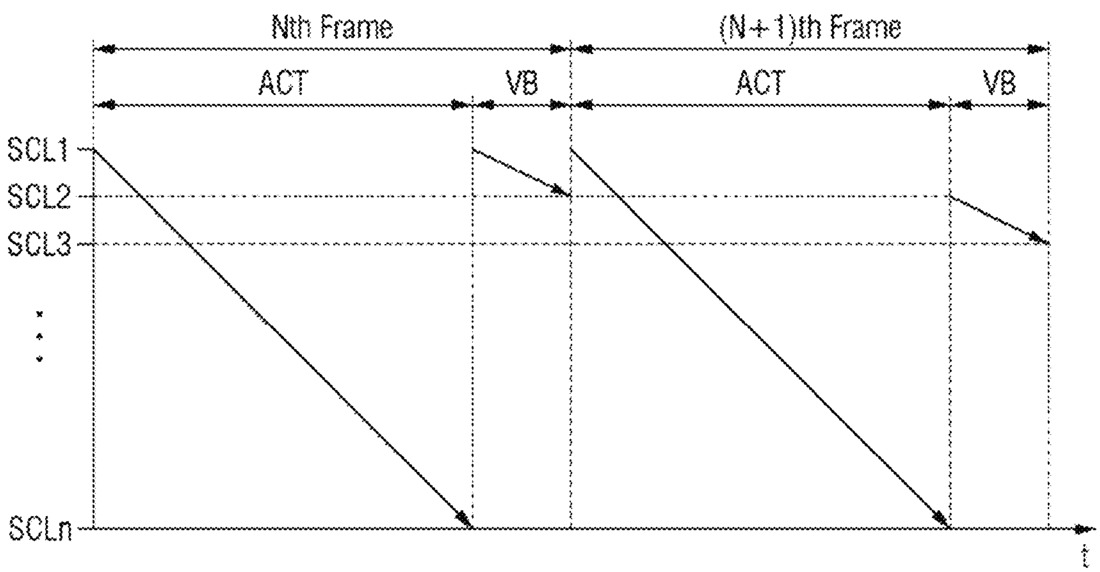
FIG. 4 is a graph showing driving timing of sub-pixels in an $N^{th}$ frame period and an $(N+1)^{th}$ frame period, according to an exemplary embodiment of the present inventive concept.
Figure 5:
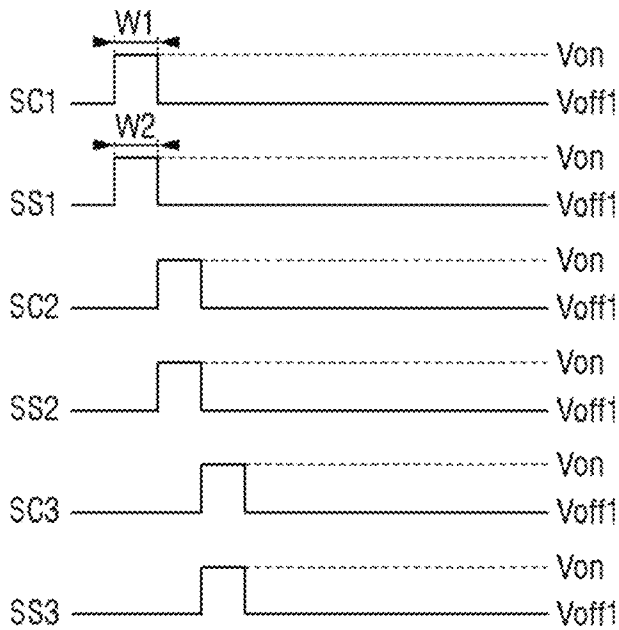
FIG. 5 is a waveform diagram illustrating $k^{th}$ to $(k+2)^{th}$ scan signals and $k^{th}$ to $(k+2)^{th}$ sensing signals during an active period of the N frame period, according to an exemplary embodiment of the present inventive concept.
Figure 6:
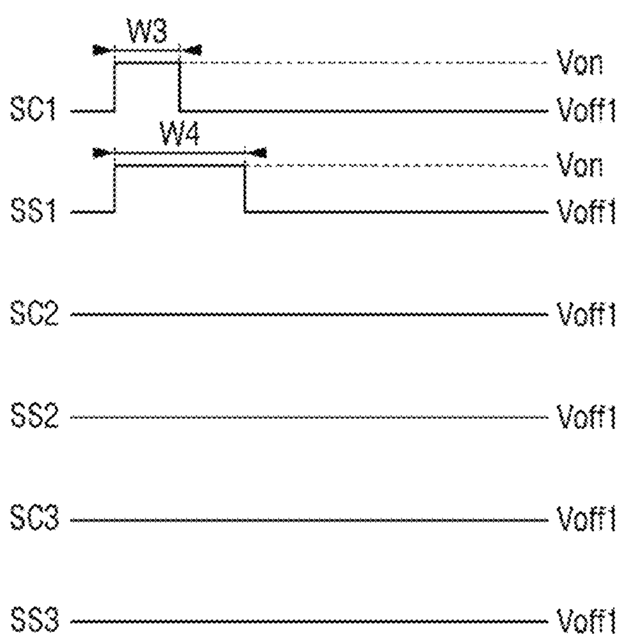
FIG. 6 is a waveform diagram illustrating the $k^{th}$ to the $(k+2)^{th}$ scan signals and the $k^{th}$ to the $(k+2)^{th}$ sensing signals during a vertical blank period of the $N^{th}$ frame period, according to an exemplary embodiment of the present inventive concept.

FIG. 4 is a graph showing driving timing of sub-pixels in the $N^{th}$ frame period and the $(N+1)^{th}$ frame period, according to an exemplary embodiment of the present inventive concept. FIG. 5 is a waveform diagram illustrating the k to the $(k+2)^{th}$ scan signals and the $k^{th}$ to the $(k+2)^{th}$ sensing signals during an active period of the $N^{th}$ frame period, according to an exemplary embodiment of the present inventive concept. FIG. 6 is a waveform diagram illustrating the $k^{th}$ to the $(k+2)^{th}$ scan signals and the $k^{th}$ to the $(k+2)^{th}$ sensing signals during a vertical blank period of the $N^{th}$ frame period, according to an exemplary embodiment of the present inventive concept.

Referring to FIGS. 4 to 6, each of the N frame period and the $(N+_1)^{th}$ frame period includes an active period ACT and a vertical blank period VB. In the active period ACT, a data voltage is applied to each of the sub-pixels SP. The vertical blank period VB is an idle period. For example, in the vertical blank period VB, the source voltage of the driving transistor DT of each of the sub-pixels SP connected to the at least one scan signal line SCL is sensed through the reference voltage line RVL.

The data driver 120 may apply compensation data voltages in which electron mobility of the driving transistor DT of each of the sub-pixels SP is compensated to the data lines DL during the active period ACT. The data driver 120 may apply data voltages for sensing to the data lines DL during the vertical blank period VB to compensate for the electron mobility of the driving transistor DT of each of the sub-pixels SP.

In addition, a reference voltage may be applied to the reference voltage line RVL during the active period ACT. During the vertical blank period VB, the reference voltage line RVL is connected to an analog-digital converter, and the source voltage of the driving transistor DT of each of the sub-pixels SP is converted into sensing data that is digital data in the analog-to-digital converter through the reference voltage line RVL, such that it may be output to the timing controller 170.

The active period ACT may be longer than the vertical blank period VB. The vertical blank period VB of the $N^{th}$ frame period may be located between the active period ACT of the $N^{th}$ frame period and the active period ACT of the $(N+1)^{th}$ frame period.

The scan signal driver 200 may sequentially apply scan signals to the scan signal lines SCL during the active period ACT. When the display panel 110 includes first to nth scan signal lines SCL1 to SCLn as shown in FIG. 4, where n is a positive integer, the scan signal driver 200 may apply the scan signals to the first scan signal line SCL1 to the nth scan signal line SCLn sequentially. For example, as shown in FIG. 5, the scan signal driver 200 may apply a first scan signal SC1 of the gate-on voltage Von to the first scan signal line SCL1, then a second scan signal SC2 of the gate-on voltage Von to the second scan signal line SCL2, then a third scan signal SC3 of the gate-on voltage Von to the third scan signal line SCL3, and so forth.

In addition, the scan signal driver 200 may sequentially apply sensing signals to the sensing signal lines SSL during the active period ACT. When the display panel 110 includes the first to nth sensing signal lines, the sensing signals may be sequentially applied from the first sensing signal line to the nth sensing signal line. For example, as shown in FIG. 5, the scan signal driver 200 may apply a first sensing signal SS1 of the gate-on voltage Von to the first sensing signal line SSL1, then a second sensing signal SS2 of the gate-on voltage Von to the second sensing signal line SSL2, then a third sensing signal SS3 of the gate-on voltage Von to the third sensing signal line SSL3, and so forth.

In contrast, the scan signal driver 200 may apply a scan signal to at least one scan signal line SCL and may apply a sensing signal to at least one sensing signal line SSL during the vertical blank period VB. For example, as shown in FIGS. 4 and 6, during the vertical blank period VB of the $N^{th}$ frame period, the scan signal driver 200 may apply the first scan signal SC1 of the gate-on voltage Von to the first scan signal line SCL1 and may not apply the scan signal of the gate-on voltage Von to the second to nth scan signal lines SCL2 to SCLn. In other words, a first gate-off voltage Voff1 may be applied to the second to nth scan signal lines SCL2 to SCLn. Furthermore, during the vertical blank period VB of the $N^{th}$ frame period, the scan signal driver 200 may apply the first sensing signal SS1 of the gate-on voltage Von to the first sensing signal line SSL1 and may not apply the sensing signal of the gate-on voltage Von to the second to nth sensing signal lines SSL2 to SSLn. In addition, as shown in FIG. 4, during the vertical blank period VB of the $(N+1)^{th}$ frame period, the scan signal driver 200 may apply the first scan signal SC1 of the gate-on voltage Von to the second scan signal line SCL2 and may not apply the scan signal of the gate-on voltage Von to the first and third to nth scan signal lines SCL1 and SCL3 to SCLn. In other words, the first gate-off voltage Voff1 may be applied to the first and third to nth scan signal lines SCL1 and SCL3 to SCLn.

As shown in FIGS. 4 to 6, the pulse width W1 of the scan signal during the active period ACT is different from the pulse width W3 of the scan signal during the vertical blank period VB. The pulse width of the scan signal refers to the length of the time period during which the scan signal is output as the gate-on voltage. In addition, the pulse width W2 of the sensing signal during the active period ACT is different from the pulse width W4 of the sensing signal during the vertical blank period VB. The pulse width of the sensing signal refers to the length of the time period during which the sensing signal is output as the gate-on voltage.

Hereinafter, the scan signal driver 200 capable of outputting the $k^{th}$ scan signal and the $k^{th}$ sensing signal simultaneously to reduce the area of the scan signal driver 200, as well as outputting different scan signals and different sensing signals during the active period ACT and the vertical blank period VB will be described in detail with reference to FIGS. 7 to 23, where k is an integer satisfying $1 \leq k \leq n$.

Figure 7:
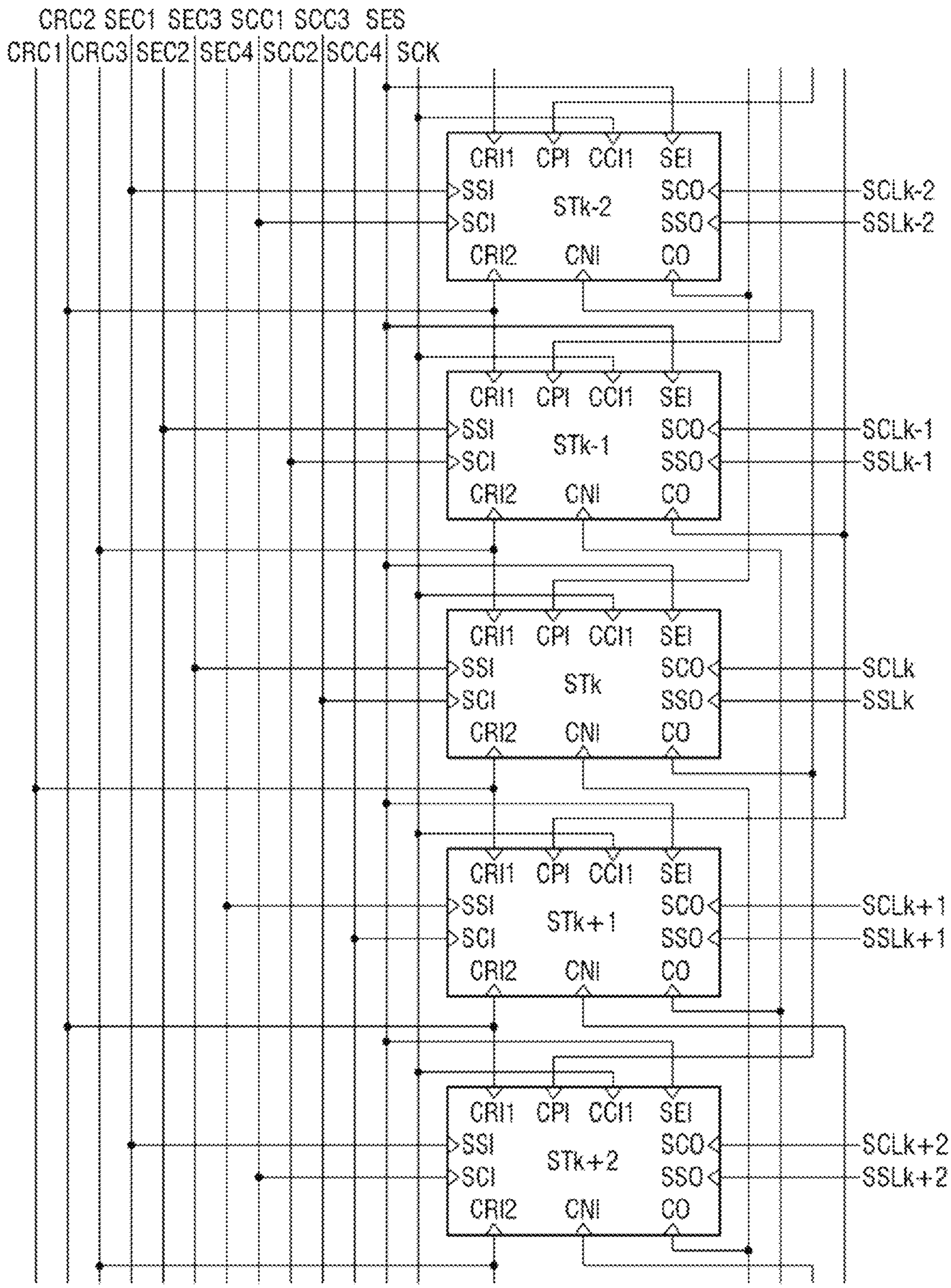
FIG. 7 is a view showing a scan signal driver according to an exemplary embodiment of the present inventive concept.

FIG. 7 is a view showing a scan signal driver according to an exemplary embodiment of the present inventive concept. FIG. 7 shows only the $(k-2)^{th}$ to $(k+2)^{th}$ stages ST(k−2) to ST(k+2) for convenience of illustration.

In the following description, a previous stage may refer to a stage located before a stage of interest. A subsequent stage may refer to a stage located after a stage of interest. For example, the previous stages of the $k^{th}$ stage STk are the first to $(k-1)^{th}$ stages ST1 to ST(k−1), while the subsequent stages of the $k^{th}$ stage ST are the (k+1) to nth stages ST(k+1) to STn.

Referring to FIG. 7, on one side of the plurality of stages ST(k−2) to ST(k+2), carry clock lines CRC1 to CRC3 for applying carry clock signals with sequentially delayed phases, sensing clock lines SEC1 to SEC4 for applying sensing clock signals with sequentially delayed phases, scan clock lines SCC1 to SCC4 for applying scan clock signals with sequentially delayed phases, a sensing control line SES for applying a sensing control signal, and control clock lines SCK1 and SCK2 for applying control clock signals may be arranged. In FIG. 7, one or both of the control clock lines are denoted by SCK. The carry clock signals, the sensing clock signals, the scan clock signals, the sensing control signal, and the control clock signals may be the scan control signals SCS described above with reference to FIG. 2B. Although FIG. 7 shows three carry clock lines CRC1 to CRC3, four sensing clock lines SEC1 to SEC4, and four scan clock lines SCC1 to SCC4, the number of the carry clock lines CRC1 to CRC3, the number of sensing clock lines SEC1 to SEC4, and the number of scan clock lines SCC1 to SCC4 are not limited thereto.

The scan signal driver 210 includes a plurality of stages ST(k−2) to ST(k+2) connected to the scan signal lines SCL(k−2) to SCL(k+2) and the sensing signal lines SSL(k−2) to SSL(k+2), respectively. The $(k-2)^{th}$ stage ST(k−2) outputs the (k−2) scan signal to the (k−2) scan signal line SCL(k−2) and outputs the $(k-2)^{th}$ sensing signal to the $(k-2)^{th}$ sensing signal line SSL(k−2). The $(k-1)^{th}$ stage ST(k−1) outputs the $(k-1)^{th}$ scan signal to the $(k-1)^{th}$ scan signal line SCL(k−1) and outputs the $(k-1)^{th}$ sensing signal to the $(k-1)^{th}$ sensing signal line SSL(k−1). The $k^{th}$ stage STk outputs the $k^{th}$ scan signal to the $k^{th}$ scan signal line SCL and outputs the $k^{b}$ sensing signal to the $k^{th}$ sensing signal line SSLk. The $(k+1)^{th}$ stage STk+1 outputs the $(k+1)^{th}$ scan signal to the $(k+1)^{th}$ scan signal line SCLk+1 and outputs the $(k+1)^{th}$ sensing signal to the $(k+1)^{th}$ sensing signal line SSL(k+1). The $(k+2)^{th}$ stage STk+2 outputs the $(k+2)^{th}$ scan signal to the $(k+2)^{th}$ s scan signal line SCLk+2 and outputs the $(k+2)^{th}$ sensing signal to the $(k+2)^{th}$ sensing signal line SSL(k+2).

Each of the stages ST(k−2) to ST(k+2) includes a start terminal CPI, a next carry input terminal CNI, a scan clock terminal SCI a sensing clock terminal SSI, a first carry clock terminal CRI1, a second carry clock terminal CRI2, a sensing control terminal SEI, a first control clock terminal CCI1, a carry output terminal CO, a scan output terminal SCO, and a sensing output terminal SSO.

The start terminal CPI may be connected to a start signal line or a carry output terminal CO of the previous stage. For example, as shown in FIG. 7, the start terminal CPI of the $k^{th}$ stage ST may be connected to the start signal line or the carry output terminal CO of the $(k-2)^{th}$ stage ST(k−2). In this case, the start signal of the start signal line or the $(k-2)^{th}$ carry signal of the $(k-2)^{th}$ stage ST(k−2) may be input to the start terminal CPI of the $k^{th}$ stage STk.

The next carry input terminal CNI of each of the stages ST(k−2) to ST(k+2) may be connected to the carry output terminal CO of the respective subsequent stage. For example, as shown in FIG. 7, the next carry input terminal CNI of the $k^{th}$ stage STk may be connected to the carry output terminal CO of the $(k+2)^{th}$ stage ST(k+2). In this case, the $(k+2)^{th}$ carry signal of the $(k+2)^{th}$ stage ST(k+2) may be input to the next carry input terminal CNI of the $k^{th}$ stage STk.

The scan clock terminal SCI of each of the stages ST(k−2) to ST(k+2) may be connected to one of the scan clock lines SCC1 to SCC4. The scan clock lines SCC1 to SCC4 may be connected to the scan clock terminals SCI of the stages ST(k−2) to ST(k+2), respectively. For example, as shown in FIG. 7, the first scan clock line SCC1 may be connected to the scan clock terminal SCI of the $(k-2)^{th}$ stage ST(k−2), and the second scan clock line SCC2 may be connected to the scan clock terminal SCI of the $(k-1)^{th}$ stage ST(k−1). A third scan clock line SCC3 may be connected to the scan clock terminal SCI of the $k^{th}$ stage STk, a fourth scan clock line SCC4 may be connected to the scan clock terminal SCI of the $(k+)^{th}$ stage ST(k+1), and the first scan clock line SCC1 may be connected to the scan clock terminal SCI of the $(k+2)^{th}$ stage ST(k+2).

The sensing clock terminal SSI of each of the stages ST(k−2) to ST(k+2) may be connected to one of the sensing clock lines SEC1 to SEC4. The sensing clock lines SEC1 to SEC4 may be connected to the sensing clock terminals SSI of the stages ST(k−2) to ST(k+2), respectively. For example, as shown in FIG. 7, the first sensing clock line SEC1 may be connected to the sensing clock terminal SSI of the $(k-2)^{th}$ stage ST(k−2), and the second sensing clock line SEC2 may be connected to the sensing clock terminal SSI of the $(k-1)^{th}$ stage ST(k−1). The third sensing clock line SEC3 may be connected to the sensing clock terminal SSI of the $k^{th}$ stage STk, the fourth sensing clock line SEC4 may be connected to the sensing clock terminal SSI of the $(k+1)^{th}$ stage ST(k+1), and the first sensing clock line SEC1 may be connected to the sensing clock terminal SSI of the $(k+2)^{th}$ stage ST(k+2).

Each of the first carry clock terminal CRI and the second carry clock terminal CRI2 of each of the stages ST(k−2) to ST(k+2) may be connected to one of the carry clock lines CRC1 to CRC3. The carry clock lines CRC1 to CRC3 may be sequentially connected to the first scan clock terminals SCI1 and the second scan clock terminals SCI2 of the stages ST(k−2) to ST(k+2). For example, as shown in FIG. 7, the first carry clock line CRC1 may be connected to the first carry clock terminal CRI1 of the $(k-2)^{th}$ stage ST(k−2), and the second carry clock line CRC2 may be connected to the second carry clock terminal CRI2 of the $(k-2)^{th}$ stage ST(k−2). The second carry clock line CRC2 may be connected to the first carry clock terminal CRI of the $(k-1)^{th}$ stage ST(k−1), and the third carry clock line CRC3 may be connected to the second carry clock terminal CRI2 of the $(k-1)^{th}$ stage ST(k−1). The third carry clock line CRC3 may be connected to the first carry clock terminal CRI of the $k^{th}$ stage STk, and the first carry clock line CRC1 may be connected to the second carry clock terminal CRI2 of the $k^{th}$ stage STk. The first carry clock line CRC1 may be connected to the first carry clock terminal CRI1 of the $(k+)^{th}$ stage STk+1, and the second carry clock line CRC2 may be connected to the second carry clock terminal CRI2 of the $(k+1)^{th}$ stage STk+1. The second carry clock line CRC2 may be connected to the first carry clock terminal CRI1 of the $(k+2)^{th}$ stage ST(k+2), and the third carry clock line CRC3 may be connected to the second carry clock terminal CRI2 of the $(k+2)^{th}$ stage ST(k+2).

The sensing control terminal SEI of each of the stages ST(k−2) to ST(k+2) may be connected to the sensing control line SES. A sensing control signal may be input to the sensing control terminal SEI of each of the stages ST(k−2) to ST(k+2).

The first control clock terminal CCI1 of each of the stages ST(k−2) to ST(k+2) may be connected to the first control clock line SCK1. The first control clock signal may be input to the first control clock terminal CCI of each of the stages ST(k−2) to ST(k+2).

The carry output terminal CO of each of the stages ST(k−2) to ST(k+2) outputs a carry signal. The carry output terminal CO of each of the stages ST(k−2) to ST(k+2) may be connected to the next carry input terminal CNI of the previous stage and the start terminal CPI of the subsequent stage. For example, as shown in FIG. 7, the carry output terminal CO of the $k^{th}$ stage STk may be connected to the carry input terminal CNI of the $(k-2)^{th}$ stage ST(k−2) and the start terminal CPI of the $(k+2)^{th}$ stage ST(k+2).

The scan output terminal SCO of each of the stages ST(k−2) to ST(k+2) is connected to a scan signal line to output a scan signal. For example, as shown in FIG. 7, the scan output terminal SCO of the $(k-2)^{th}$ stage ST(k−2) may be connected to the $(k-2)^{th}$ scan signal line SCL(k−2) to output the $(k-2)^{th}$ scan signal, and the scan output terminal SCO of the $(k-1)^{th}$ stage ST(k−1) may be connected to the $(k-1)^{th}$ scan signal line SCL(k−1) to output the $(k-1)^{th}$ s signal. The scan output terminal SCO of the $k^{th}$ stage STk may be connected to the $k^{th}$ scan signal line SCLk to output the $k^{th}$ scan signal, and the scan output terminal SCO of the $(k+1)^{th}$ stage ST(k+1) may be connected to the (k+) scan signal line SCL(k+1) to output the (k+1) scan signal. The scan output terminal SCO of the $(k+2)^{th}$ stage ST(k+2) may be connected to the $(k+2)^{th}$ scan signal line SCL(k+2) to output the $(k+2)^{th}$ scan signal.

The sensing output terminal SSO of each of the stages ST(k−2) to ST(k+2) is connected to a sensing signal line to output a sensing signal. For example, as shown in FIG. 7, the sensing output terminal SSO of the $(k-2)^{th}$ stage ST(k−2) may be connected to the $(k-2)^{th}$ sensing signal line SSL(k−2) to output the $(k-2)^{th}$ sensing signal, and the sensing output terminal SSO of the $(k-1)^{th}$ stage ST(k−1) may be connected to the (k−1) sensing signal line SSL(k−1) to output the $(k-1)^{th}$ sensing signal. The sensing output terminal SSO of the $k^{th}$ stage STk may be connected to the $k^{th}$ sensing signal line SSLk to output the $k^{th}$ sensing signal, and the sensing output terminal SSO of the $(k+1)^{th}$ stage ST(k+1) may be connected to the $(k+1)^{th}$ sensing signal line SSL(k+1) to output the $(k+1)^{th}$ sensing signal. The sensing output terminal SSO of the $(k+2)^{th}$ stage ST(k+2) may be connected to the $(k+2)^{th}$ sensing signal line SCL(k+2) to output the $(k+2)^{th}$ sensing signal.

As shown in FIG. 7, since the scan signal driver 200 includes a single stage for outputting a scan signal and a sensing signal simultaneously, it is possible to reduce the area of the scan signal driver 200 compared with a scan signal driver including a stage for outputting a scan signal and another stage for outputting a sensing signal.

Figure 8:
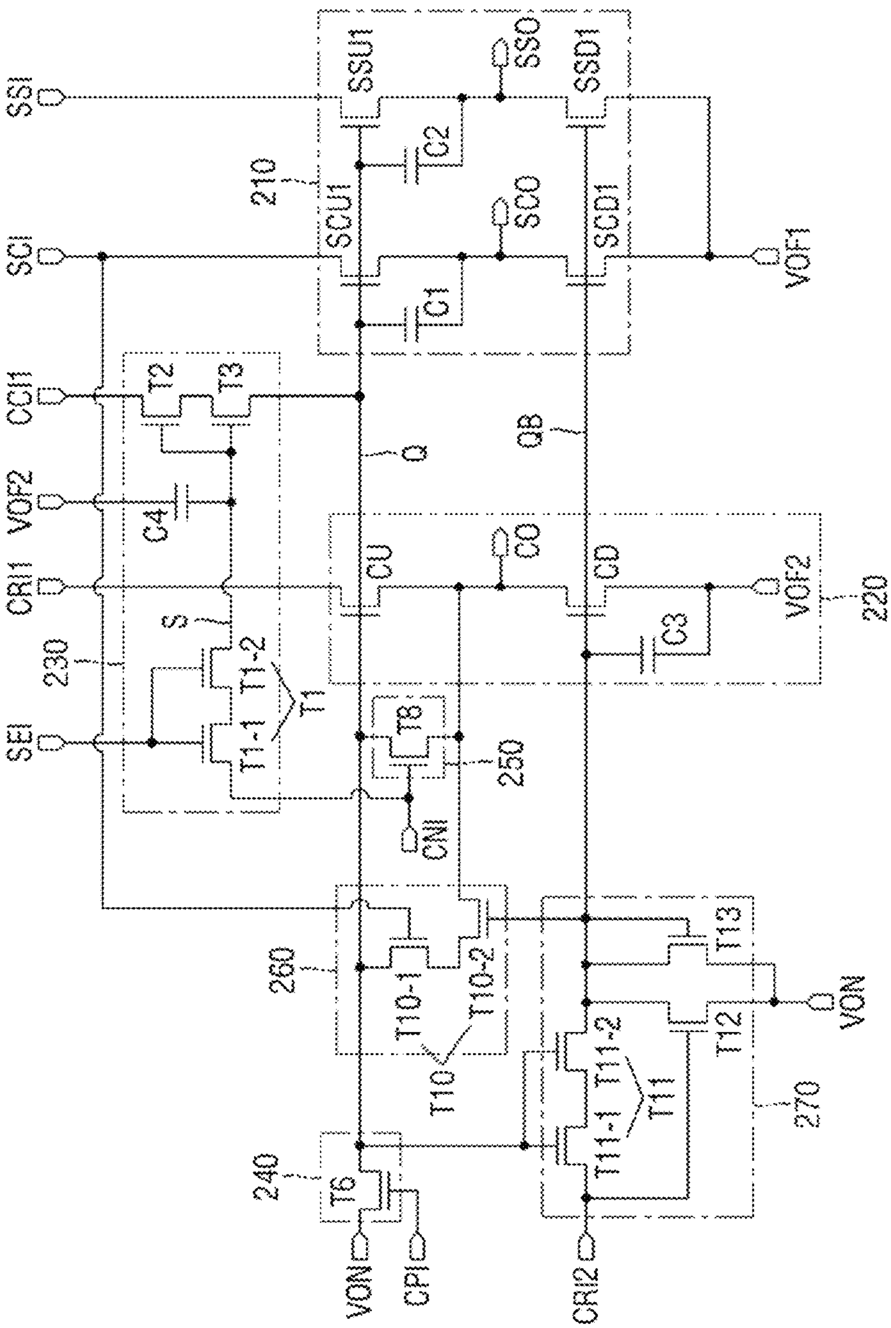
FIG. 8 is a circuit diagram showing a $k^{th}$ stage of a scan signal driver according to an exemplary embodiment of the present inventive concept.

FIG. 8 is a circuit diagram showing the $k^{b}$ stage of a scan signal driver according to an exemplary embodiment of the present inventive concept.

Referring to FIG. 8, the $k^{th}$ stage STk includes a first output unit 210, a second output unit 220, a sensing controller 230, a first pull-up node controller 240, a second pull-up node controller 250, a third pull-up node controller 260, and an inverter 270. The $k^{th}$ stage STk may further include a start terminal CPI, a next carry input terminal CNI, a first carry clock terminal CRI, a second carry clock terminal CRI2, a sensing control terminal SE, a first control clock terminal CCI1, a carry output terminal CO, a scan output terminal SCO, and a sensing output terminal SSO. In addition, the $k^{th}$ stage STk may further include a first gate-off terminal VOF1, a second gate-off terminal VOF2, and a gate-on terminal VON. A gate-on voltage may be applied to the gate-on terminal VON, a first gate-off voltage may be applied to the first gate-off terminal VOF1, and a second gate-off voltage may be applied to the second gate-off terminal VOF2. The gate-on voltage may be greater than 0 V, and the first gate-off voltage and the second gate-off voltage may be equal to or less than 0 V. The first gate-off voltage may have a higher level than that of the second gate-off voltage.

In the example shown in FIG. 8, a third carry clock signal of the third carry clock line CRC3 is applied to the first carry clock terminal CRI1, the first carry clock signal of the first carry clock line CRC1 is applied to the second carry clock terminal CRI2, a third scan clock signal of the third scan clock line SCC3 is applied to the scan clock terminal SCI, and a third sensing clock signal of the third sensing clock line SEC3 is applied to the sensing clock terminal SSI. In addition, in the example shown in FIG. 8, a carry signal of the $(k-2)^{th}$ stage ST(k−2) is applied to the start terminal CPI, and a carry signal of the $(k+2)^{th}$ stage ST(k+2) is applied to the next carry input terminal CNI.

In the example shown in FIG. 8, a first scan pull-up transistor SCU1, a first pull-down transistor SCD1, a first sensing pull-up transistor SSU1, a second sensing pull-down transistor SSD1, first to third transistors T1 to T3, a sixth transistor T6, an eighth transistor T8, a tenth transistor T10, and eleventh to thirteenth transistors T11 to T3 are implemented as n-type metal oxide semiconductor field effect transistors (MOSFETs). In this example, the first scan pull-up transistor SCU1, the first pull-down transistor SCD1, the first sensing pull-up transistor SSU1, the second sensing pull-down transistor SSD1, the first to third transistors T1 to T3, the sixth transistor T6, the eighth transistor T8, the tenth transistor T10, and the eleventh to thirteenth transistors T11 to T13 are turned on when agate-high voltage is applied. Therefore, the gate-on voltage may be a gate-high voltage, the first gate-off voltage may be a first gate-low voltage, and the second gate-off voltage may be a second gate-low voltage.

When the pull-up node Q has the gate-on voltage, the first output unit 210 outputs a third scan clock signal input to the scan clock terminal SCI to the scan output terminal SCO, and outputs a third sensing clock signal input to the sensing clock terminal SSI to the sensing output terminal SSO. When the pull-down node QB has the gate-on voltage, the first output unit 210 outputs the first gate-off voltage to the scan output terminal SCO and the sensing output terminal SSO.

The first output unit 210 may include a first scan pull-up transistor SCU1, a first pull-down transistor SCD1, a first sensing pull-up transistor SSU1, a first sensing pull-down transistor SSD2, a first capacitor C1, and a second capacitor C2.

The first scan pull-up transistor SCU1 is turned on by the gate-on voltage of the pull-up node Q to output a third scan clock signal input to the scan clock terminal SCI to the scan output terminal SCO. The gate electrode of the first scan pull-up transistor SCU1 may be connected to the pull-up node Q, the first electrode of the first scan pull-up transistor SCU1 may be connected to the scan output terminal SCO, and the second electrode of the first scan pull-up transistor SCU1 may be connected to the scan clock terminal SC.

To increase the amount of current flowing through the channel when the first scan pull-up transistor SCU1 is turned on, the first scan pull-up transistor SCU1 may further include a second gate electrode electrically connected to the pull-up node Q. In this case, the first scan pull-up transistor SCU1 may have a double-gate structure including a gate electrode corresponding to the upper gate electrode and a second gate electrode corresponding to the lower gate electrode.

The first scan pull-down transistor SCD1 is turned on by the gate-on voltage of the pull-down node QB to output the first gate-off voltage input to the first gate-off terminal VOF1. The gate electrode of the first scan pull-down transistor SCD1 may be connected to the pull-down node QB, the first electrode of the first scan pull-down transistor SCD1 may be connected to the first gate-off terminal VOF1, and the second electrode of the first scan pull-down transistor SCD1 may be connected to the scan output terminal SCO.

To prevent or reduce leakage current flowing through the first scan pull-down transistor SCD1, the first scan pull-down transistor SCD1 may further include a second gate electrode connected to the first gate-off terminal VOF1. In this case, the first scan pull-down transistor SCD1 may have a double-gate structure including a gate electrode corresponding to the upper gate electrode and a second gate electrode corresponding to the lower gate electrode.

To increase the amount of current flowing through the channel when the first sensing pull-up transistor SSU1 is turned on, the first sensing pull-up transistor SSU1 is turned on by the gate-on voltage of the pull-up node Q, such that a third sensing clock signal input to the sensing clock terminal SSI is output to the sensing output terminal SSO. The gate electrode of the first sensing pull-up transistor SSU1 may be connected to the pull-up node Q, the first electrode of the first sensing pull-up transistor SSU1 may be connected to the sensing output terminal SSO, and the second electrode of the first sensing pull-up transistor SSU1 may be connected to the sensing clock terminal SSI.

The first sensing pull-up transistor SSU1 may further include a second gate electrode electrically connected to the pull-up node Q. In this case, the first sensing pull-up transistor SSU1 may have a double-gate structure including a gate electrode corresponding to the upper gate electrode and a second gate electrode corresponding to the lower gate electrode.

The first sensing pull-down transistor SSD1 is turned on by the gate-on voltage of the pull-down node QB to output the first gate-off voltage input to the first gate-off terminal VOF1 to the sensing output terminal SSO. The gate electrode of the first sensing pull-down transistor SSD1 may be connected to the pull-down node QB, the first electrode of the first sensing pull-down transistor SSD1 may be connected to the first gate-off terminal VOF1, and the second electrode of the first sensing pull-down transistor SSD1 may be connected to the sensing output terminal SSO.

To prevent or reduce leakage current flowing through the first sensing pull-down transistor SSD1, the first sensing pull-down transistor SSD1 may further include a second gate electrode connected to the first gate-off terminal VOF1. In this case, the first sensing pull-down transistor SSD1 may have a double-gate structure including a gate electrode corresponding to the upper gate electrode and a second gate electrode corresponding to the lower gate electrode.

The first capacitor C1 is disposed between the pull-up node Q and the scan output terminal SCO. One electrode of the first capacitor C1 may be connected to the pull-up node Q, and the other electrode of the first capacitor C1 may be connected to the scan output terminal SCO. Since the first capacitor C stores the voltage difference between the pull-up node Q and the scan output terminal SCO, the voltage difference between the pull-up node Q and the scan output terminal SCO can be held by the first capacitor C1.

The second capacitor C2 is disposed between the pull-up node Q and the sensing output terminal SSO. One electrode of the second capacitor C2 may be connected to the pull-up node Q, and the other electrode of the second capacitor C2 may be connected to the sensing output terminal SSO. Since the second capacitor C2 stores the voltage difference between the pull-up node Q and the sensing output terminal SSO, the voltage difference between the pull-up node Q and the sensing output terminal SSO can be held by the second capacitor C2.

When the pull-up node Q has the gate-on voltage, the second output unit 220 outputs the third carry clock signal input to the first carry clock terminal CRI1 to the carry output terminal CO. When the pull-down node QB has the gate-on voltage, the second output unit 220 outputs the first gate-off voltage to the carry output terminal CO.

The second output unit 220 may include a carry pull-up transistor CU, a carry pull-down transistor CD, and a third capacitor C3.

The carry pull-up transistor CU is turned on by the gate-on voltage of the pull-up node Q to output a third carry clock signal input to the first carry clock terminal CRI1 to the carry output terminal CO. The gate electrode of the carry pull-up transistor CU may be connected to the pull-up node Q, the first electrode of the carry pull-up transistor CU may be connected to the carry output terminal CO, and the second electrode of the carry pull-up transistor CU may be connected to the first carry clock terminal CRI1.

The carry pull-down transistor CD is turned on by the gate-on voltage of the pull-down node QB to output the first gate-off voltage input to the second gate-off terminal VOF2 to the carry output terminal CO. The gate electrode of the carry pull-down transistor CD may be connected to the pull-down node QB, the first electrode of the carry pull-down transistor CD may be connected to the second gate-off terminal VOF2, and the second electrode of the carry pull-down transistor CD may be connected to the carry output terminal CO.

The third capacitor C3 is disposed between the pull-down node QB and the second gate-off terminal VOF2. One electrode of the third capacitor C3 may be connected to the pull-down node QB, and the other electrode of the third capacitor C3 may be connected to the second gate-off terminal VOF2. Since the third capacitor C3 stores the voltage difference between the pull-down node QB and the second gate-off terminal VOF2, the voltage difference between the pull-down node QB and the second gate-off terminal VOF2 can be held by the third capacitor C3.

When the sensing control signal of the gate-on voltage is input to the sensing control terminal SEI during the active period of the $N^{th}$ frame period, the sensing controller 230 applies the gate-on voltage to the pull-up node Q during the vertical blank period of the $N^{th}$ frame period. As a result, since the first scan pull-up transistor SCU1 and the first sensing pull-up transistor SSU1 are turned on during the vertical blank period of the $N^{th}$ frame period, the first output unit 210 may output a third scan clock signal input to the scan clock terminal SCI to the scan output terminal SCO, and may output the third sensing clock signal input to the sensing clock terminal SSI to the sensing output terminal SSO.

The sensing controller 230 may include a first transistor T1, a second transistor T2, a third transistor T3, and a fourth capacitor C4.

The first transistor T1 is turned on by the gate-on voltage of the sensing control signal input to the sensing control terminal SEI and applies a carry signal of the $(k+2)^{th}$ stage ST(k+2) input to the next carry input terminal CNI to the sensing control node S. In other words, when the carry signal of the $(k+2)^{th}$ stage ST(k+)2 of the gate-on voltage is input while the first transistor T1 is turned on, the sensing control node S has the gate-on voltage.

The first transistor T1 may include an $(1\text{-}1)^{th}$ transistor T1-1 and a $(1\text{-}2)^{th}$ transistor T1-2.

The $(1\text{-}1)^{th}$ transistor T1-1 is turned on by the gate-on voltage of the sensing control signal input to the sensing control terminal SEI, to connect the next carry input terminal CNI with a second electrode of the $(1\text{-}2)^{th}$ transistor T1-2. The gate electrode of the $(1\text{-}1)^{th}$ transistor T1-1 may be connected to the sensing control terminal SEI, the first electrode of the $(1\text{-}1)^{th}$ transistor T1-1 may be connected to the second electrode of the $(1\text{-}2)^{th}$ transistor T1-2, and the second electrode of the $(1\text{-}1)^{th}$ transistor T1-1 may be connected to the next carry input terminal CNI.

The $(1\text{-}2)^{th}$ transistor T1-2 is turned on by the gate-on voltage of the sensing control signal input to the sensing control terminal SEI, to connect the sensing control node S with a first electrode of the $(1\text{-}1)^{th}$ transistor T1-1. The gate electrode of the $(1\text{-}2)^{th}$ transistor T1-2 may be connected to the sensing control terminal SEI, the first electrode of the $(1\text{-}2)^{th}$ transistor T1-2 may be connected to the sensing control node S, and the second electrode of the $(1\text{-}2)^{th}$ transistor T1-2 may be connected to the first electrode of the $(1\text{-}1)^{th}$ transistor T1-1.

The second transistor T2 and the third transistor T3 are turned on by the gate-on voltage of the sensing control node S to apply a first control clock signal input to a first control clock terminal CCI1 to the pull-up node Q. In other words, the second transistor T2 and the third transistor T3 are turned on by the gate-on voltage of the sensing control node S to connect the first control clock terminal CCI with the pull-up node Q. The gate electrode of the second transistor T2 may be connected to the sensing control node S, the first electrode of the second transistor T2 may be connected to the second electrode of the third transistor T3, and the second electrode of the second transistor T2 may be connected to the first control clock terminal CCI1. The gate electrode of the third transistor T3 may be connected to the sensing control node S, the first electrode of the third transistor T3 may be connected to the pull-up node Q, and the second electrode of the third transistor T3 may be connected to the first electrode of the second transistor T2.

The fourth capacitor C4 is disposed between the sensing control node S and the second gate-off terminal VOF2. One electrode of the fourth capacitor C4 may be connected to the sensing control node S, and the other electrode of the fourth capacitor C4 may be connected to the second gate-off terminal VOF2. Since the fourth capacitor C4 stores the voltage difference between the sensing control node S and the second gate-off terminal VOF2, the voltage difference between the sensing control node QB and the second gate-off terminal VOF2 can be held by the fourth capacitor C4.

The first pull-up node controller 240 applies the gate-on voltage to the pull-up node Q when the carry signal of the $(k-2)^{th}$ stage ST(k−2) applied to the start terminal CPI has the gate-on voltage. The first pull-up node controller 240 may include a sixth transistor T6.

The sixth transistor T6 is turned on by the carry signal of the $(k-2)^{th}$ stage ST(k−2) of the gate-on voltage to connect the pull-up node Q with the gate-on terminal VON, such that the gate-on voltage may be applied to the pull-up node Q. The gate electrode of the sixth transistor T6 may be connected to the start terminal CPI, the first electrode of the sixth transistor T6 may be connected to the pull-up node Q, and the second electrode of the sixth transistor T6 may be connected to the gate-on terminal VON.

The second pull-up node controller 250 applies the second gate-off voltage to the pull-up node Q when the carry signal of the $(k+2)^{th}$ stage ST(k+2) input to the next carry input terminal CNI has the gate-on voltage. The second pull-up node controller 250 may include the eighth transistor T8.

The eighth transistor T is turned on by the carry signal of the $(k+2)^{th}$ stage ST(k+2) of the gate-on voltage to connect the pull-up node Q with the carry output terminal CO, such that the second gate-off voltage may be applied to the pull-up node Q. The gate electrode of the eighth transistor T8 may be connected to the next carry input terminal CNI, the first electrode of the eighth transistor T8 may be connected to the carry output terminal CO, and the second electrode of the eighth transistor T8 may be connected to the pull-up node Q. The channel width of the thirteenth transistor T13 may be greater than the channel width of the eleventh transistor T11.

The third pull-up node controller 260 applies the second gate-off voltage to the pull-up node Q when the third scan clock signal input to the scan clock terminal SCI or the third sensing clock signal input to the sensing clock terminal SSI has the gate-on voltage and the pull-down node QB has the gate-on voltage. The third pull-up node controller 260 may include the tenth transistor T10. The tenth transistor T10 may include a (10-1)$^{th}$ transistor T10-1 and a (10-2)$^{th}$ transistor T10-2.

The (10-1)$^{th}$ transistor T10-1 is turned on by the third scan clock signal or the third sensing clock signal of the gate-on voltage to connect the pull-up node Q with the second electrode of the (10-2)$^{th}$ transistor T10-2. The gate electrode of the (10-1)$^{th}$ transistor T10-1 may be connected to the scan clock terminal SC or the sensing clock terminal SSI, the first electrode of the (10-1)$^{th}$ transistor T10-1 may be connected to the second electrode of the (10-2)$^{th}$ transistor T10-2, and the second electrode of the (10-1) transistor T10-1 may be connected to the pull-up node Q.

The (10-2)$^{th}$ transistor T10-2 may be turned on by the gate-on voltage of the pull-down node QB to connect the carry output terminal CO with the first electrode of the (10-1)$^{th}$ transistor T10-1. The gate electrode of the (10-2)$^{th}$ transistor T10-2 may be connected to the pull-down node QB, the first electrode of the (10-2)$^{th}$ transistor T10-2 may be connected to the carry output terminal CO, and the second electrode of the (10-2)$^{th}$ transistor T10-2 may be connected to the first electrode of the (10-1)$^{th}$ transistor T10-1.

The inverter 270 applies the first gate-off voltage to the pull-down node QB when the pull-up node Q has the gate-on voltage. In addition, the inverter 270 may apply the gate-on voltage to the pull-down node QB when the pull-up node Q has the second gate-off voltage.

The inverter 270 may include the eleventh transistor T11, the twelfth transistor T12, and the thirteenth transistor T13.

The eleventh transistor T11 is turned on by the gate-on voltage of the pull-up node Q to apply the first carry clock signal of the second carry clock terminal CRI2 to the pull-down node QB. The carry clock signal input to the second carry clock terminal CRI2 may have the first gate-off voltage while the pull-up node Q has a voltage equal to or greater than the gate-on voltage. The eleventh transistor T11 may include an (11-1)$^{th}$ transistor T11-1 and an (11-2)$^{th}$ transistor T11-2.

The (11-1)$^{th}$ transistor T11-1 may be turned on by the gate-on voltage of the pull-down node QB to connect the second carry clock terminal CRI2 with the second electrode of the (11-2)$^{th}$ transistor T11-2. The gate electrode of the (11-1)*a* transistor T11-1 may be connected to the pull-up node QB, the first electrode of the (11-1)$^{th}$ transistor T11-1 may be connected to the second electrode of the (11-2)$^{th}$ transistor T11-2, and the second electrode of the (11-1)$^{th}$ transistor T11-1 may be connected to the second carry clock terminal CRI2.

The (11-2) transistor T11-2 may be turned on by the gate-on voltage of the pull-up node Q to connect the pull-down node QB with the first electrode of the (11-1)$^{th}$ transistor T11-1. The gate electrode of the (11-2)$^{th}$ transistor T11-2 may be connected to the pull-up node Q, the first electrode of the (11-2)$^{th}$ transistor T11-2 may be connected to the pull-down node QB, and the second electrode of the (11-2)$^{th}$ transistor T11-2 may be connected to the first electrode of the (11-2)$^{th}$ transistor T11-2.

The twelfth transistor T12 may be turned on by the gate-on voltage of the first carry clock signal of the second carry output terminal CRI2 to connect the pull-down node QB with the gate-on terminal VON, such that the gate-on voltage may be applied to the pull-down node Q. The gate electrode of the twelfth transistor T12 may be connected to the second carry output terminal CRI2, the first electrode of the twelfth transistor T12 may be connected to the pull-down node QB, and the second electrode of the twelfth transistor T12 may be connected to the gate-on terminal VON.

The thirteenth transistor T13 is turned on by the gate-on voltage of the pull-down node QB to connect the pull-down node QB with the gate-on terminal VON, such that the gate-on voltage may be applied to the pull-down node Q. The gate electrode and the first electrode of the thirteenth transistor T13 may be connected to the pull-down node Q, and the second electrode of the thirteenth transistor T13 may be connected to the gate-on terminal VON.

One of the first and second electrodes of each of the first scan pull-up transistor SCU1, the first pull-down transistor SCD1, the first sensing pull-up transistor SSU1, the first sensing pull-down transistor SSD1, the first to third transistors T1 to T3, the sixth transistor T6, the eighth transistor T, the tenth transistor T10, and the eleventh to thirteenth transistors T11 to T13 may be a source electrode while the other electrodes may be a drain electrode. This source/drain relationship is applicable to other transistors described herein.

In addition, each of the first scan pull-up transistor SCU1, the first pull-down transistor SCD1, the first sensing pull-up transistor SSU1, the first sensing pull-down transistor SSD1, the first to third transistors T1 to T3, the sixth transistor T6, the eighth transistor T8, the tenth transistor T10, and the eleventh to thirteenth transistors T11 to T13 may be formed of amorphous silicon (a-Si), poly silicon (poly-Si), or an oxide semiconductor.

Figure 9A:
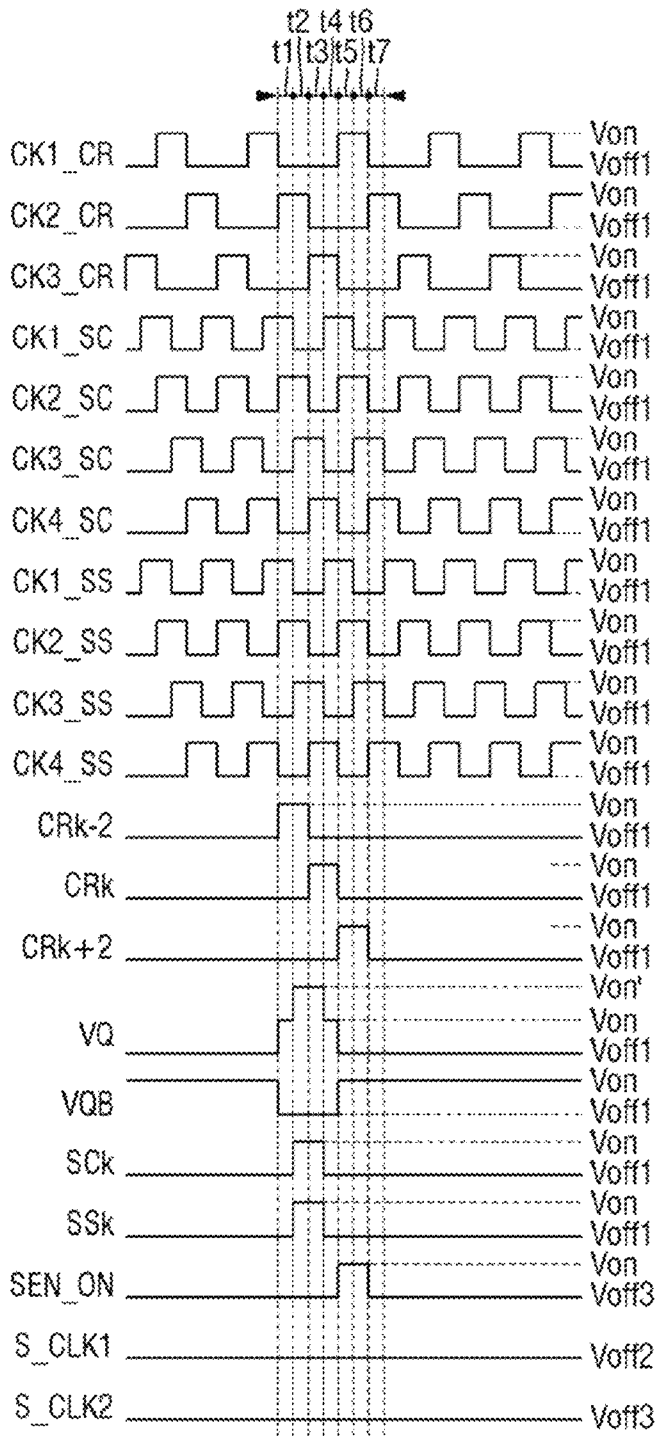
FIG. 9A is a waveform diagram showing carry clock signals, scan clock signals, sensing clock signals, a sensing control signal, a (k−2) carry signal, a $k^{th}$ carry signal, a (k+2) carry signal, a voltage of a pull-up node, a voltage of a pull-down node, a $k^{th}$ scan signal and a $k^{th}$ sensing signal during the active period of the $N^{th}$ frame, according to an exemplary embodiment of the present inventive concept.

FIG. 9A is a waveform diagram showing the carry clock signals, the scan clock signals, the sensing clock signals, the sensing control signal, the (k−2) carry signal, the k$^{th}$ carry signal, the (k+2) carry signal, the voltage of the pull-up node, the voltage of the pull-down node, the k$^{th}$ scan signal and the k sensing signal during the active period of the N$^{th}$ frame, according to an exemplary embodiment of the present inventive concept.

Referring to FIG. 9A, the phases of the first to third carry clock signals CK1_CR, CK2_CR and CK3_CR are delayed sequentially. For example, the phase of the second carry clock signal CK2_CR may be delayed relative to the first carry clock signal CK1_CR by two horizontal periods 2H, and the phase of the third carry clock signal CK3_CR may be delayed relative to the second carry clock signal CK2_CR by two horizontal periods 2H. The first to third carry clock signals CK1_CR, CK2_CR and CK3_CR may be repeated every six horizontal periods 6H. The first to third carry clock signals CK1_CR, CK2_CR and CK3_CR may be generated as the gate-on voltage Von for two horizontal periods 2H and may be generated as the first gate-off voltage Voff1 lower than the gate-on voltage Von for four horizontal periods 4H.

The phases of the first to fourth scan clock signals CK1_SC, CK2_SC, CK3_SC and CK4_SC are delayed sequentially. For example, the phase of the second scan clock signal CK2_SC may be delayed relative to the first scan clock signal CK1_SC by one horizontal period 1H, the phase of the third scan clock signal CK3_SC may be delayed relative to the second scan clock signal CK2_SC by one horizontal period 1H, and the phase of the fourth scan clock signal CK4_SC may be delayed relative to the third scan clock signal CK3_SC by one horizontal period 1H. The first to fourth scan clock signals CK1_SC, CK2_SC, CK3_SC and CK4_SC may be repeated every four horizontal periods 4H. The first to fourth scan clock signals CK1_SC, CK2_SC, CK3_SC and CK4_SC may be generated as the gate-on voltage Von for two horizontal periods 2H and may be generated as the first gate-off voltage Voff1 for two horizontal periods 2H. The gate-on voltage Von period of the first scan clock signal CK1_SC and the gate-on voltage Von period of the second scan clock signal CK2_SC may overlap each other by one horizontal period 1H. The gate-on voltage Von period of the second scan clock signal CK2_SC and the gate-on voltage Von period of the third scan clock signal CK3_SC may overlap each other by one horizontal period 1H. The gate-on voltage Von period of the third scan clock signal CK3_SC and the gate-on voltage Von period of the fourth scan clock signal CK4_SC may overlap each other by one horizontal period 1H. The gate-on voltage Von period of the fourth scan clock signal CK4_SC and the gate-on voltage Von period of the first scan clock signal CK1_SC may overlap each other by one horizontal period 1H.

The first to fourth sensing clock signals CK1_SS, CK2_SS, CK3_SS and CK4_SS may be substantially similar to the first to fourth scan clock signals CK1_SC, CK2_SC, CK3_SC and CK4_SC during the active period ACT.

During the active period ACT, after the carry signal CRk−2 of the $(k-2)^{th}$ stage ST(k−2) is generated as the gate-on voltage Von, the carry signal CRk of the $k^{th}$ stage STk may be generated as the gate-on voltage Von, and then the carry signal CRk+2 of the $(k+2)^{th}$ stage ST(k+2) may be generated as the gate-on voltage Von. This may happen in sequence. The gate-on voltage Von period of the carry signal CRk−2 of the $(k-2)^{th}$ stage ST(k−2), the gate-on voltage Von period of the carry signal CRk of the $k^{th}$ stage STk and the gate-on voltage Von period of the carry signal CRk+2 of the $(k+2)^{th}$ stage ST(k+2) may not overlap each other.

The sensing control signal SEN_ON may be generated as the gate-on voltage Von in the fifth and sixth periods t5 and t6 during the active period ACT. The gate-on voltage Von period of the sensing control signal SEN_ON may overlap the gate-on voltage Von period of the carry signal CRk+2 of the $(k+2)^{th}$ stage ST(k+2). The first control clock signal S_CLK1 may be generated as the second gate-off voltage Voff2 during the active period ACT, and the second control clock signal S_CLK2 may be generated as the third gate-off voltage Voff3 during the active period ACT.

The gate-on voltage Von may be a gate-high voltage that may turn on the transistors of the stages of the scan signal driver 200 and the transistors of the sub-pixels SP. The first gate-off voltage Voff1, the second gate-off voltage Voff2 and the third gate-off voltage Voff3 may be gate-low voltages that may turn off the transistors of the stages of the scan signal driver 200 and the transistors of the sub-pixels SP. The second gate-off voltage Voff2 may be lower than the first gate-off voltage Voff1. The third gate-off voltage Voff3 may be lower than the second gate-off voltage Voff2. For example, the first gate-off voltage Voff1 may be approximately −5 V, the second gate-off voltage Voff2 may be approximately −8 V, and the third gate-off voltage Voff3 may be approximately −11 V.

In the example shown FIG. 9A, the length of each of the first to seventh periods t1 to t7 may be equal to one horizontal period 1H. During one horizontal period 1H, data voltages may be applied to the sub-pixels SP arranged in one horizontal line.

FIGS. 10 to 16 are circuit diagrams illustrating operations of the $k^{th}$ stage during first to seventh periods of the active period, according to an exemplary embodiment of the present inventive concept.

Hereinafter, the operations of the $k^{th}$ stage during the first to seventh periods of the active period will be described in detail with reference to FIGS. 9A to 16.

In the example shown in FIGS. 10 to 16, a third carry clock signal of the third carry clock line CRC3 is applied to the first carry clock terminal CRI, the first carry clock signal of the first carry clock line CRC1 is applied to the second carry clock terminal CRI2, a third scan clock signal of the third scan clock line SCC3 is applied to the scan clock terminal SCI, and a third sensing clock signal of the third sensing clock line SEC3 is applied to the sensing clock terminal SSI. In addition, in the example shown in FIG. 8, a carry signal of the $(k-2)^{th}$ stage ST(k−2) is applied to the start terminal CPI, and a carry signal of the $(k+2)^{th}$ stage ST(k+2) is applied to the next carry input terminal CNI.

Figure 10:
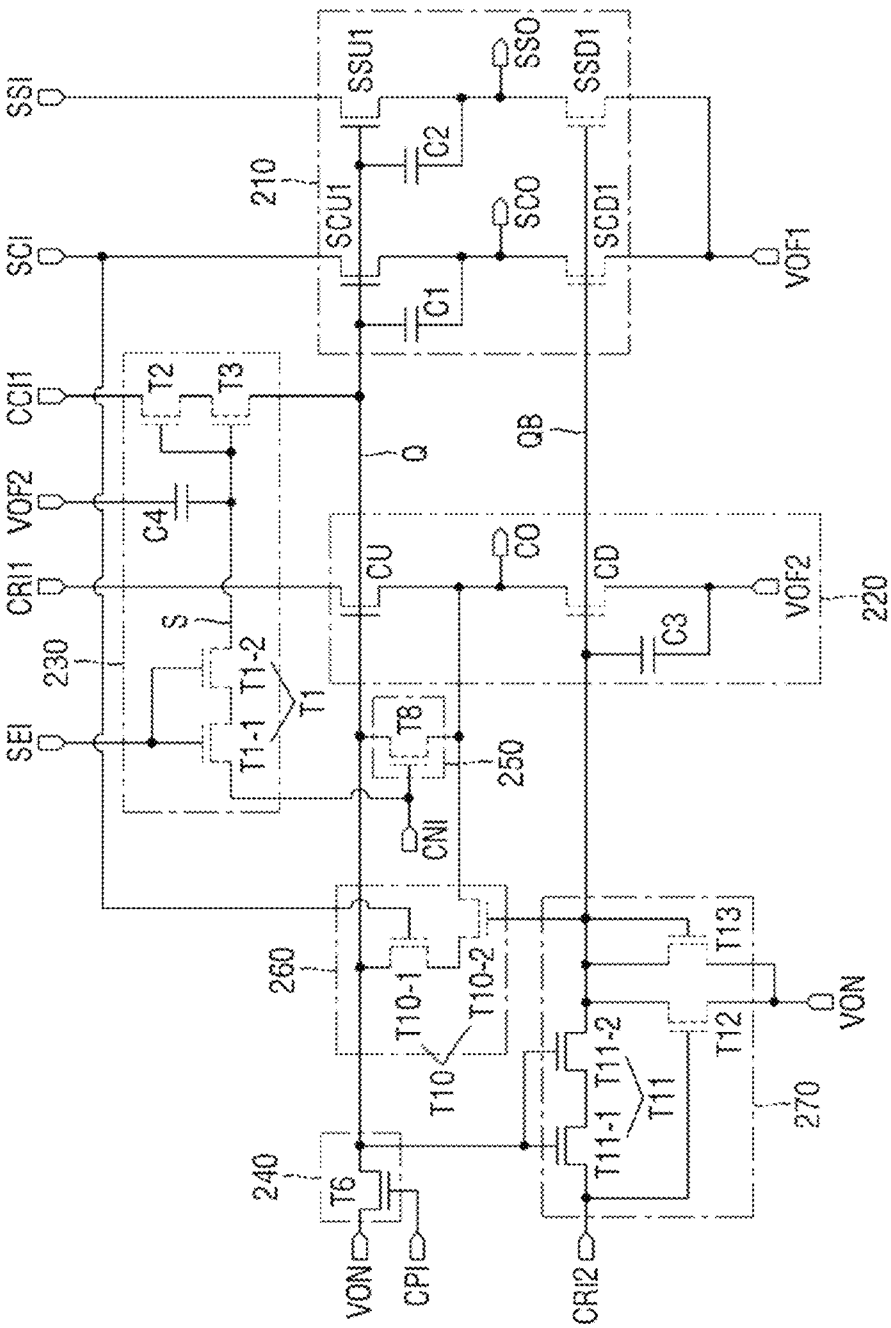
FIGS. 10, 11, 12, 13, 14, 15 and 16 are circuit diagrams illustrating operations of the $k^{th}$ stage during first to seventh periods of the active period, according to an exemplary embodiment of the present inventive concept.

Firstly, as shown in FIG. 9A, during the first time period ti, the carry signal CR(k−2) of the $(k-2)^{th}$ stage ST(k−2) of the gate-on voltage Von may be applied to the start terminal CPI of the $k^{th}$ stage STk, and the carry signal CR(k+2) of the $(k+2)^{th}$ stage ST(k+2) of the first gate-off voltage Voff1 may be applied to the next carry input terminal CNI. In addition, as shown in FIG. 9A, during the first time period t1, the third carry clock signal CK3_CR of the first gate-off voltage Voff1 may be applied to the first carry clock terminal CRI1 of the $k^{th}$ stage STk, and the first carry clock signal CK1_CR of the first gate-off voltage Voff1 may be applied to the second carry clock terminal CRI2. In addition, as shown in FIG. 9A, during the first time period ti, the third scan clock signal CK3_SC of the first gate-off voltage Voff1 may be applied to the scan clock terminal SCI of the $k^{th}$ stage STk, and the third sensing clock signal CK3_SS of the first gate-off voltage Voff1 may be applied to the sensing clock terminal SSI. In addition, as shown in FIG. 9A, during the first time period ti, a sensing control signal SEN_ON of the first gate-off voltage Voff1 may be applied to the sensing control terminal SEI of the $k^{th}$ stage STk, and a first control clock signal S_CLK1 of the first gate-off voltage Voff1 may be applied to the first control clock terminal CCI1. Therefore, as shown in FIG. 10, the sixth transistor T6, the eleventh transistor T11, the first scan pull-up transistor SCU1, the first sensing pull-up transistor SSU1, and the carry pull-up transistor CU may be turned on.

The sixth transistor T6 is turned on by the carry signal CRk−2 of the $(k-2)^{th}$ stage ST(k−2) of the gate-on voltage Von to connect the pull-up node Q with the gate-on terminal VON. Accordingly, since the pull-up node Q has the gate-on voltage Von, the eleventh transistor T11, the first scan pull-up transistor SCU1, the first sensing pull-up transistor SSU1 and the carry pull-up transistor CU may be turned on.

The eleventh transistor T11 is turned on by the gate-on voltage Von of the pull-up node Q to apply the first gate-off voltage Voff1 of the first carry clock signal CK1_CR to the pull-down node QB. As a result, the first scan pull-down transistor SCD1, the first sensing pull-down transistor SSD1 and the carry pull-down transistor CD may be turned off.

The first scan pull-up transistor SCU1 is turned on by the gate-on voltage of the pull-up node Q to output a third scan clock signal CK3_SC of the first gate-off voltage Voff1 input to the scan clock terminal SCI to the scan output terminal SCO. This way, the scan signal SCk of the first gate-off voltage Voff1 may be applied to the $k^{th}$ scan signal line SCLk.

The first sensing pull-up transistor SSU1 is turned on by the gate-on voltage Von of the pull-up node Q to output the third sensing clock signal CK3_SC of the first gate-off voltage Voff1 input to the sensing clock terminal SSI to the sensing output terminal SSO. This way, the sensing signal SSk of the first gate-off voltage Voff1 may be applied to the $k^{th}$ sensing signal line SSLk.

The carry pull-up transistor CU is turned on by the gate-on voltage Von of the pull-up node Q to output the third carry clock signal CK3_CR of the first gate-off voltage Voff1 input to the first carry clock terminal CRI1 to the carry output terminal CO.

Figure 11:
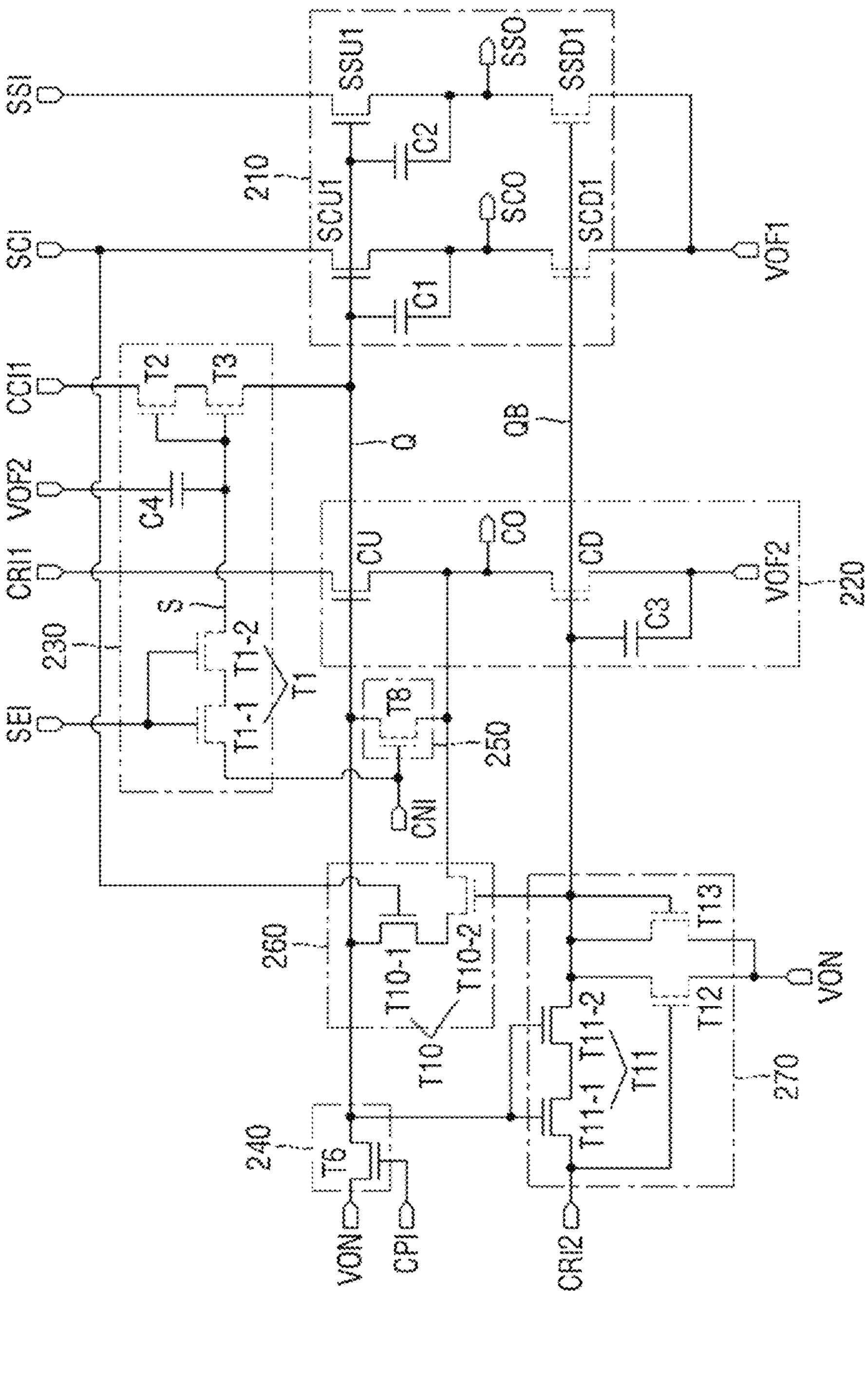

Secondly, as shown in FIG. 9A, during the second time period t2, the carry signal CR(k−2) of the (k−2)$^{th}$ stage ST(k−2) of the gate-on voltage Von may be applied to the start terminal CPI of the k$^{th}$ stage STk, and the carry signal CR(k+2) of the (k+2)$^{th}$ stage ST(k+2) of the first gate-off voltage Voff1 may be applied to the next carry input terminal CNI. In addition, as shown in FIG. 9A, during the second time period t2, the third carry clock signal CK3_CR of the first gate-off voltage Voff1 may be applied to the first carry clock terminal CRI of the k$^{th}$ stage STk, and the first carry clock signal CK1_CR of the first gate-off voltage Voff1 may be applied to the second carry clock terminal CRI2. In addition, as shown in FIG. 9A, during the second time period t2, the third scan clock signal CK3_SC of the gate-on voltage Von may be applied to the scan clock terminal SCI of the k$^{th}$ stage STk, and the third sensing clock signal CK3_SS of the gate-on voltage Von may be applied to the sensing clock terminal SSI. In addition, as shown in FIG. 9A, during the second time period t2, a sensing control signal SEN_ON of the first gate-off voltage Voff1 may be applied to the sensing control terminal SEI of the k$^{th}$ stage STk, and a first control clock signal S_CLK1 of the first gate-off voltage Voff1 may be applied to the first control clock terminal CCI. Therefore, as shown in FIG. 11, the sixth transistor T6, the (10-1)$^{th}$ transistor T10-1, the eleventh transistor T11, the first scan pull-up transistor SCU1, the first sensing pull-up transistor SSU1, and the carry pull-up transistor CU may be turned on.

The operations of the sixth transistor T6, the eleventh transistor T11 and the carry pull-up transistor CU during the second time period t2 may be substantially the same as those of the first time period t1 described above with reference to FIG. 10.

The (10-1)$^{th}$ transistor T10-1 is turned on by the gate-on voltage Von of the third scan clock signal to connect the pull-up node Q with the second electrode of the (10-2)$^{th}$ transistor T10-2.

The first scan pull-up transistor SCU1 is turned on by the gate-on voltage of the pull-up node Q to output the third scan clock signal CK3_SC of the gate-on voltage Von input to the scan clock terminal SCI to the scan output terminal SCO. This way, the scan signal SCk of the gate-on voltage Von may be applied to the k$^{th}$ scan signal line SCLk.

The first sensing pull-up transistor SSU1 is turned on by the gate-on voltage Von of the pull-up node Q to output the third sensing clock signal CK3_SC of the gate-on voltage Von input to the sensing clock terminal SSI to the sensing output terminal SSO. This way, the k sensing signal SSk of the gate-on voltage Von may be applied to the k$^{th}$ sensing signal line SSLk.

When the third scan clock signal CK3_SC of the gate-on voltage Von is applied to the scan output terminal SCO and the third sensing clock signal CK3_SS of the gate-on voltage Von is applied to the sensing output terminal SSO, the pull-up node Q is bootstrapped by the second capacitor C2 so that the voltage may rise from the gate-on voltage Von to a voltage Von' of a higher level than the gate-on voltage Von. This can be seen by voltage VQ rising to Von' at the second time period t2 in FIG. 9A. In FIG. 9A, VQB may correspond to the voltage of the pull-down node QB.

Figure 12:
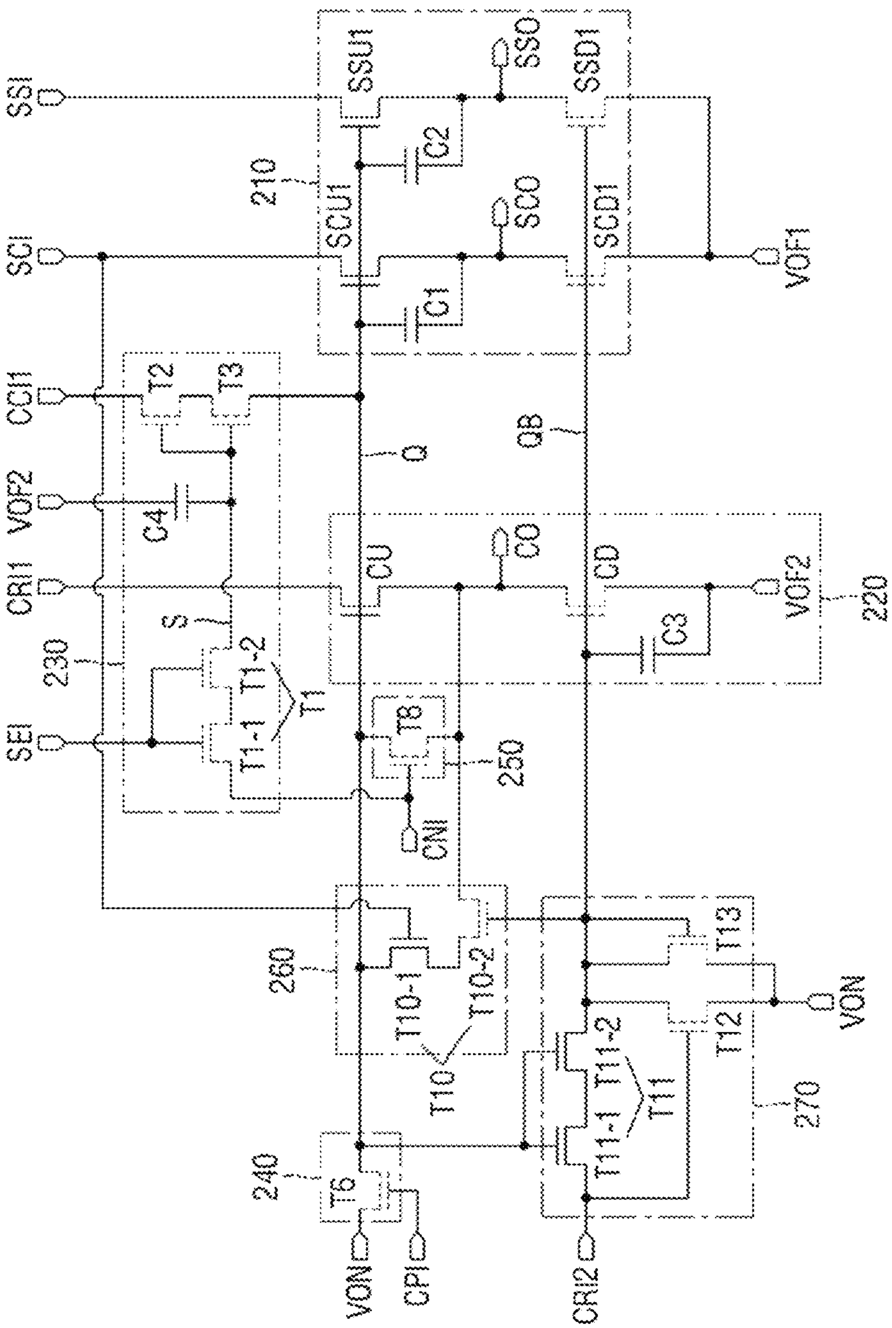

Thirdly, as shown in FIG. 9A, during the third time period t3, the carry signal CR(k−2) of the (k−2p stage ST(k−2) of the first gate-off voltage Voff1 may be applied to the start terminal CPI of the k$^{th}$ stage STk, and the carry signal CR(k+2) of the (k+2)$^{th}$ stage ST(k+2) of the first gate-off voltage Voff1 may be applied to the next carry input terminal CNI. In addition, as shown in FIG. 9A, during the third time period 3, the third carry clock signal CK3_CR of the gate-on voltage Von may be applied to the first carry clock terminal CRI1 of the k$^{th}$ stage STk, and the first carry clock signal CK1_CR of the first gate-off voltage Voff1 may be applied to the second carry clock terminal CRI2. In addition, as shown in FIG. 9A, during the third time period t3, the third scan clock signal CK3_SC of the gate-on voltage Von may be applied to the scan clock terminal SCI of the k$^{t}$ stage STk, and the third sensing clock signal CK3_SS of the gate-on voltage Von may be applied to the sensing clock terminal SSI. In addition, as shown in FIG. 9A, during the third time period t3, a sensing control signal SEN_ON of the first gate-off voltage Voff1 may be applied to the sensing control terminal SEI of the k$^{th}$ stage STk, and a first control clock signal S_CLK1 of the first gate-off voltage Voff1 may be applied to the first control clock terminal CCI1. Thus, the eleventh transistor T11, the first scan pull-up transistor SCU1, the first sensing pull-up transistor SSU1 and the carry pull-up transistor CU may be turned on, as shown in FIG. 12.

During the third time period t3, the operations of the (10-1)$^{th}$ transistor T10-1, the eleventh transistor T11, the first scan pull-up transistor SCU1 and the first sensing pull-up transistor SSU1 may be substantially the same as those of the second time period t2 described above with reference to FIG. 11.

The carry pull-up transistor CU is turned on by the gate-on voltage Von of the pull-up node Q to output the third carry clock signal CK3_CR of the gate-on voltage Von input to the first carry clock terminal CRI1 to the carry output terminal CO.

When the sixth transistor T6 is driven at a high temperature, the threshold voltage may be negatively shifted. When this happens, the sixth transistor T6 may not be completely turned off, and accordingly a leakage current may flow through the sixth transistor T6. Due to the leakage current of the sixth transistor T6, during the third time period t3, the pull-up node Q may fail to rise to the voltage Von' higher than the gate-on voltage Von by bootstrapping. As a result, the first scan pull-up transistor SCU1 and the first sensing pull-up transistor SSU1 may not be completely turned on, such that the gate-on voltage Von may not be output to the scan output terminal SCO and the sensing output terminal SSO properly.

Figure 9B:
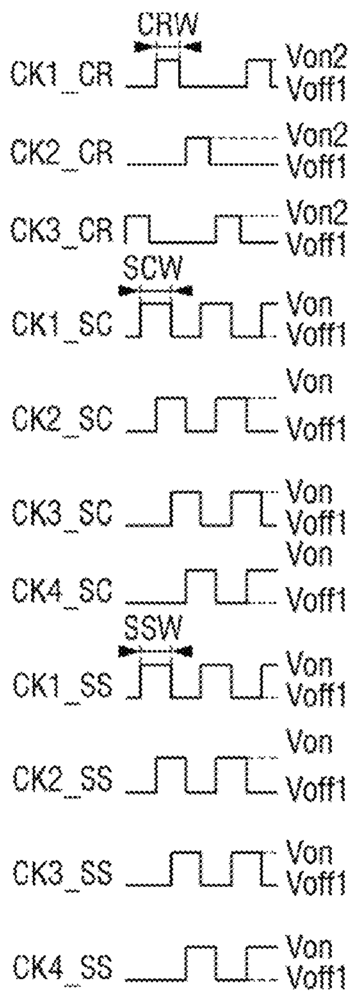
FIG. 9B is a waveform diagram showing the carry clock signals, the scan clock signals, and the sensing clock signals during the active period of the $N^{th}$ frame, according to an exemplary embodiment of the present inventive concept.

To reduce the voltage level of the pull-up node Q from being lower than the voltage Von' higher than the gate-on voltage Von due to the leakage current of the sixth transistor T6 during the third time period 3, the carry clock signals CK1_CR, CK2_CR and CK3_CR may swing between the second gate-on voltage Von2 that is lower than the gate-on voltage Von and the first gate-off voltage Voff1, as shown in FIG. 9B. Alternatively, to reduce the potential of the pull-up node Q from being lower than the voltage Von' higher than the gate-on voltage Von due to the leakage current of the sixth transistor T6 during the third time period t3, a gate-on voltage period CRW of the carry clock signals CK1_CR, CK2_CR and CK3_CR may be shorter than a gate-on voltage period SCW of the scan clock signals CK1_SC, CK2_SC, CK3_SC and CK4_SC, respectively, as shown in FIG. 9B. In addition, as shown in FIG. 9B, the gate-on voltage periods CRW of the carry clock signals CK1_CR, CK2_CR and CK3_CR may be shorter than the gate-on voltage periods SSW of the sensing clock signals CK1_SS, CK2_SS, CK3_SS and CK4_SS, respectively.

Figure 13:
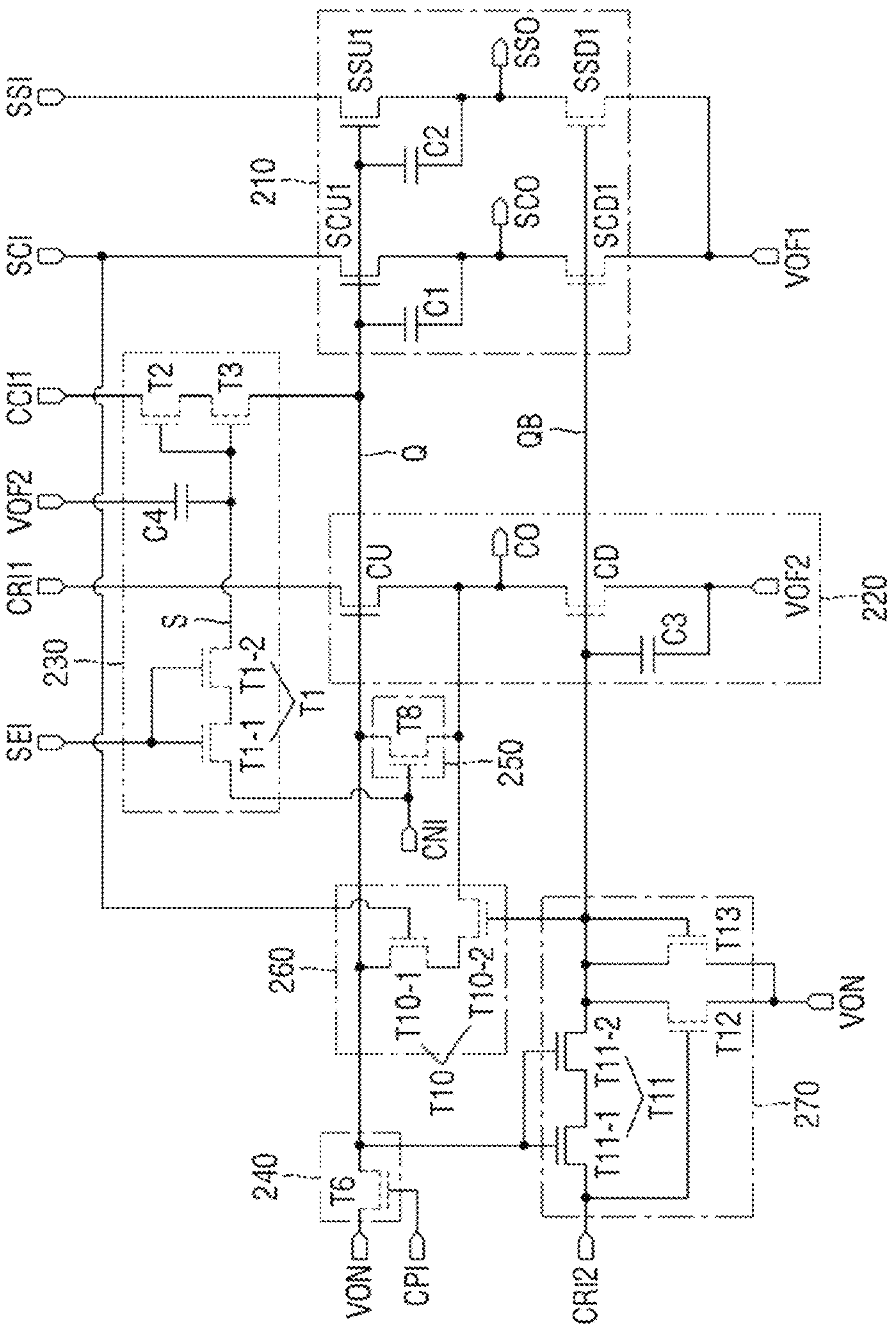

Fourthly, as shown in FIG. 9A, during the fourth time period t4, the carry signal CR(k−2) of the $(k-2)^{th}$ stage ST(k−2) of the first gate-off voltage Voff1 may be applied to the start terminal CPI of the $k^{th}$ stage STk, and the carry signal CR(k+2) of the $(k+2)^{th}$ stage ST(k+2) of the first gate-off voltage Voff1 may be applied to the next carry input terminal CNI. In addition, as shown in FIG. 9A, during the fourth time period t4, the third carry clock signal CK3_CR of the gate-on voltage Von may be applied to the first carry clock terminal CRI1 of the $k^{th}$ stage STk, and the first carry clock signal CK1_CR of the first gate-off voltage Voff1 may be applied to the second carry clock terminal CRI2. In addition, as shown in FIG. 9A, during the fourth time period t4, the third scan clock signal CK3_SC of the first gate-off voltage Voff1 may be applied to the scan clock terminal SCI of the $k^{th}$ stage STk, and the third sensing clock signal CK3_SS of the first gate-off voltage Voff1 may be applied to the sensing clock terminal SSI. In addition, as shown in FIG. 9A, during the fourth time period t4, a sensing control signal SEN_ON of the first gate-off voltage Voff1 may be applied to the sensing control terminal SEI of the $k^{th}$ stage STk, and a first control clock signal S_CLK1 of the first gate-off voltage Voff1 may be applied to the first control clock terminal CCI. Thus, the eleventh transistor T11, the first scan pull-up transistor SCU1, the first sensing pull-up transistor SSU1 and the carry pull-up transistor CU may be turned on, as shown in FIG. 13.

The operations of the eleventh transistor T11 and the carry pull-up transistor CU during the fourth time period 14 may be substantially the same as those of the third time period t3 described above with reference to FIG. 12.

The first scan pull-up transistor SCU1 is turned on by the gate-on voltage of the pull-up node Q to output a third scan clock signal CK3_SC of the first gate-off voltage Voff1 input to the scan clock terminal SCI to the scan output terminal SCO. This way, the scan signal SCk of the first gate-off voltage Voff1 may be applied to the $k^{th}$ scan signal line SCLk.

The first sensing pull-up transistor SSU1 is turned on by the gate-on voltage Von of the pull-up node Q to output the third sensing clock signal CK3_SC of the first gate-off voltage Voff1 input to the sensing clock terminal SSI to the sensing output terminal SSO. This way, the $k^{th}$ sensing signal SSk of the first gate-off voltage Voff1 may be applied to the km sensing signal line SSLk.

When the third scan clock signal CK3_SC of the first gate-off voltage Voff1 is applied to the scan output terminal SCO and the third sensing clock signal CK3_SS of the first gate-off voltage Voff1 is applied to the sensing output terminal SSO, the pull-up node Q is bootstrapped by the first capacitor C1 and the second capacitor C2 so that the voltage may be lowered from the voltage level Von' higher than the gate-on voltage Von to the gate-on voltage Von.

Figure 14:
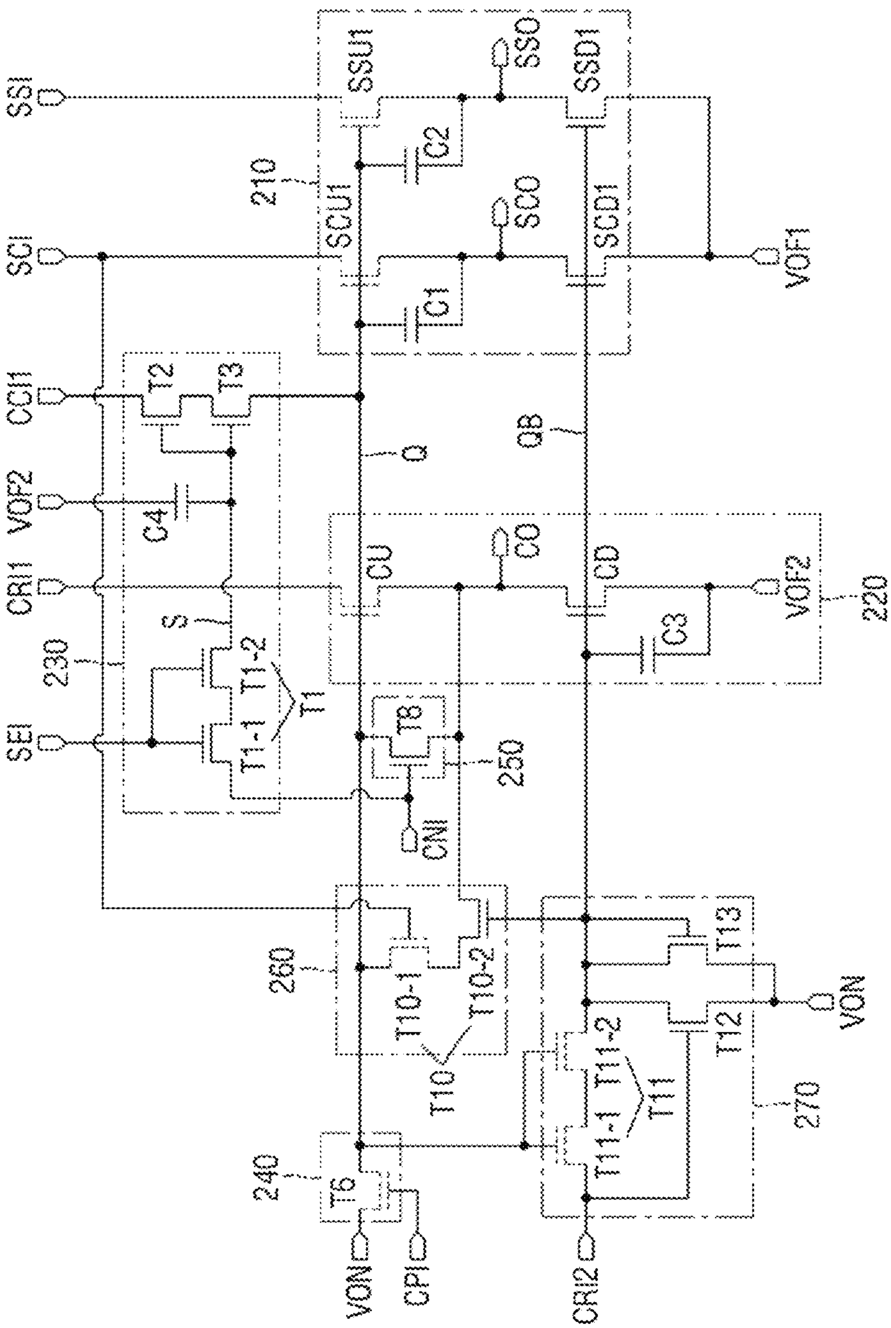

Fifthly, as shown in FIG. 9A, during the fifth time period t5, the carry signal CR(k−2) of the $(k-2)^{th}$ stage ST(k−2) of the first gate-off voltage Voff1 may be applied to the start terminal CPI of the $k^{th}$ stage STk, and the carry signal CR(k+2) of the $(k+2)^{th}$ stage ST(k+2) of the gate-on voltage Von may be applied to the next carry input terminal CNI. In addition, as shown in FIG. 9A, during the fifth time period t5, the third carry clock signal CK3_CR of the first gate-off voltage Voff1 may be applied to the first carry clock terminal CRI1 of the $k^{th}$ stage ST, and the first carry clock signal CK1_CR of the gate-on voltage Von may be applied to the second carry clock terminal CRI2. In addition, as shown in FIG. 9A, during the fifth time period t5, the third scan clock signal CK3_SC of the first gate-off voltage Voff1 may be applied to the scan clock terminal SCI of the $k^{th}$ stage STk, and the third sensing clock signal CK3_SS of the first gate-off voltage Voff1 may be applied to the sensing clock terminal SSI. In addition, as shown in FIG. 9A, during the fifth time period t5, a sensing control signal SEN_ON of the gate-on voltage Von may be applied to the sensing control terminal SEI of the $k^{th}$ stage STk, and a first control clock signal S_CLK1 of the first gate-off voltage Voff1 may be applied to the first control clock terminal CCI1. Therefore, as shown in FIG. 14, the first transistor T1, the second transistor T2, the third transistor T3, the eighth transistor T8, the $(10\text{-}2)^{th}$ transistor T10-2, the twelfth transistor T12, the thirteenth transistor T13, the first scan pull-down transistor SCD1, the first sensing pull-down transistor SSD1, and the carry pull-down transistor CD may be turned on.

The eighth transistor T8 is turned on by the carry signal CR(k+2) of the $(k+2)^{th}$ stage ST(k+2) of the gate-on voltage Von to connect the pull-up node Q with the carry output terminal CO. Accordingly, during the fifth time period t5, the third carry clock signal CK3_CR of the first gate-off voltage Voff1 is applied to the carry output terminal CO, and accordingly the pull-up node Q has the first gate-off voltage Voff1. Thus, the eleventh transistor T11, the first scan pull-up transistor SCU1, the first sensing pull-up transistor SSU1, and the carry pull-up transistor CU may be turned off.

The twelfth transistor T12 is turned on by the first cay clock signal CK1_CR of the gate-on voltage Von input to the second carry clock terminal CRI2 to connect the pull-down node QB with the gate-on terminal VON. Accordingly, the pull-up node Q has the gate-on voltage Von, and accordingly the $(10\text{-}2)^{th}$ transistor T10-2, the thirteenth transistor T13, the first scan pull-down transistor SCD1, the first sensing pull-down transistor SSD1 and the carry pull-down transistor CD may be turned on.

The (10-2) transistor T10-2 may be turned on by the gate-on voltage of the pull-down node QB to connect the carry output terminal CO with the first electrode of the $(10\text{-}1)^{th}$ transistor T10-1. Therefore, when the 10-1 transistor T10-1 is turned on, the pull-up node Q may be connected to the carry output terminal CO.

The thirteenth transistor T13 is turned on by the gate-on voltage Von of the pull-down node QB to connect the pull-down node QB with the gate-on terminal VON.

The first scan pull-down transistor SCD1 is turned on by the gate-on voltage Von of the pull-down node QB to output the first gate-off voltage input to the first gate-off terminal VOF1. This way, the scan signal SCk of the first gate-off voltage Voff1 may be applied to the $k^{th}$ scan signal line SCLk.

The first sensing pull-down transistor SSD1 is turned on by the gate-on voltage Von of the pull-down node QB to output the first gate-off voltage input to the first gate-off terminal VOF1 to the sensing output terminal SSO. This way, the sensing signal SSk of the first gate-off voltage Voff1 may be applied to the k sensing signal line SSLk.

The carry pull-down transistor CD is turned on by the gate-on voltage of the pull-down node QB to output the first gate-off voltage input to the first gate-off terminal VOF1 to the carry output terminal CO.

The first transistor T1 is turned on by the gate-on voltage Von of the sensing control signal SEN_ON input to the sensing control terminal SE to connect the next carry input terminal CNI with the sensing control node S. Accordingly, the sensing control node S has the gate-on voltage Von of the carry signal of the $(k+2)^{th}$ stage ST(k+2), such that the second transistor T2 and the third transistor T3 may be turned on.

The second transistor T2 and the third transistor T3 are turned on by the gate-on voltage of the sensing control node S to apply a first control clock signal S_CLK1 input to a first control clock terminal CCI1 to the pull-up node Q. Accordingly, the first gate-off voltage Voff1 of the first control clock signal S_CLK1 may be applied to the pull-up node Q.

The sensing control node S may have the gate-on voltage Von only when the first transistor T is turned on and the carry signal of the $(k+2)^{th}$ stage ST(k+2) input to the next carry input terminal CNI has the gate-on voltage Von during the fifth time period t5. Therefore, the sensing control signal SEN_ON of the gate-on voltage Von may be input to the stage to output a scan signal and a sensing signal during the vertical blank period for the fifth time period t5, while the sensing control signal SEN_ON of the first gate-off voltage Voff1 may be input to the rest of the stages for the fifth time period t5.

Figure 15:
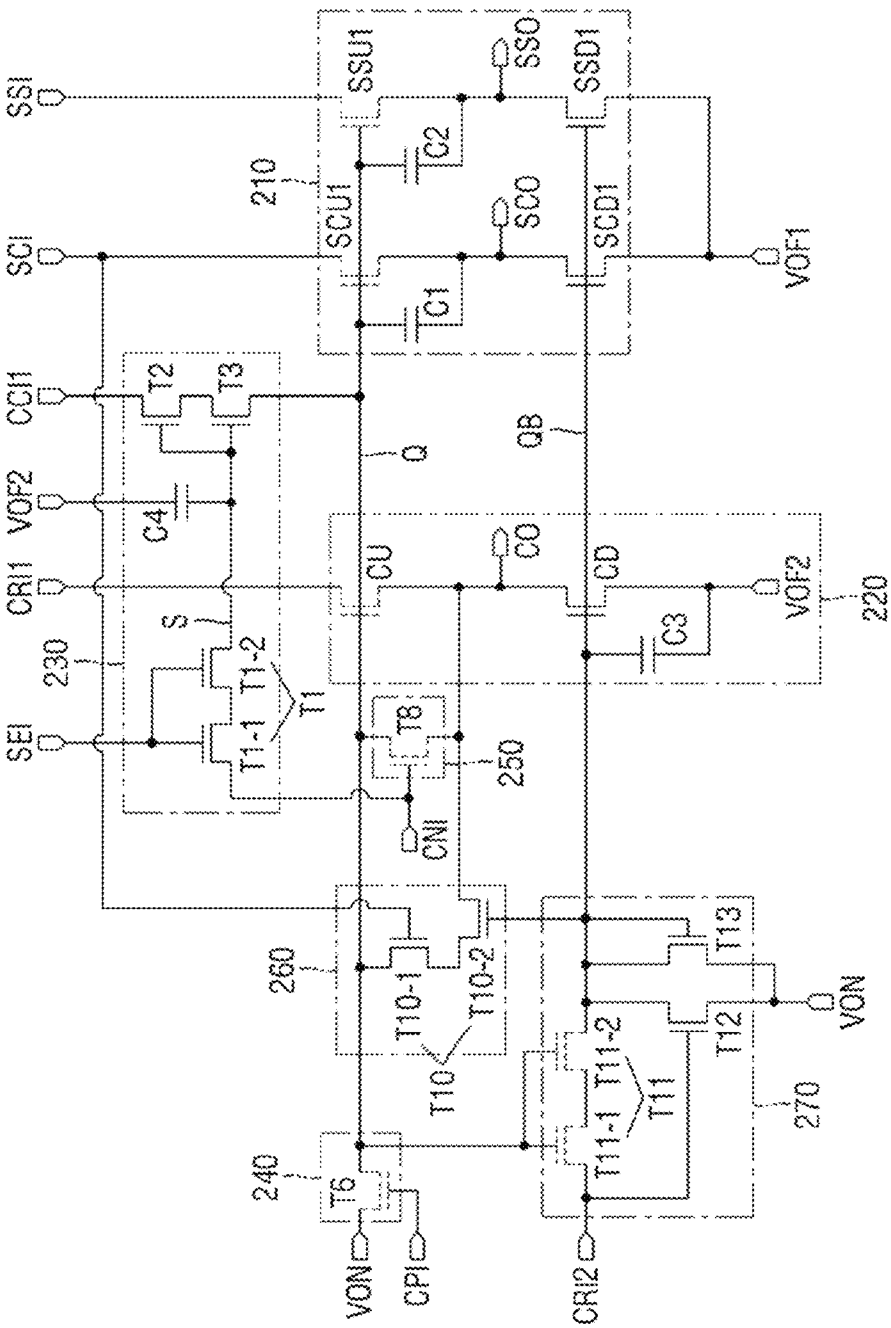

Sixthly, as shown in FIG. 9A, during the sixth time period t6, the carry signal CR(k−2) of the $(k-2)^{th}$ stage ST(k−2) of the first gate-off voltage Voff1 may be applied to the start terminal CPI of the $k^{th}$ stage STk, and the carry signal CR(k+2) of the $(k+2)^{th}$ stage ST(+2) of the gate-on voltage Von may be applied to the next carry input terminal CNI. In addition, as shown in FIG. 9A, during the sixth time period t6, the third carry clock signal CK3_CR of the first gate-off voltage Voff1 may be applied to the first carry clock terminal CRI1 of the $k^{th}$ stage STk, and the first carry clock signal CK1_CR of the gate-on voltage Von may be applied to the second carry clock terminal CRI2. In addition, as shown in FIG. 9A, during the sixth time period t6, the third scan clock signal CK3_SC of the gate-on voltage Von may be applied to the scan clock terminal SCI of the $k^{th}$ stage STk, and the third sensing clock signal CK3_SS of the gate-on voltage Von may be applied to the sensing clock terminal SSI. In addition, as shown in FIG. 9A, during the sixth time period t6, a sensing control signal SEN_ON of the gate-on voltage Von may be applied to the sensing control terminal SEI of the $k^{th}$ stage STk, and a first control clock signal S_CLK1 of the first gate-off voltage Voff1 may be applied to the first control clock terminal CCI1. Therefore, as shown in FIG. 15, the first transistor T1, the second transistor T2, the third transistor T3, the eighth transistor T8, the $(10-1)^{th}$ transistor T10-1, the $(10-2)^{th}$ transistor T10-2, the twelfth transistor T12, the thirteenth transistor T13, the first scan pull-down transistor SCD1, the first sensing pull-down transistor SSD1, and the carry pull-down transistor CD may be turned on.

The operations of the first transistor T1, the second transistor T2, the third transistor T3, the eighth transistor T8, the $(10-2)^{th}$ transistor T10-2, the twelfth transistor T12, the thirteenth transistor T13, the first scan pull-down transistor SCD1, the first sensing pull-down transistor SSD1 and the carry pull-down transistor CD during the sixth period t6 may be substantially the same as the operations during the fifth period t5 described above with reference to FIG. 14.

The $(10-1)^{th}$ transistor T10-1 is turned on by the gate-on voltage Von of the third scan clock signal to connect the pull-up node Q with the second electrode of the $(10-2)^{th}$ transistor T10-2. Since both the $(10-1)^{th}$ transistor T10-1 and the $(10-2)^{th}$ transistor T10-2 are turned on during the sixth period 16, the pull-up node Q may be connected to the carry output terminal CO.

Figure 16:
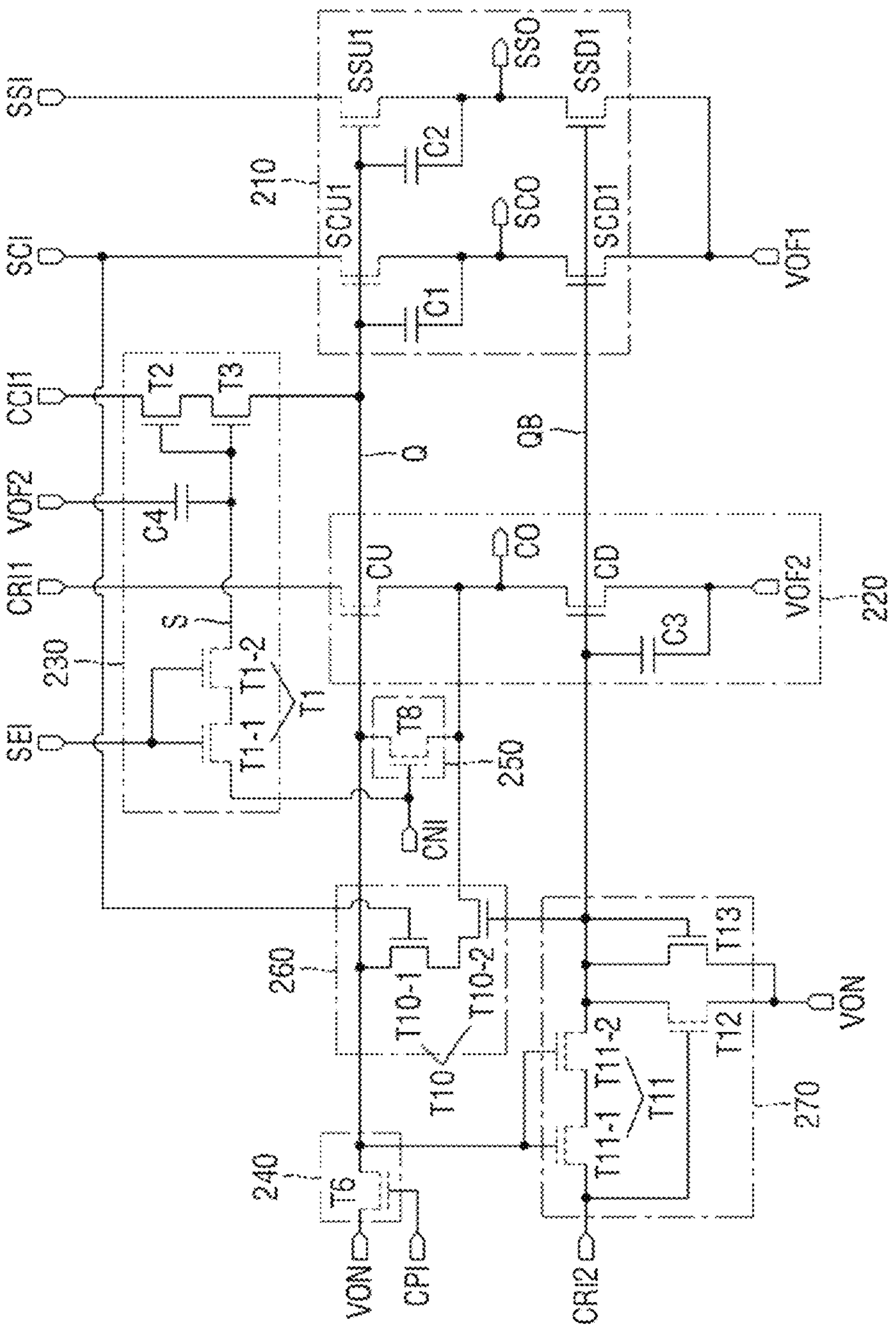

Seventhly, as shown in FIG. 9A, during the seventh time period t7, the carry signal CR(k−2) of the $(k-2)^{th}$ stage ST(k−2) of the first gate-off voltage Voff1 may be applied to the start terminal CPI of the $k^{th}$ stage STk, and the carry signal CR(k+2) of the $(k+2)^{th}$ stage ST(k+2) of the first gate-off voltage Voff1 may be applied to the next carry input terminal CNI. In addition, as shown in FIG. 9A, during the seventh time period t7, the third carry clock signal CK3_CR of the first gate-off voltage Voff1 may be applied to the first carry clock terminal CRI of the $k^{th}$ stage STk, and the first carry clock signal CK1_CR of the first gate-off voltage Voff1 may be applied to the second carry clock terminal CRI2. In addition, as shown in FIG. 9A, during the seventh time period 7, the third scan clock signal CK3_SC of the gate-on voltage Von may be applied to the scan clock terminal SCI of the $k^{th}$ stage STk, and the third sensing clock signal CK3_SS of the gate-on voltage Von may be applied to the sensing clock terminal SSI. In addition, as shown in FIG. 9A, during the seventh time period t7, a sensing control signal SEN_ON of the first gate-off voltage Voff1 may be applied to the sensing control terminal SEI of the $k^{th}$ stage STk, and a first control clock signal S_CLK1 of the first gate-off voltage Voff1 may be applied to the first control clock terminal CCI1. Therefore, as shown in FIG. 16, the second transistor T2, the third transistor T3, the $(10-2)^{th}$ transistor T10-2, the thirteenth transistor T13, the first scan pull-down transistor SCD1, the first sensing pull-down transistor SSD1, and the carry pull-down transistor CD may be turned on.

The operations of the second transistor T2, the third transistor T3, the $(0-2)^{th}$ transistor T10-2, the thirteenth transistor T13, the first scan pull-down transistor SCD1, the first sensing pull-down transistor SSD1 and the carry pull-down transistor CD during the seventh time period t7 may be substantially the same as the operations during the sixth time period t6 described above with reference to FIG. 15.

As shown in FIGS. 9A to 16, during the active period, the $k^{th}$ stage STk may output the k scan signal SCk of the gate-on voltage and the $k^{th}$ sensing signal SSk of the gate-on voltage Von for the second time period t2 and the third time period t3, and may output the carry signal CRk of the gate-on voltage Von for the third time period t3 and the fourth time period t4.

When the pull-up node Q has the gate-on voltage Von, the carry pull-up transistor CU may be turned on. In addition, when the pull-down node QB has the first gate-off voltage Voff1, the gate-source voltage Vgs (=Voff1−Voff2) of the carry pull-down transistor CD is greater than 0V, so that a current path may be formed from the first carry clock terminal CRI1 to the second gate-off terminal VOF2. For example, when the third carry clock signal of the first gate-off voltage Voff1 is applied to the first carry clock terminal CRI1, a current path may be formed from the first carry clock terminal CRI to the second gate-off terminal VOF2. In this case, the amount of current of the first gate-off voltage Voff1 may increase and the power consumption may increase accordingly. Therefore, the power supply 180 may monitor the amount of current of the first gate-off voltage Voff1, and may control the carry clock signals CK1_CR, CK2_CR and CK3_CR so that they swing from the second gate-off voltage Voff2 to the gate-on voltage Von or the second gate-on voltage Von2 when the amount of current of the first gate-off voltage Voff1 is equal to or greater than a threshold value.

Figure 17:
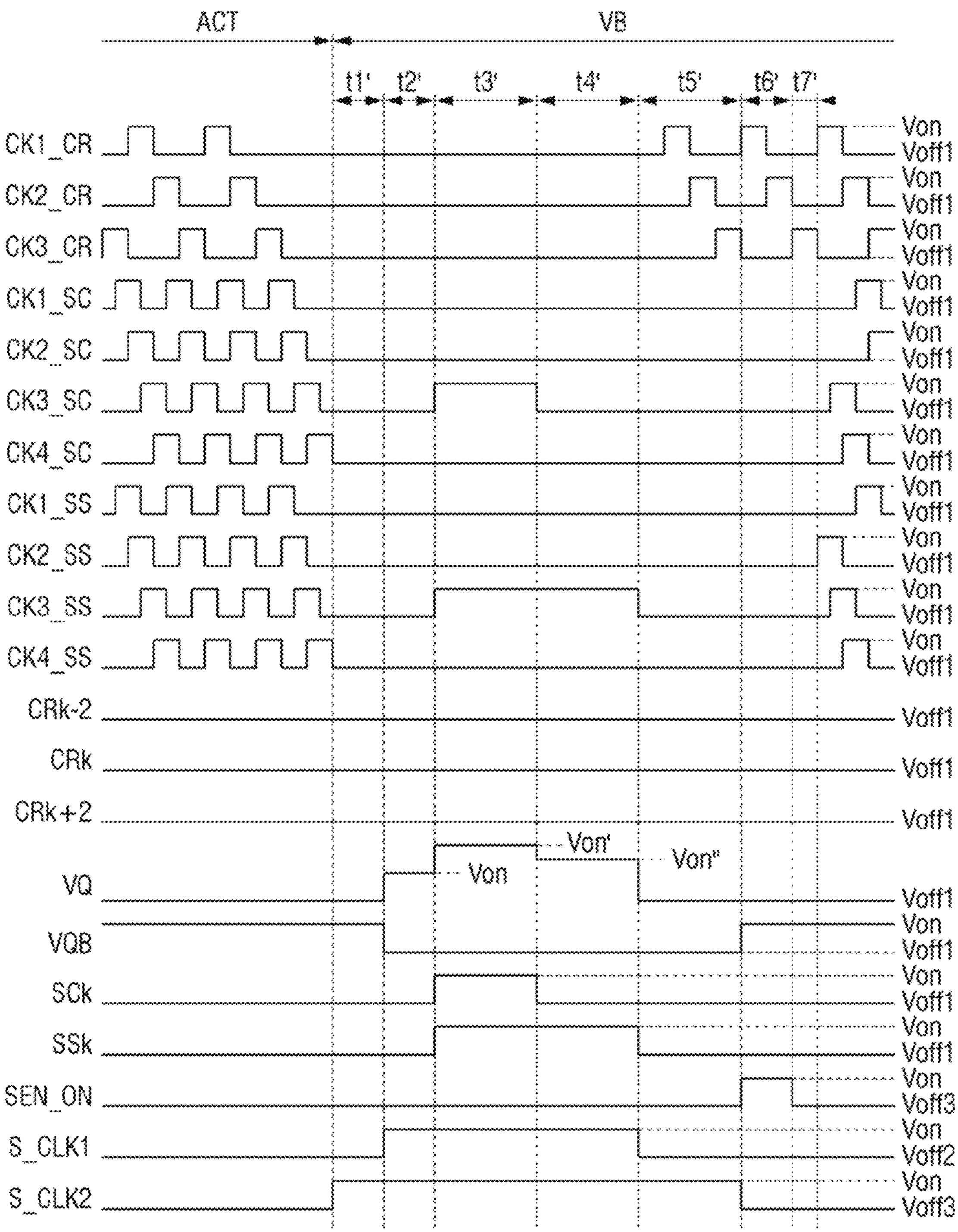
FIG. 17 is a waveform diagram showing the carry clock signals, the scan clock signals, the sensing clock signals, the sensing control signal, the (k−2) carry signal, the k carry signal, the (k+2) carry signal, the voltage of the pull-up node, the voltage of the pull-down node, the $k^{th}$ scan signal and the k sensing signal during the active period and the vertical blank period of the $N^{th}$ frame, according to an exemplary embodiment of the present inventive concept.

FIG. 17 is a waveform diagram showing the carry clock signals, the scan clock signals, the sensing clock signals, the sensing control signal, the (k−2) carry signal, the $k^{th}$ carry signal, the (k+2) carry signal, the voltage of the pull-up node, the voltage of the pull-down node, the $k^{th}$ scan signal and the $k^{th}$ sensing signal during the active period and the vertical blank period of the $N^{th}$ frame, according to an exemplary embodiment of the present inventive concept.

The first to third carry clock signals CK1_CR, CK2_CR and CK3_CR, the first to fourth scan clock signals CK1_SC, CK2_SC, CK3_SC and CK4_SC and the first to fourth sensing clock signals CK1_SS, CK2_SS, CK3_SS and CK4_SS during the active period ACT of the $N^{th}$ frame period in FIG. 17 are substantially identical to those described above with reference to FIG. 9A.

Referring to FIG. 17, the first to third carry clock signals CK1_CR, CK2_CR and CK3_CR may be generated as the first gate-off voltage Voff1 during the 1' to 4' time periods t1' to t4' of the vertical blank period VB of the N frame period.

Among the first to fourth scan clock signals CK1_SC, CK2_SC, CK3_SC and CK4_SC, the third scan clock signal CK3_SC input to the scan clock terminal SCI of the $k^{th}$ stage STk may be generated as the gate-on voltage Von during the 3' time period t3' of the vertical blank period VB, and may be generated as the first gate-off voltage Voff1 during the rest of the periods of the vertical blank period VB. The rest of the scan clock signals CK1_SC, CK2_SC and CK4_SC may be generated as the first gate-off voltage Voff1 during the 1' to 6' time periods t1' to t6' of the vertical blank period VB.

Among the first to fourth sensing clock signals CK1_SS, CK2_SS, CK3_SS and CK4_SS, the third sensing clock signal CK3_SS input to the sensing clock terminal SSI of the $k^{th}$ stage STk may be generated as the gate-on voltage Von during the 3' and 4' time periods t3' and t4' of the vertical blank period VB, and may be generated as the first gate-off voltage Voff1 during the rest of the periods. The rest of the sensing clock signals CK1_SS, CK2_SS and CK4_SS may be generated as the first gate-off voltage Voff1 during the 1' to 6' time periods t1' to t6' of the vertical blank period VB.

The carry signal CRk−2 of the (k−2) stage ST(k−2), the carry signal CRk of the $k^{th}$ stage STk and the carry signal CRk+2 of the $(k+2)^{th}$ stage ST(k+2) may be generated as the first gate-off voltage Voff1 during the vertical blank period VB.

The sensing control signal SEN_ON may be generated as the gate-on voltage Von during the 6' time period t6' of the vertical blank period VB. The first control clock signal S_CLK1 may be generated as the gate-on voltage Von during the 2' to 4' periods t2' to t4' of the vertical blank period VB. The second control clock signal S_CLK2 may be generated as the gate-on voltage Von during the 1' to 5' periods t1' to t5' of the vertical blank period VB. The gate-on voltage Von period of the second control clock signal S_CLK2 may be longer than the gate-on voltage Von period of the first control clock signal S_CLK1.

FIGS. 18 to 24 are circuit diagrams for illustrating operations of the $k^{b}$ stage during first to seventh periods of the vertical blank period, according to an exemplary embodiment of the present inventive concept.

Hereinafter, the operations of the $k^{th}$ stage during the 1' to 7' time periods t1' to t7' of the vertical blank period will be described in detail with reference to FIGS. 18 to 24.

During the 1' to 7' time periods t1' to t7', the carry signal CR(k−2) of the $(k-2)^{th}$ stage ST(k−2) of the first gate-off voltage Voff1 may be applied to the start terminal CPI of the $k^{th}$ stage STk, and the carry signal CR(k+2) of the $(k+2)^{th}$ stage ST(k+2) of the first gate-off voltage Voff1 may be applied to the next carry input terminal CNI. In addition, during the 1' to 4' time periods t1' to t4', the third carry clock signal CK3_CR of the first gate-off voltage Voff1 may be applied to the first carry clock terminal CRI of the $k^{th}$ stage STk, and the first carry clock signal CK1_CR of the first gate-off voltage Voff1 may be applied to the second carry clock terminal CRI2.

Figure 18:
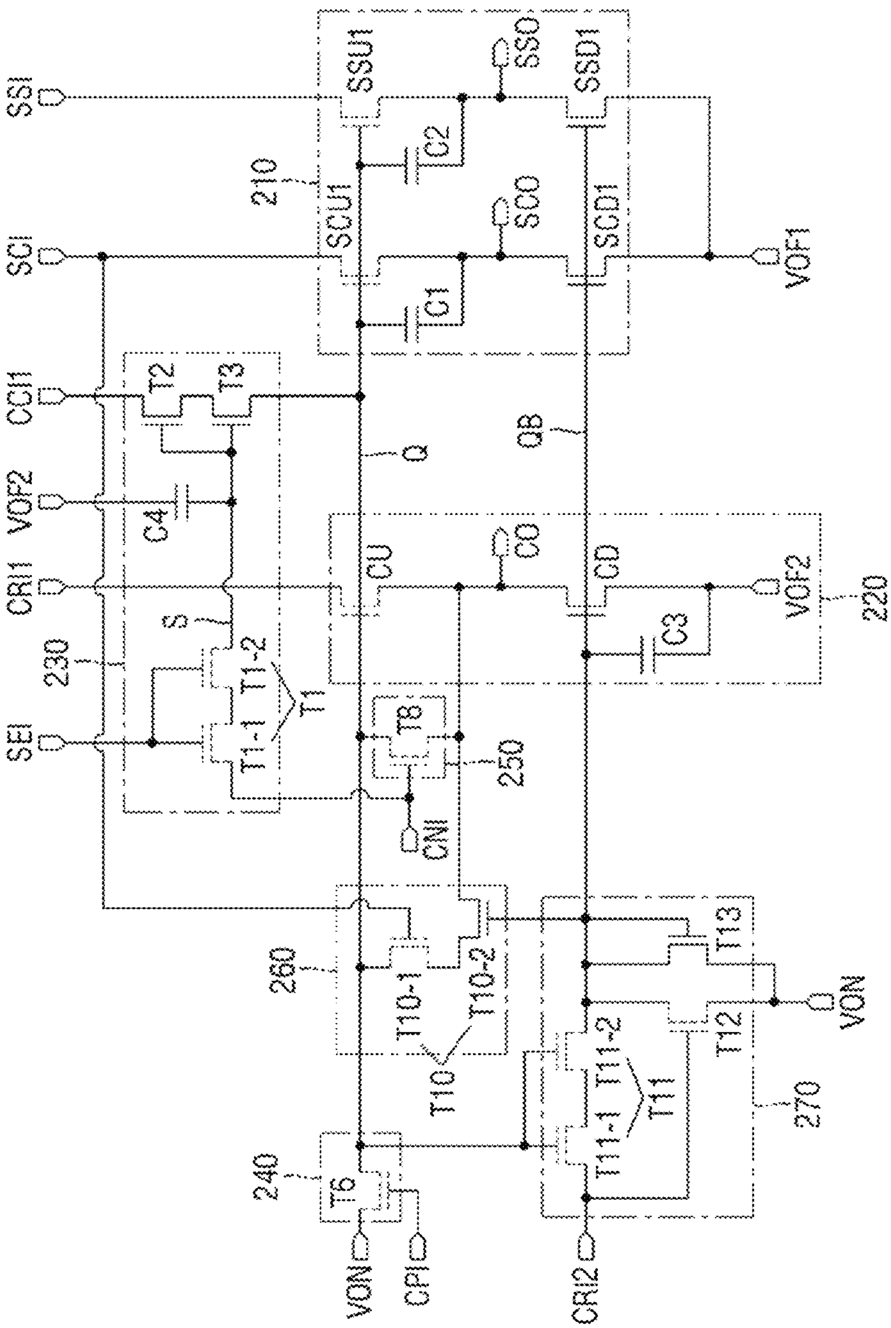
FIGS. 18, 19, 20, 21, 22, 23 and 24 are circuit diagrams for illustrating operations of the $k^{th}$ stage during 1' to 7' periods of the vertical blank period, according to an exemplary embodiment of the present inventive concept.

Firstly, as shown in FIG. 17, during the 1' time period t1', the third scan clock signal CK3_SC of the first gate-off voltage Voff1 may be applied to the scan clock terminal SCI of the $k^{th}$ stage STk, and the third sensing clock signal CK3_SS of the first gate-off voltage Voff1 may be applied to the sensing clock terminal SSI. In addition, as shown in FIG. 17, during the 1' time period t, a sensing control signal SEN_ON of the first gate-off voltage Voff1 may be applied to the sensing control terminal SEI of the $k^{th}$ stage STk, and a first control clock signal S_CLK1 of the first gate-off voltage Voff1 may be applied to the first control clock terminal CCI1. Therefore, as shown in FIG. 18, the second transistor T2, the third transistor T3, the $(10\text{-}2)^{th}$ transistor T10-2, the thirteenth transistor T13, the first scan pull-down transistor SCD1, the first sensing pull-down transistor SSD1, and the carry pull-down transistor CD may be turned on.

The (10-2) transistor T10-2 may be turned on by the gate-on voltage of the pull-down node QB to connect the carry output terminal CO with the first electrode of the $(10\text{-}1)^{th}$ transistor T10-1. Therefore, when the 10-1 transistor T10-1 is turned on, the pull-up node Q may be connected to the carry output terminal CO.

The thirteenth transistor T13 is turned on by the gate-on voltage Von of the pull-down node QB to connect the pull-down node QB with the gate-on terminal VON.

The first scan pull-down transistor SCD1 is turned on by the gate-on voltage Von of the pull-down node QB to output the first gate-off voltage input to the first gate-off terminal VOF1. This way, the scan signal SCk of the first gate-off voltage Voff1 may be applied to the $k^{th}$ scan signal line SCLk.

The first sensing pull-down transistor SSD1 is turned on by the gate-on voltage Von of the pull-down node QB to output the first gate-off voltage input to the first gate-off terminal VOF1 to the sensing output terminal SSO. This way, the $k^{th}$ sensing signal SSk of the first gate-off voltage Voff1 may be applied to the k sensing signal line SSLk.

The carry pull-down transistor CD is turned on by the gate-on voltage of the pull-down node QB to output the first gate-off voltage input to the first gate-off terminal VOF1 to the carry output terminal CO.

The second transistor T2 and the third transistor T3 are turned on by the gate-on voltage of the sensing control node S to apply a first control clock signal S_CLK1 input to a first control clock terminal CCI1 to the pull-up node Q. Accordingly, the first gate off voltage Voff1 of the first control clock signal S_CLK1 may be applied to the pull-up node Q.

Secondly, as shown in FIG. 17, during the 2' time period t2', the third scan clock signal CK3_SC of the first gate-off voltage Voff1 may be applied to the scan clock terminal SCI of the $k^{th}$ stage STk, and the third sensing clock signal CK3_SS of the first gate-off voltage Voff1 may be applied to the sensing clock terminal SSI. In addition, as shown in FIG. 17, during the 2' time period t2', a sensing control signal SEN_ON of the first gate-off voltage Voff1 may be applied to the sensing control terminal SEI of the $k^{th}$ stage ST, and a first control clock signal S_CLK1 of the gate-on voltage Von may be applied to the first control clock terminal CCI1.

Figure 19:
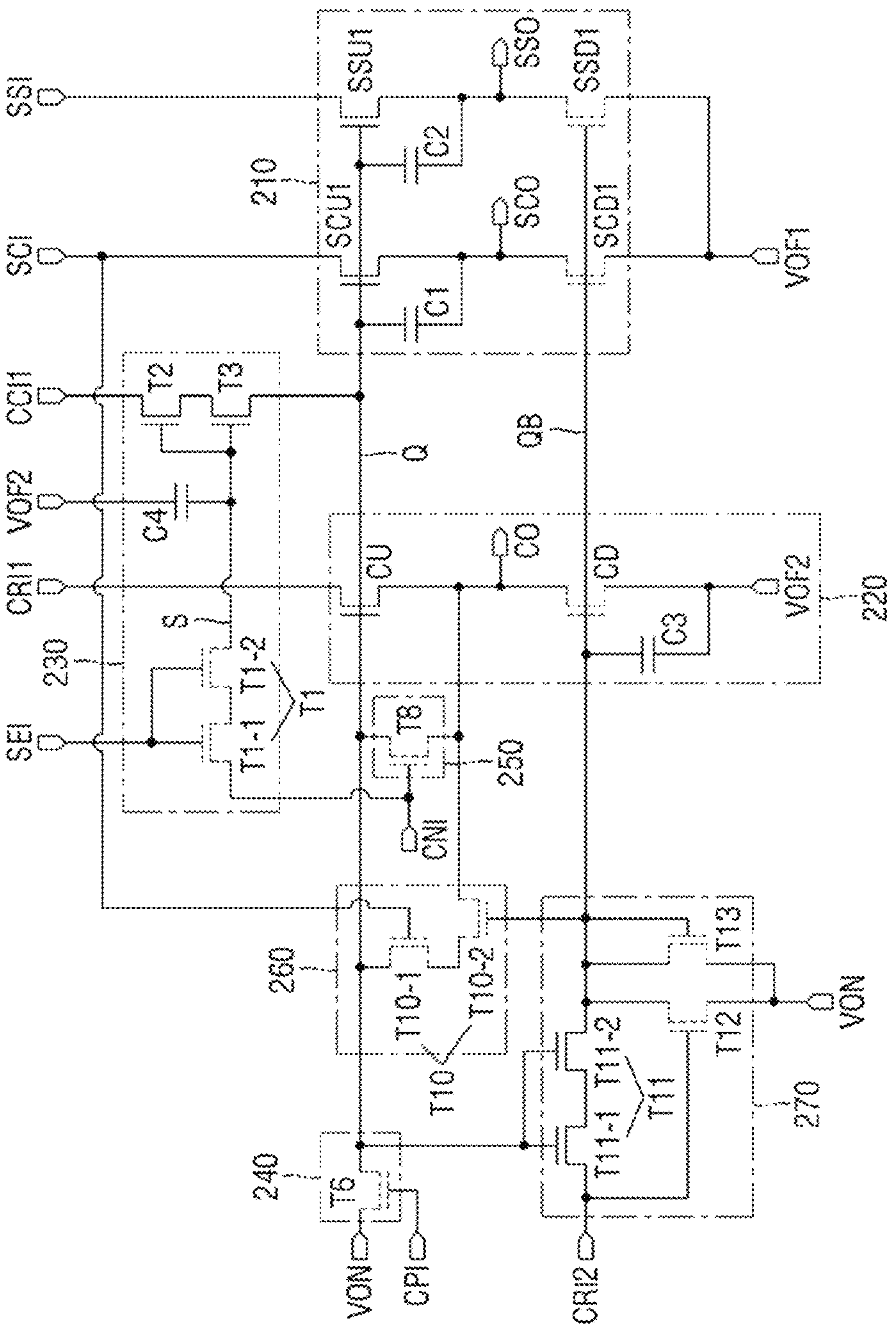

Therefore, as shown in FIG. 19, the second transistor 12, the third transistor T3, the eleventh transistor T11, the first scan pull-up transistor SCU1, the first sensing pull-up transistor SSU1, and the carry pull-up transistor CU may be turned on.

The second transistor T2 and the third transistor T3 are turned on by the gate-on voltage of the sensing control node S to apply a first control clock signal S_CLK1 input to a first control clock terminal CCI1 to the pull-up node Q. Accordingly, since the gate-on voltage Von of the first control clock signal S_CLK1 is applied to the pull-up node Q, the eleventh transistor T11, the first scan pull-up transistor SCU1, the first sensing pull-up transistor SSU1 and the carry pull-up transistor CU may be turned on.

The eleventh transistor T11 is turned on by the gate-on voltage Von of the pull-up node Q to apply the first gate-off voltage Voff1 of the first carry clock signal CK1_CR to the pull-down node QB. As a result, the first scan pull-down transistor SCD1, the first sensing pull-down transistor SSD1 and the carry pull-down transistor CD may be turned off.

The first scan pull-up transistor SCU1 is turned on by the gate-on voltage of the pull-up node Q to output a third scan clock signal CK3_SC of the first gate-off voltage Voff1 input to the scan clock terminal SCI to the scan output terminal SCO. This way, the scan signal SCk of the first gate-off voltage Voff1 may be applied to the $k^{th}$ scan signal line SCLk.

The first sensing pull-up transistor SSU1 is turned on by the gate-on voltage Von of the pull-up node Q to output the third sensing clock signal CK3_SC of the first gate-off voltage Voff1 input to the sensing clock terminal SSI to the sensing output terminal SSO. This way, the k sensing signal SSk of the first gate-off voltage Voff1 may be applied to the k sensing signal line SSLk.

The carry pull-up transistor CU is turned on by the gate-on voltage Von of the pull-up node Q to output the third carry clock signal CK3_CR of the first gate-off voltage Voff1 input to the first carry clock terminal CRI1 to the carry output terminal CO.

Figure 20:
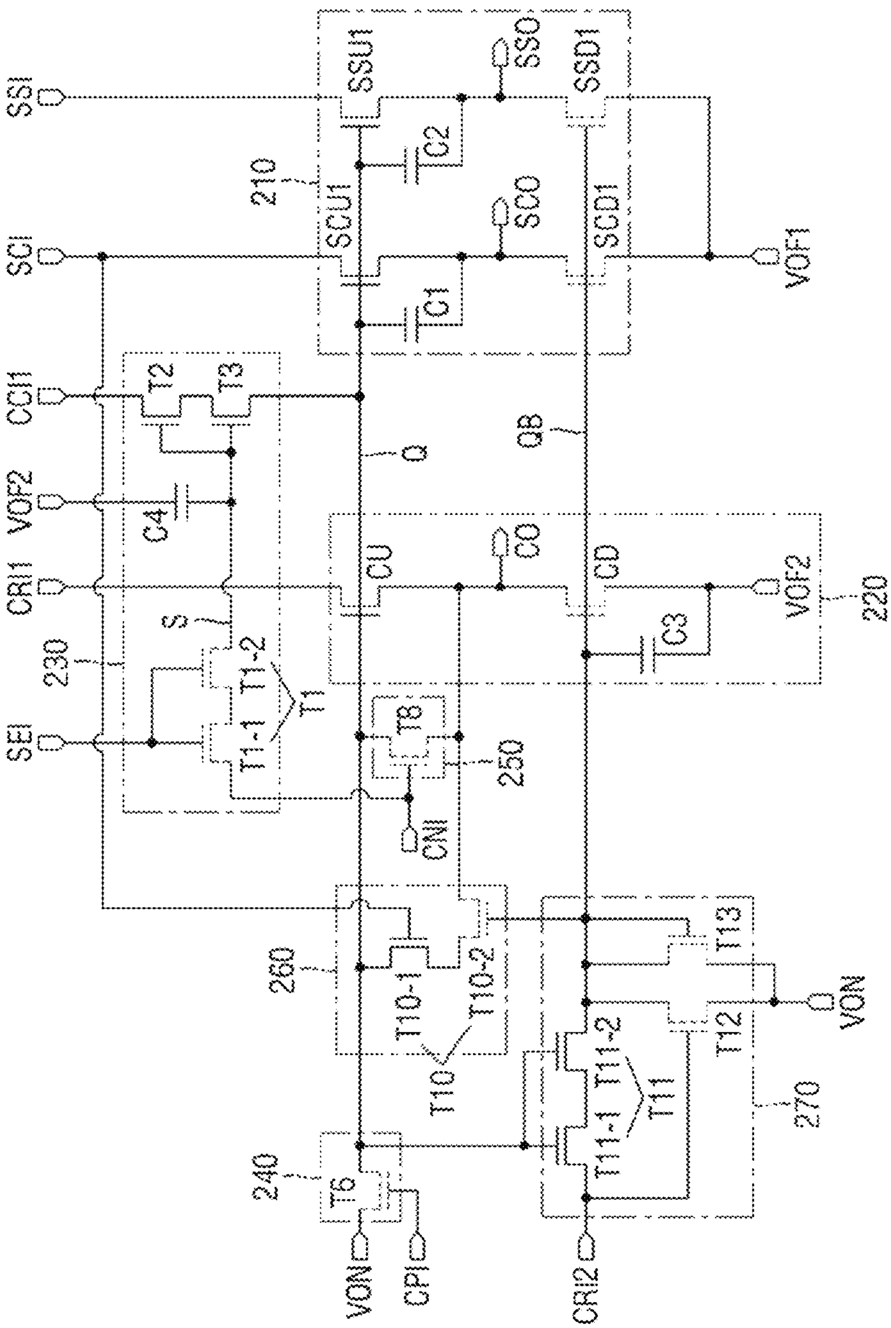

Thirdly, as shown in FIG. 17, during the 3' time period t3', the third scan clock signal CK3_SC of the gate-on voltage Von may be applied to the scan clock terminal SCI of the $k^{th}$ stage STk, and the third sensing clock signal CK3_SS of the gate-on voltage Von may be applied to the sensing clock terminal SSI. In addition, as shown in FIG. 17, during the 3' time period t3', a sensing control signal SEN_ON of the first gate-off voltage Voff1 may be applied to the sensing control terminal SEI of the $k^{th}$ stage STk, and a first control clock signal S_CLK1 of the gate-on voltage Von may be applied to the first control clock terminal CCI1. Therefore, as shown in FIG. 20, the second transistor T2, the third transistor T3, the $(10\text{-}1)^{th}$ transistor T10-1, the eleventh transistor T11, the first scan pull-up transistor SCU1, the first sensing pull-up transistor SSU1, and the carry pull-up transistor CU may be turned on.

The operations of the second transistor T2, the third transistor T3, the eleventh transistor T11 and the carry pull-up transistor CU during the 3' time period t3' may be substantially the same as those of the 2' time period t2' described above with reference to FIG. 19.

The $(10\text{-}1)^{th}$ transistor T10-1 is turned on by the gate-on voltage Von of the third scan clock signal to connect the pull-up node Q with the second electrode of the $(10\text{-}2)^{th}$ transistor T10-2.

The first scan pull-up transistor SCU1 is turned on by the gate-on voltage of the pull-up node Q to output the third scan clock signal CK3_SC of the gate-on voltage Von input to the scan clock terminal SCI to the scan output terminal SCO. This way, the scan signal SCk of the gate-on voltage Von may be applied to the $k^{th}$ scan signal line SCLk.

The first sensing pull-up transistor SSU1 is turned on by the gate-on voltage Von of the pull-up node Q to output the third sensing clock signal CK3_SC of the gate-on voltage Von input to the sensing clock terminal SSI to the scan output terminal SCO. This way, the $k^{th}$ sensing signal SSk of the gate-on voltage Von may be applied to the $k^{th}$ sensing signal line SSLk.

When the third scan clock signal CK3_SC of the gate-on voltage Von is applied to the scan output terminal SCO and the third sensing clock signal CK3_SS of the gate-on voltage Von is applied to the sensing output terminal SSO, the pull-up node Q is bootstrapped by the second capacitor C2 so that the voltage may rise from the gate-on voltage Von to a voltage Von' of a higher level than the gate-on voltage Von. This is illustrated by voltage VQ in FIG. 17.

Figure 21:
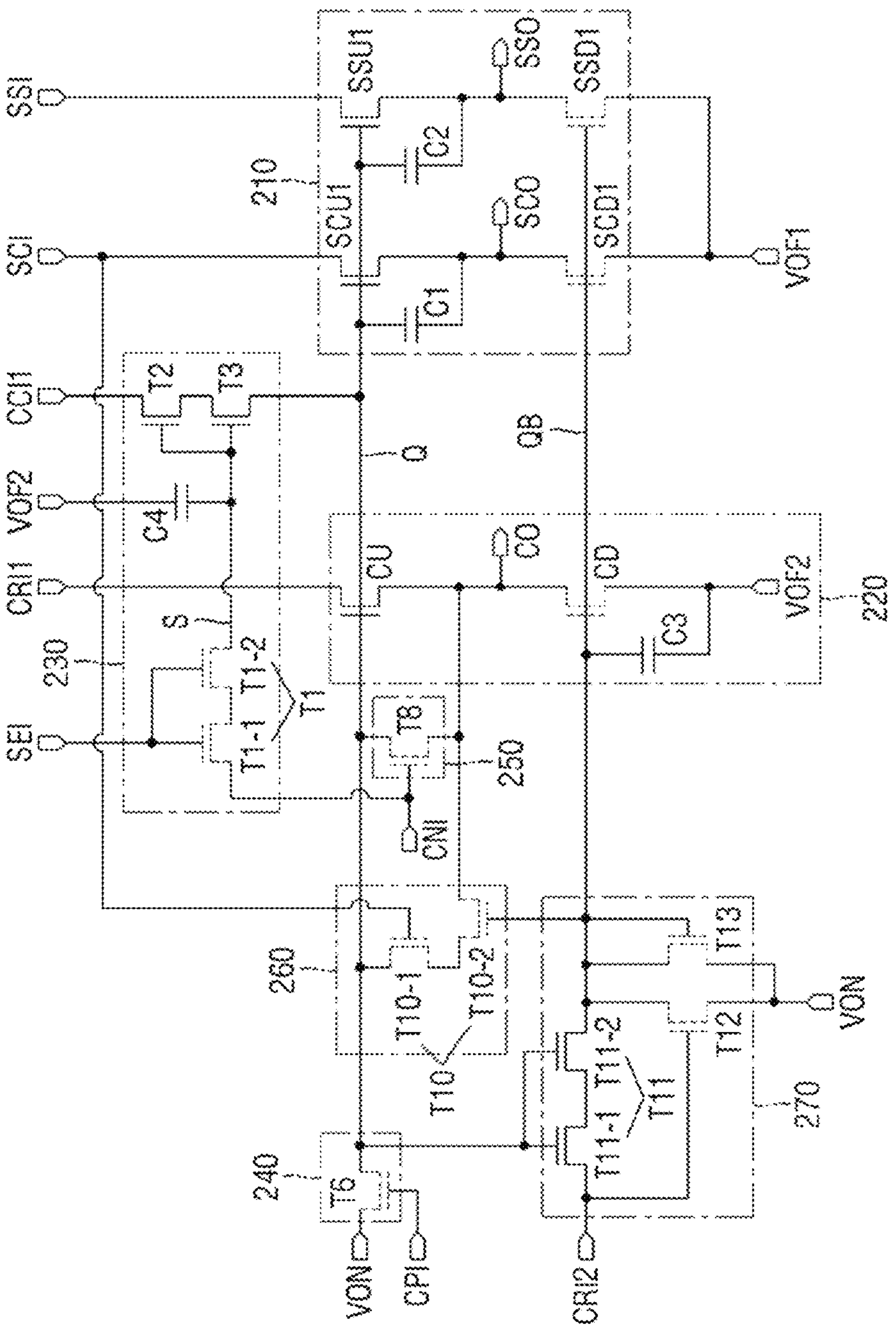

Fourthly, as shown in FIG. 17, during the 4' time period t4', the third scan clock signal CK3_SC of the first gate-off voltage Voff1 may be applied to the scan clock terminal SCI of the $k^{th}$ stage STk, and the third sensing clock signal CK3_SS of the gate-on voltage Von may be applied to the sensing clock terminal SSI. In addition, as shown in FIG. 17, during the 4' time period t4', a sensing control signal SEN_ON of the first gate-off voltage Voff1 may be applied to the sensing control terminal SEI of the $k^{th}$ stage STk, and a first control clock signal S_CLK1 of the gate-on voltage Von may be applied to the first control clock terminal CCI1. Therefore, as shown in FIG. 21, the second transistor T2, the third transistor T3, the eleventh transistor T11, the first scan pull-up transistor SCU1, the first sensing pull-up transistor SSU1, and the carry pull-up transistor CU may be turned on.

The operations of the second transistor T2, the third transistor T3, the eleventh transistor T11, the first sensing pull-up transistor SSU1 and the carry pull-up transistor CU during the fourth time period t4' may be substantially the same as those of the 3' time period t3' described above with reference to FIG. 20.

The first scan pull-up transistor SCU1 is turned on by the gate-on voltage of the pull-up node Q to output a third scan clock signal CK3_SC of the first gate-off voltage Voff1 input to the scan clock terminal SCI to the scan output terminal SCO. This way, the scan signal SCk of the first gate-off voltage Voff1 may be applied to the $k^{th}$ scan signal line SCLk.

When the third scan clock signal CK3_SC of the first gate-off voltage Voff1 is applied to the scan output terminal SCO, the pull-up node Q may be bootstrapped by the first capacitor C1 and the second capacitor C2 so that the voltage may decrease from the voltage Von' higher than the gate-on voltage Von to a voltage Von" having a level between the gate-on voltage Von and the voltage Von' higher than the gate-on voltage Von. This is illustrated by voltage VQ in FIG. 17.

Figure 22:
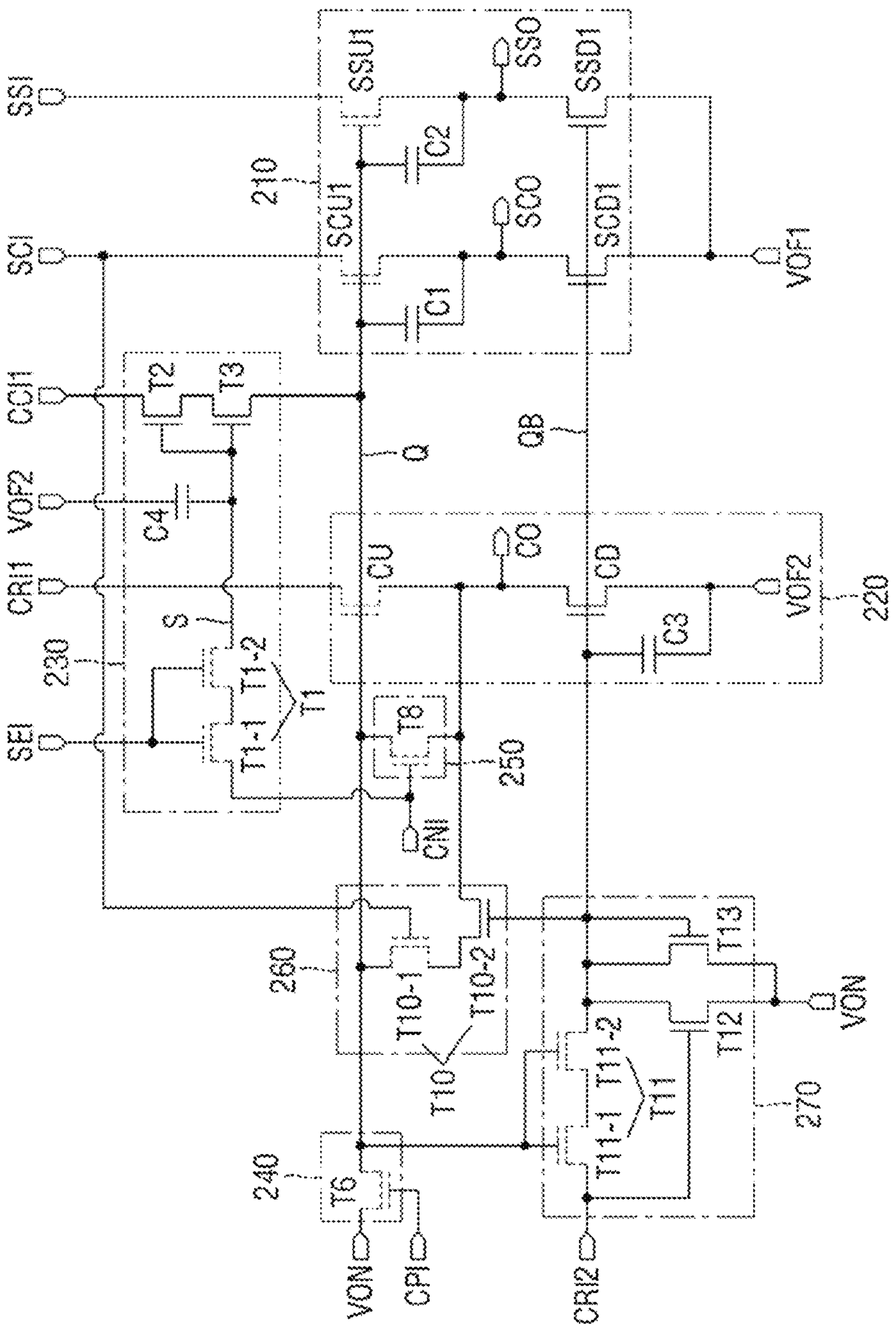

Fifthly, as shown in FIG. 17, during the 5' time period t5', the third scan clock signal CK3_SC of the gate-off voltage Voff1 may be applied to the scan clock terminal SCI of the $k^{th}$ stage STk, and the third sensing clock signal CK3_SS of the gate-off voltage Voff1 may be applied to the sensing clock terminal SSI. In addition, as shown in FIG. 17, during the 5' time period t5', a sensing control signal SEN_ON of the first gate-off voltage Voff1 may be applied to the sensing control terminal SEI of the $k^{th}$ stage STk, and a first control clock signal S_CLK1 of the first gate-off voltage Voff1 may be applied to the first control clock terminal CCI1. In addition, the first carry clock signal CK1_CR of the gate-on voltage Von may be applied to the second carry clock terminal CRI2 of the $k^{th}$ stage STk during the a part of the 5' time period t5'. Therefore, as shown in FIG. 22, the second transistor T2, the third transistor T3, the $(10\text{-}2)^{th}$ transistor T10-2, the eleventh transistor T11, the twelfth transistor T12, the thirteenth transistor T13, the first scan pull-down transistor SCD1, the first sensing pull-down transistor SSD1, and the carry pull-down transistor CD may be turned on.

During the 5' time period t5', the second transistor T2 and the third transistor T3 are turned on by the gate-on voltage of the sensing control node S to apply a first control clock signal S_CLK1 input to a first control clock terminal CCI1 to the pull-up node Q. Accordingly, since the first gate-off voltage Voff1 of the first control clock signal S_CLK1 is applied to the pull-up node Q, the eleventh transistor T11, the first scan pull-up transistor SCU1, the first sensing pull-up transistor SSU1 and the carry pull-up transistor CU may be turned off.

The twelfth transistor T12 is turned on by the first carry clock signal CK1_CR of the gate-on voltage Von input to the second carry clock terminal CRI2 to connect the pull-down node QB with the gate-on terminal VON. Accordingly, the pull-up node Q has the gate-on voltage Von, and accordingly the (10-2) transistor T10-2, the thirteenth transistor T13, the first scan pull-down transistor SCD1, the first sensing pull-down transistor SSD1 and the carry pull-down transistor CD may be turned on.

The $(10\text{-}2)^{th}$ transistor T10-2 may be turned on by the gate-on voltage of the pull-down node QB to connect the carry output terminal CO with the first electrode of the $(10\text{-}1)^{th}$ transistor T10-1. Therefore, when the 10-1 transistor T10-1 is turned on, the pull-up node Q may be connected to the carry output terminal CO.

The thirteenth transistor T13 is turned on by the gate-on voltage Von of the pull-down node QB to connect the pull-down node QB with the gate-on terminal VON.

The first scan pull-down transistor SCD1 is turned on by the gate-on voltage Von of the pull-down node QB to output the first gate-off voltage input to the first gate-off terminal VOF1. This way, the scan signal SCk of the first gate-off voltage Voff1 may be applied to the $k^{th}$ scan signal line SCLk.

The first sensing pull-up transistor SSU1 is turned on by the gate-on voltage Von of the pull-down node QB to output the first gate-off voltage input to the first gate-off terminal VOF1 to the sensing output terminal SSO. This way, the $k^{th}$ sensing signal SSk of the first gate-off voltage Voff1 may be applied to the $k^{th}$ sensing signal line SSLk.

The carry pull-down transistor CD is tamed on by the gate-on voltage of the pull-down node QB to output the first gate-off voltage input to the first gate-off terminal VOF1 to the carry output terminal CO.

Figure 23:
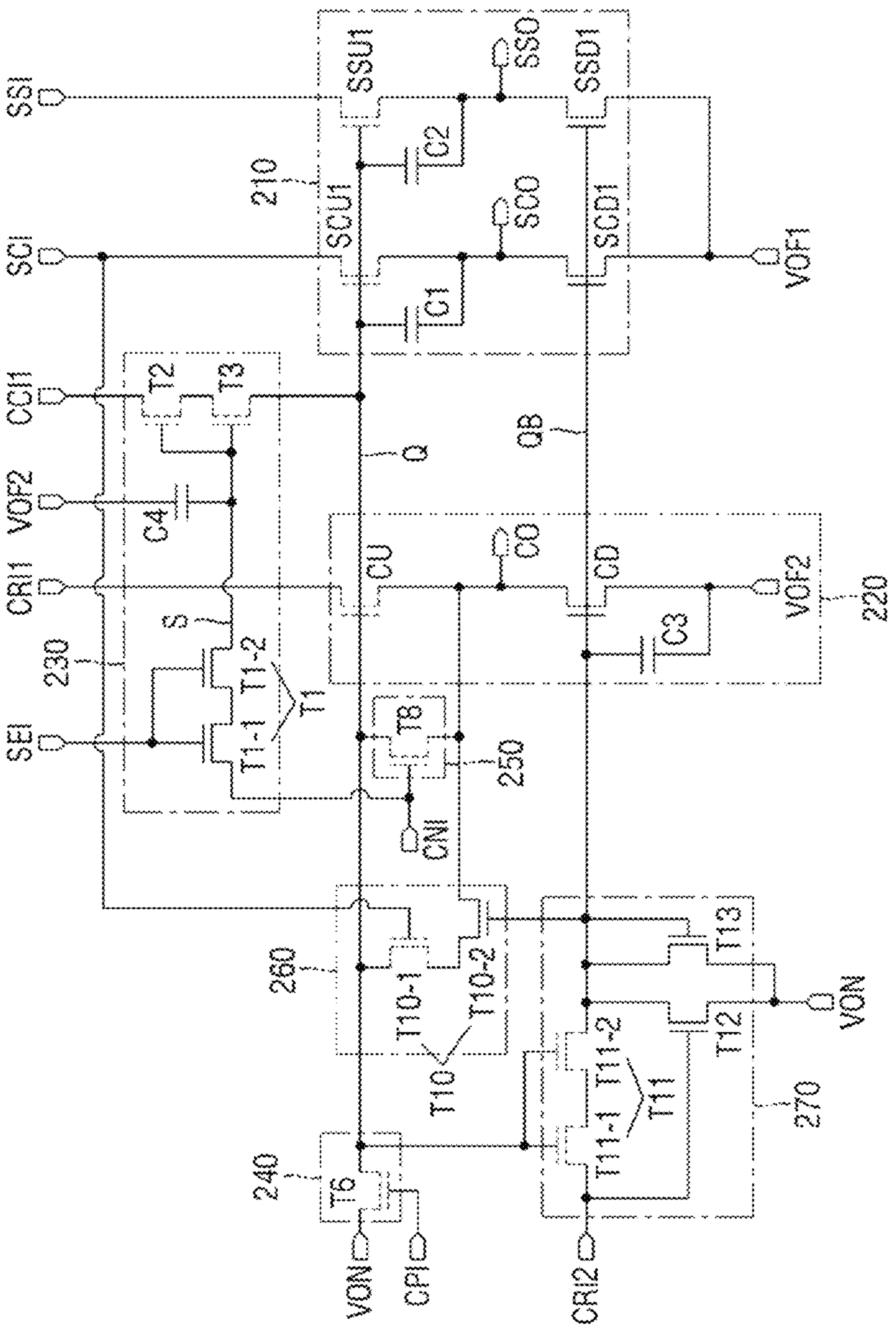

Sixthly, as shown in FIG. 17, during the 6' time period 6', the third scan clock signal CK3_SC of the gate-off voltage Voff1 may be applied to the scan clock terminal SCI of the $k^{th}$ stage STk, and the third sensing clock signal CK3_SS of the gate-off voltage Voff1 may be applied to the sensing clock terminal SSI. In addition, as shown in FIG. 17, during the 6' time period t6', a sensing control signal SEN_ON of the gate-on voltage Von may be applied to the sensing control terminal SEI of the $k^{th}$ stage STk, and a first control clock signal S_CLK1 of the first gate-off voltage Voff1 may be applied to the first control clock terminal CCI1. In addition, the first carry clock signal CK1_CR of the gate-on voltage Von may be applied to the second carry clock terminal CRI2 of the $k^{th}$ stage STk during the 6' time period t6'. Therefore, as shown in FIG. 23, the first transistor T1, the $(10\text{-}2)^{th}$ transistor T10-2, the eleventh transistor T11, the twelfth transistor T12, the thirteenth transistor T13, the first scan pull-down transistor SCD1, the first sensing pull-down transistor SSD1, and the carry pull-down transistor CD may be turned on.

The operations of the $(10\text{-}2)^{th}$ transistor T10-2, the eleventh transistor T11, the twelfth transistor T12, the thirteenth transistor T13, the first scan pull-down transistor SCD1, the first sensing pull-down transistor SSD1 and the carry pull-down transistor CD during the sixth time period t6' may be substantially the same as those of the 5' time period t5' described above with reference to FIG. 22.

The first transistor T1 is turned on by the gate-on voltage Von of the sensing control signal SEN_ON input to the sensing control terminal SEI to connect the next carry input terminal CNI with the sensing control node S. Accordingly, the sensing control node S has the first gate-off voltage Voff1 of the carry signal of the $(k+2)^{th}$ stage ST(k+2), such that the second transistor T2 and the third transistor T3 may be turned off.

Figure 24:
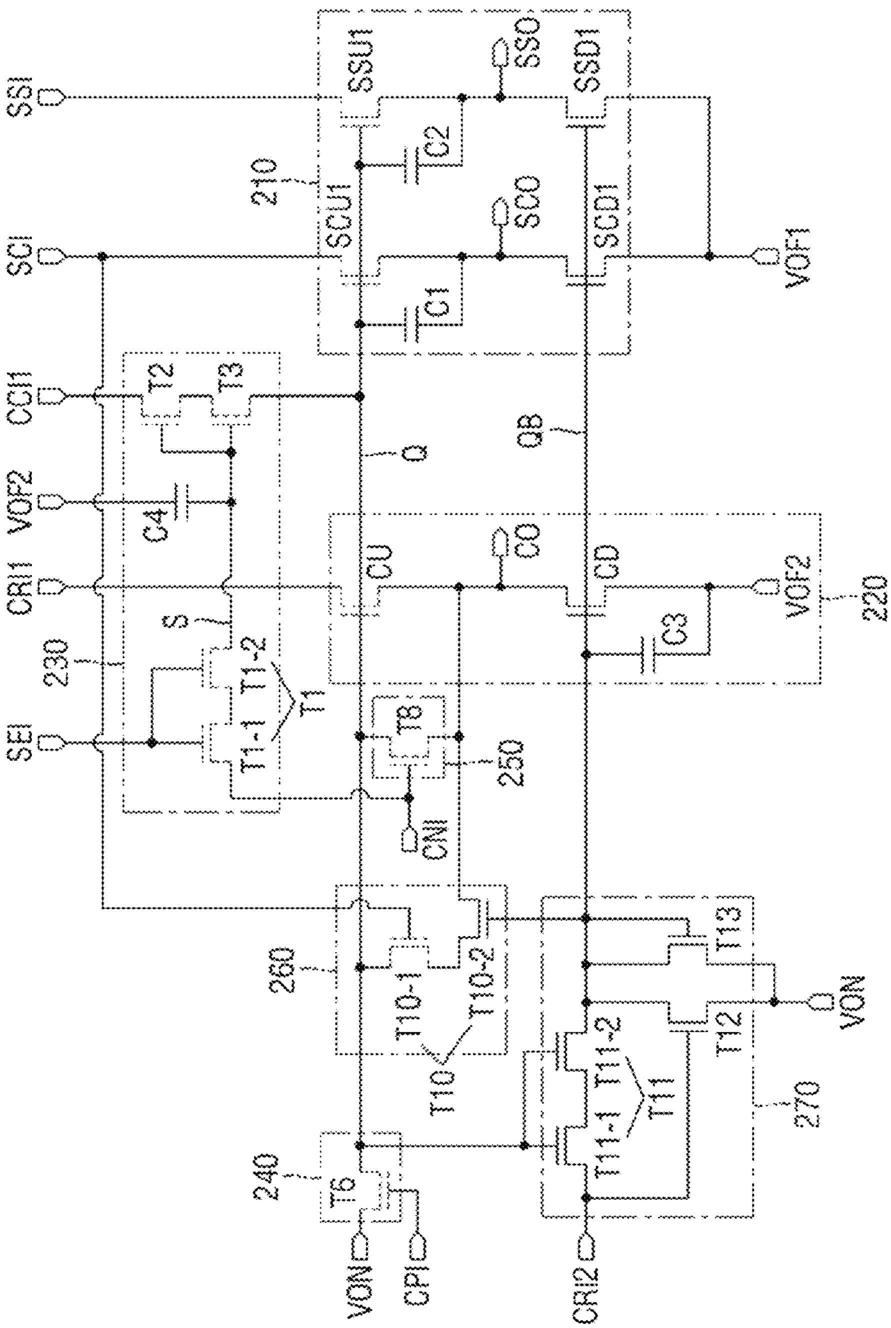

Seventhly, as shown in FIG. 17, during the 7 time period 7, the third scan clock signal CK3_SC of the gate-off voltage Voff1 may be applied to the scan clock terminal SCI of the kV stage STk, and the third sensing clock signal CK3_SS of the gate-off voltage Voff1 may be applied to the sensing clock terminal SSL In addition, as shown in FIG. 17, during the 7' time period t7', a sensing control signal SEN_ON of the first gate-off voltage Voff1 may be applied to the sensing control terminal SEI of the $k^{th}$ stage STk, and a first control clock signal S_CLK1 of the first gate-off voltage Voff1 may be applied to the first control clock terminal CCI1. In addition, the first carry clock signal CK1_CR of the first gate-off voltage Voff1 may be applied to the second carry clock terminal CRI2 of the $k^{th}$ stage STk during the 7' time period t7'. Therefore, as shown in FIG. 24, the $(10\text{-}2)^{th}$ transistor T10-2, the eleventh transistor T11, the twelfth transistor T12, the thirteenth transistor T13, the first scan pull-down transistor SCD1, the first sensing pull-down transistor SSD1, and the carry pull-down transistor CD may be turned on.

The operations of the $(10\text{-}2)^{th}$ transistor T10-2, the eleventh transistor T11, the twelfth transistor T12, the thirteenth transistor T13, the first scan pull-down transistor SCD1, the first sensing pull-down transistor SSD1 and the carry pull-down transistor CD during the seventh time period t7' may be substantially the same as those of the 5' time period t5' described above with reference to FIG. 22.

As shown in FIGS. 17 to 24, the $k^{th}$ stage STk may output the $k^{th}$ scan signal SCk of the gate-on voltage Von during the 3' time period t3' in the vertical blank period VB, and may output the k sensing signal SSk of the gate-on voltage Von during the 3' and 4' time periods t3' and t4' in the vertical blank period VB.

The area of the scan signal driver 200 according to the exemplary embodiment of the present inventive concept can be reduced since the $k^{th}$ stage STk can simultaneously output the k scan signal SCk and the k sensing signal SSk. In addition, to apply data voltages to the sub-pixels SP during the active period ACT, the $k^{th}$ stage STk may output the $k^{th}$ scan signal SCk and the $k^{th}$ sensing signal SSk as the gate-on voltage Von during the two horizontal periods 2H. In contrast, to sense the source voltage of the driving transistor DT of each of the sub-pixels SP during the vertical blank period VB, the $k^{th}$ stage STk may output the $k^{th}$ scan signal SCk as the gate-on voltage Von for four horizontal periods 4H and may output the $k^{th}$ sensing signal SSk as the gate-on voltage Von for eight horizontal periods 8H.

Figure 25:
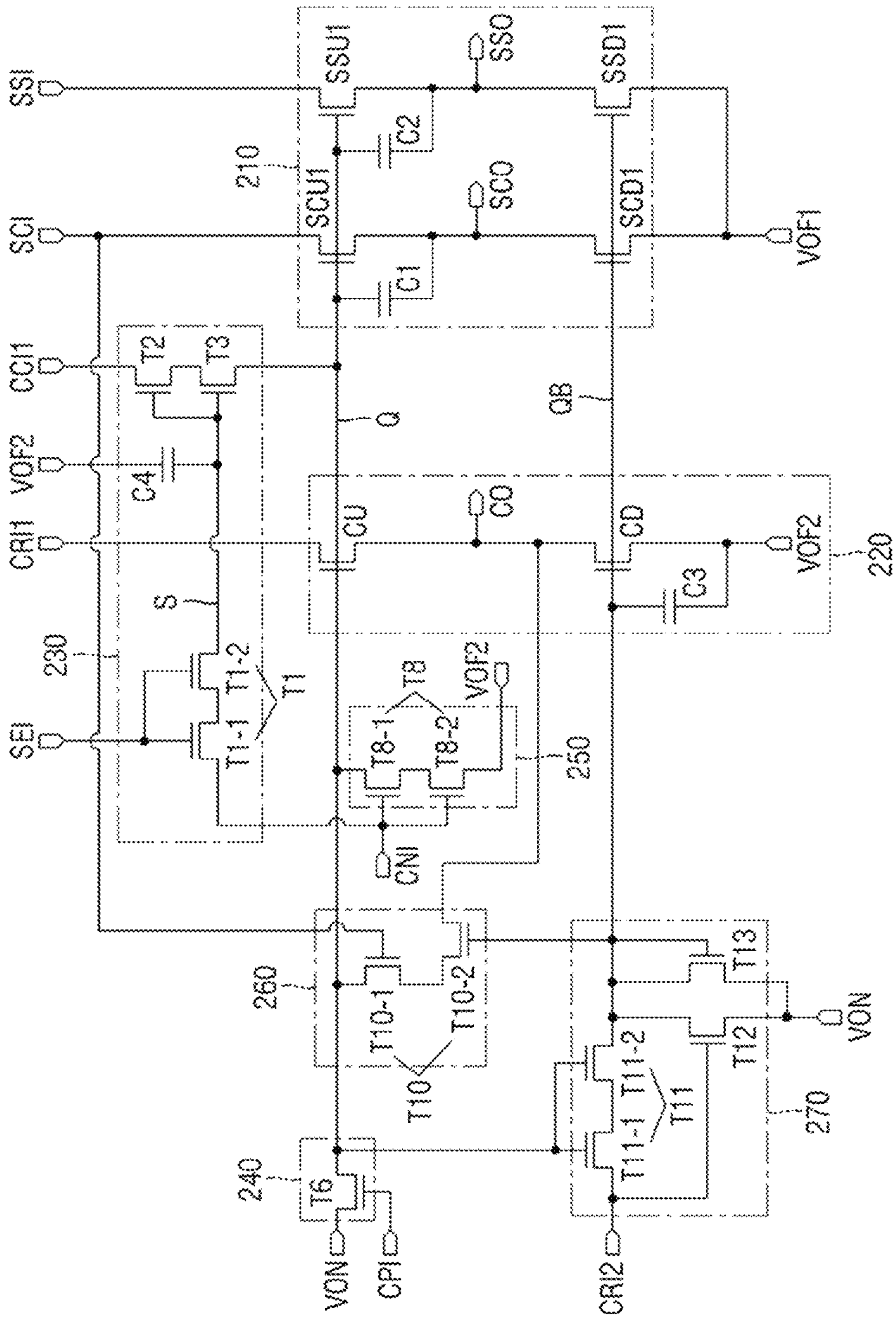
FIG. 25 is a circuit diagram showing the $k^{th}$ stage of a scan signal driver according to an exemplary embodiment of the present inventive concept.

FIG. 25 is a circuit diagram showing the $k^{th}$ stage of a scan signal driver according to an exemplary embodiment of the present inventive concept.

The exemplary embodiment shown in FIG. 25 is different from the exemplary embodiment of FIG. 8 in that a second pull-up node controller 250 includes a $(8\text{-}1)^{th}$ transistor T8-1 and a $(8\text{-}2)^{th}$ transistor T8-2.

Referring to FIG. 25, the second pull-up node controller 250 applies the second gate-off voltage to the pull-up node Q when the carry signal CRk+2 of the $(k+2)^{th}$ stage ST(k+2) input to the next carry input terminal CNI has the gate-on voltage. The second pull-up node controller 250 may include an eighth transistor T8, and the eighth transistor T8 may include a $(8\text{-}1)^{th}$ transistor T8-1 and a $(8\text{-}2)^{th}$ transistor T8-2.

The $(8\text{-}1)^{th}$ transistor T8-1 and the (8-2) transistor T8-2 are turned on by the gate-on voltage of the carry signal CRk+2 of the $(k+2)^{th}$ stage ST(k+2) to connect the pull-up node Q with the carry output terminal CO, such that the second gate-off voltage can be applied to the pull-up node Q. The gate electrode of the $(8\text{-}1)^{th}$ transistor T8-1 may be connected to the next carry input terminal CNI, the first electrode of the $(8\text{-}1)^{th}$ transistor T8-1 may be connected to the second electrode of the $(8\text{-}2)^{th}$ transistor T8-2, and the second electrode of the $(8\text{-}1)^{th}$ transistor T8-1 may be connected to the pull-up node Q. The gate electrode of the $(8\text{-}2)^{th}$ transistor T8-2 may be connected to the next carry input terminal CNI, the first electrode of the (8-2) transistor T8-2 may be connected to the second gate-off terminal VOF2 to which the second gate-off voltage Voff2 is applied, and the second electrode of the $(8\text{-}2)^{th}$ transistor T8-2 may be connected to the first electrode of the $(8\text{-}1)^{th}$ transistor T8-1.

As shown in FIG. 25, when the carry signal CRk+2 of the $(k+2)^{th}$ stage ST(k+2) input to the next carry input terminal CNI has the gate-on voltage, the second pull-up node controller 250 may connect the pull-up node Q with the second gate-off terminal VOF2 to which the second gate-off voltage Voff2 is applied, instead of the carry output terminal CO, so that the second gate-off voltage Voff2 may be applied to the pull-up node Q.

Additionally, since the voltage of the pull-up node Q may have the second gate-off voltage Voff2 by the tenth transistor T10, the second gate-off terminal VOF2 connected to the first electrode of the $(8\text{-}2)^{th}$ transistor T8-2 may be replaced with the first gate-off terminal VOF1 to which the first gate-off voltage Voff1 is applied in the example shown in FIG. 25.

Figure 26:
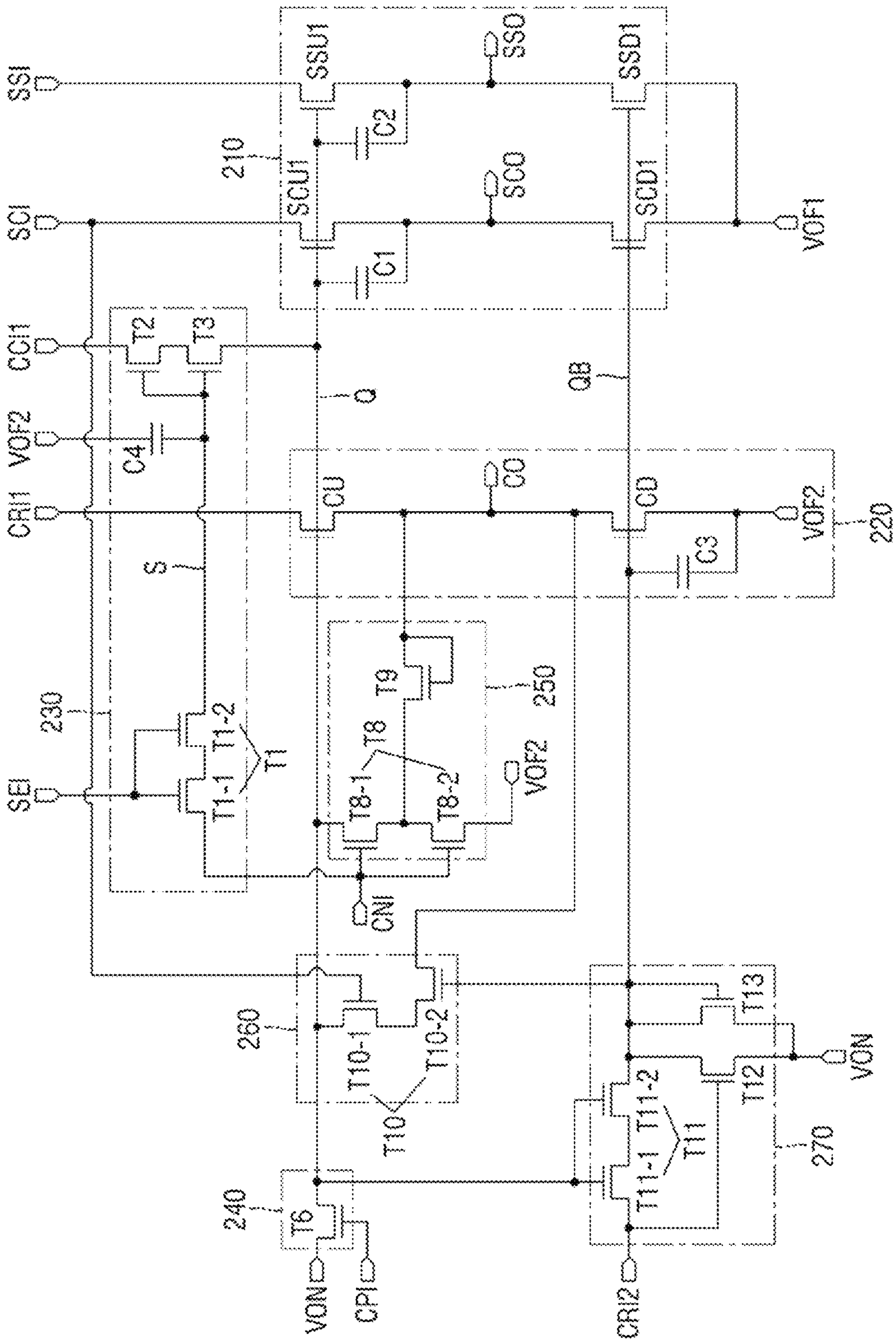
FIG. 26 is a circuit diagram showing the $k^{th}$ stage of a scan signal driver according to an exemplary embodiment of the present inventive concept.

FIG. 26 is a circuit diagram showing the $k^{th}$ stage of a scan signal driver according to an exemplary embodiment of the present inventive concept.

The exemplary embodiment shown in FIG. 26 is different from the exemplary embodiment of FIG. 25 in that a second pull-up node controller 250 further includes a ninth transistor 9.

Referring to FIG. 26, the ninth transistor T9 is turned on by the gate-on voltage of the carry output terminal CO to connect the carry output terminal CO between the $(8\text{-}1)^{th}$ transistor T8-1 and the $(8\text{-}2)^{th}$ transistor T8-2. The first electrode of the $(8\text{-}1)^{th}$ transistor T8-1, the second electrode of the $(8\text{-}2)^{th}$ transistor T8-2, and the carry output terminal CO may be connected with each other while the ninth transistor T9 is turned on. This way, it is possible to prevent a leakage current from flowing through the $(8\text{-}1)^{th}$ transistor T8-1 and the $(8\text{-}2)^{th}$ transistor T8-2 while the pull-up node Q has the gate-on voltage Von.

Figure 27:
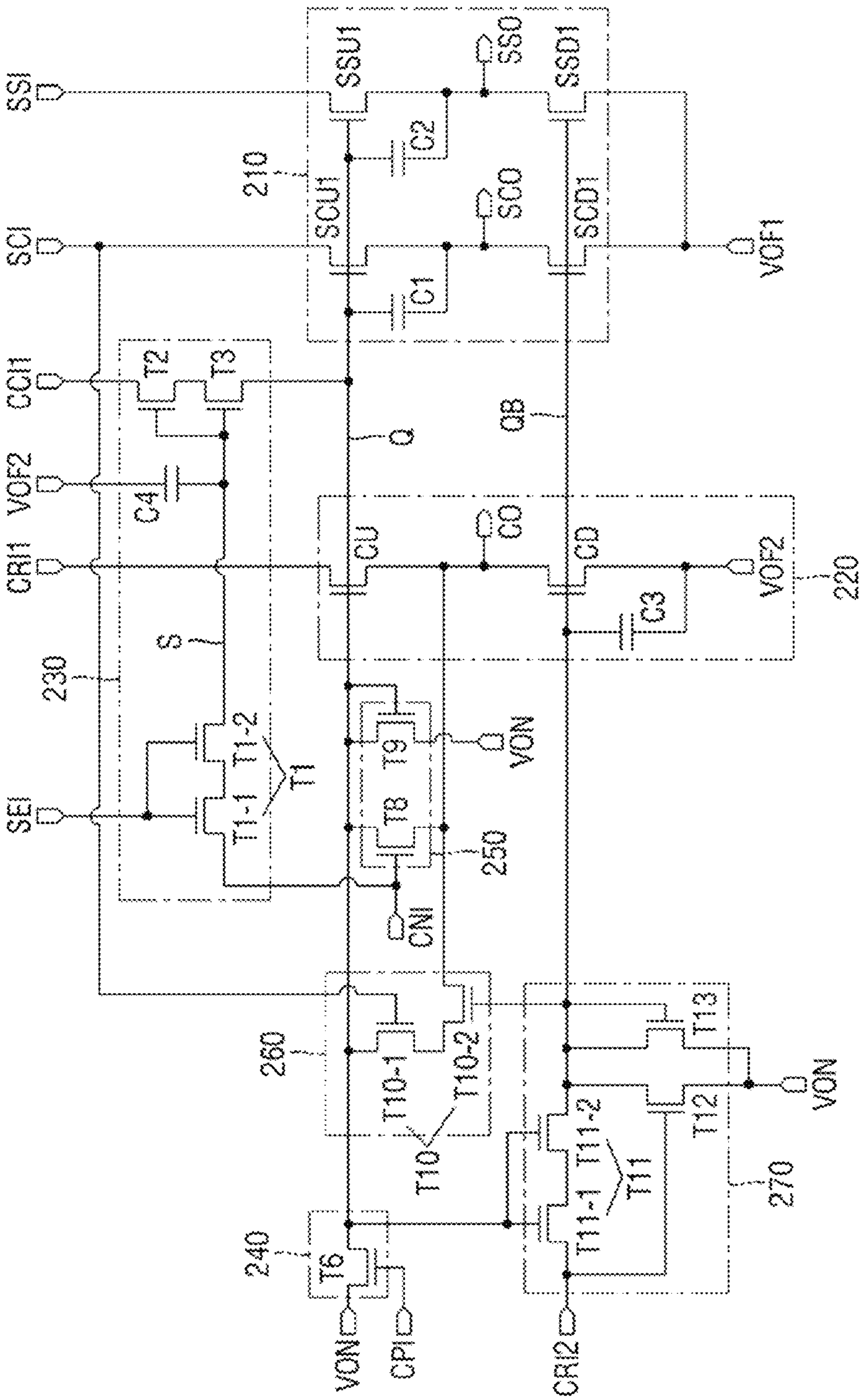
FIG. 27 is a circuit diagram showing the $k^{th}$ stage of a scan signal driver according to an exemplary embodiment of the present inventive concept.

FIG. 27 is a circuit diagram showing the $k^{th}$ stage of a scan signal driver according to an exemplary embodiment of the present inventive concept.

The exemplary embodiment shown in FIG. 27 is different from the exemplary embodiment of FIG. 8 in that a second pull-up node controller 250 further includes a ninth transistor 9.

Referring to FIG. 27, the ninth transistor T9 is turned on by the gate-on voltage of the pull-up node Q, to connect the pull-up node Q with the gate-on terminal VON to which the gate-on voltage Von is applied. The gate electrode and the first electrode of the ninth transistor T9 may be connected to the pull-up node Q, and the second electrode may be connected to the gate-on terminal VON. This way, it is possible to stably hold the potential of the pull-up node Q at the gate-on voltage Von while the pull-up node Q has the gate-on voltage Von.

Figure 28:
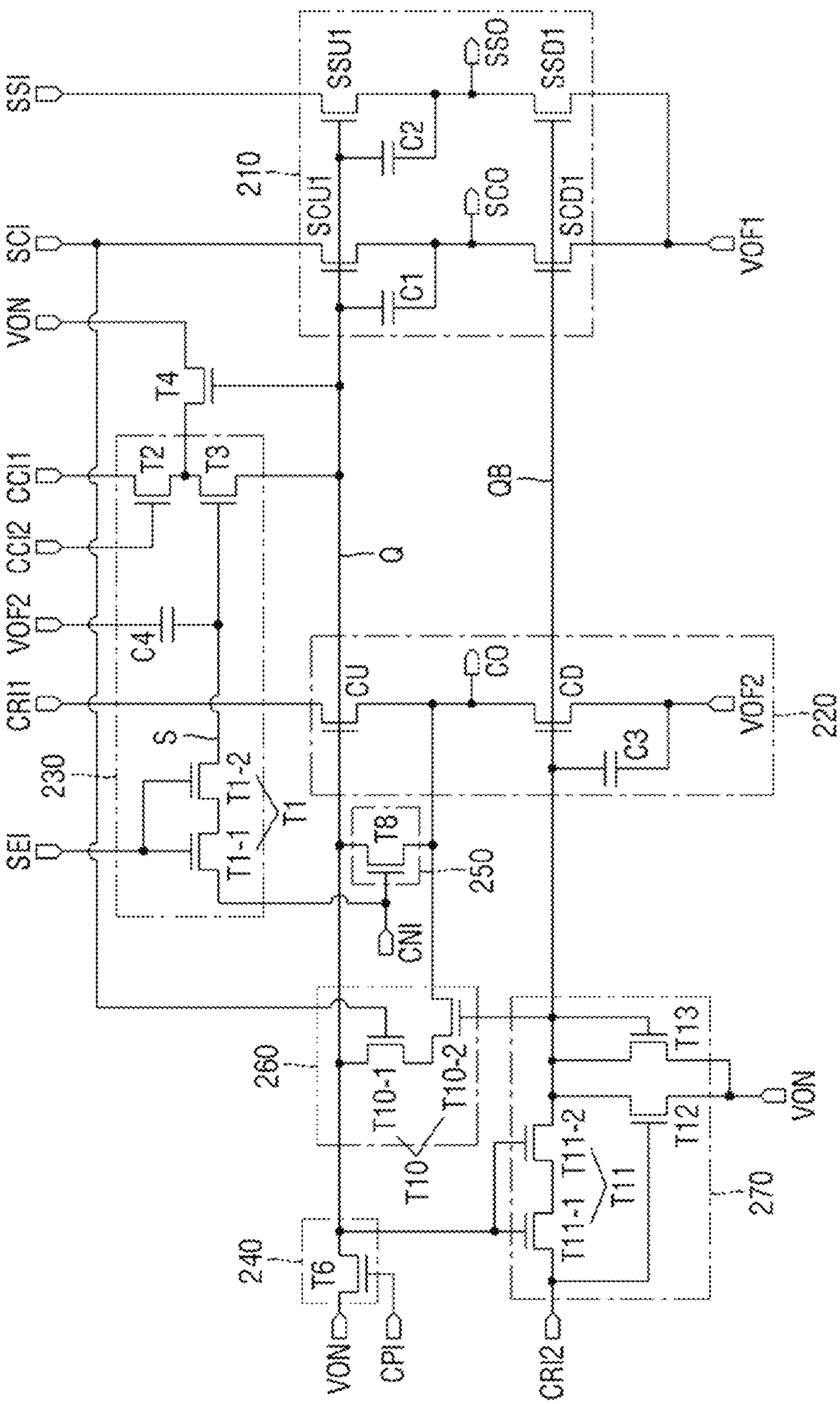
FIG. 28 is a circuit diagram showing the $k^{th}$ stage of a scan signal driver according to an exemplary embodiment of the present inventive concept.

FIG. 28 is a circuit diagram showing the $k^{th}$ stage of a scan signal driver according to an exemplary embodiment of the present inventive concept.

The exemplary embodiment shown in FIG. 28 is different from the exemplary embodiment of FIG. 8 in that a sensing controller 230 further includes a fourth transistor T4.

Referring to FIG. 28, the second transistor T2 is turned on by the gate-on voltage of the second control clock signal S_CLK2 input to the second control clock terminal CCI2, to connect the first control clock terminal CCI1 with the second electrode of the third transistor T3. The gate electrode of the second transistor T2 may be connected to the second control clock terminal CCI2, the first electrode of the second transistor T2 may be connected to the second electrode of the third transistor T3, and the second electrode of the second transistor T2 may be connected to the first control clock terminal CCI1.

The third transistor T3 is turned on by the gate-on voltage Von of the sensing control node S to connect the pull-up node Q with the first electrode of the second transistor T2. The gate electrode of the third transistor T3 may be connected to the sensing control node S, the first electrode of the third transistor T3 may be connected to the pull-up node Q, and the second electrode of the third transistor T3 may be connected to the first electrode of the second transistor T2.

The fourth transistor T4 is turned on by the gate-on voltage of the pull-up node Q to connect the gate-on terminal VON to which the gate-on voltage Von is applied between the second transistor T2 and the third transistor T3. While the fourth transistor T4 is turned on, the first electrode of the second transistor T2, the second electrode of the third transistor T3 and the gate-on terminal VON may be connected with each other. Accordingly, the gate-on voltage Von may be applied between the second transistor T2 and the third transistor T3. Therefore, it is possible to reduce the stress applied to the second transistor T2 and the third transistor T3 due to the high drain-source voltage.

Figure 29:
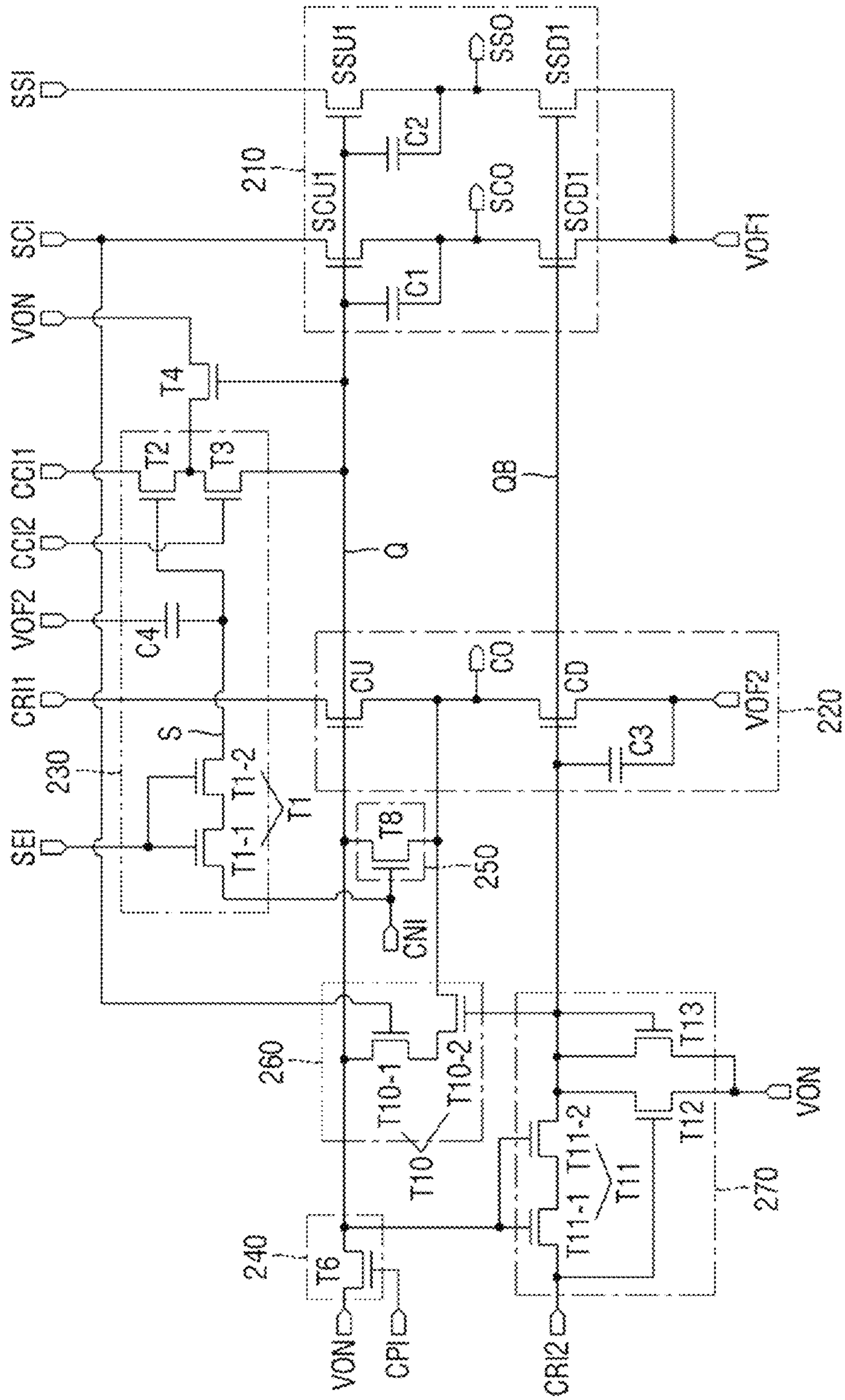
FIG. 29 is a circuit diagram showing the $k^{th}$ stage of a scan signal driver according to an exemplary embodiment of the present inventive concept.

FIG. 29 is a circuit diagram showing the $k^{th}$ stage of a scan signal driver according to an exemplary embodiment of the present inventive concept.

The exemplary embodiment shown in FIG. 29 is different from the exemplary embodiment of FIG. 28 in that a second transistor T2 is controlled by a sensing control node S, and a third transistor T3 is controlled by a second control clock signal S_CLK2 of a second control clock terminal CCI2.

Referring to FIG. 29, the second transistor T2 is turned on by the gate-on voltage Von of the sensing control node S to connect the first control clock terminal CCI with the second electrode of the third transistor 13. The gate electrode of the second transistor T2 may be connected to the sensing control node S, the first electrode of the second transistor T2 may be connected to the second electrode of the third transistor T3, and the second electrode of the second transistor T2 may be connected to the first control clock terminal CCI1.

The third transistor T3 is turned on by the gate-on voltage of the second control clock signal S_CLK2 input to the second control clock terminal CCI2, to connect the pull-up node Q with the first electrode of the second transistor T2. The gate electrode of the third transistor T3 may be connected to the sensing control node S, the first electrode of the third transistor T3 may be connected to the pull-up node Q, and the second electrode of the third transistor T3 may be connected to the first electrode of the second transistor T2.

As shown in FIGS. 9A and 17, the second control clock signal S_CLK2 input to a second control clock terminal CCI2 swings between the third gate-off voltage Voff3 and the gate-on voltage Von, whereas the first control clock signal S_CLK1 input to the first control clock terminal CCI1 swings between the second gate-off voltage Voff2 and the gate-on voltage Von. In addition, the sensing control node S swings between the first gate-off voltage Voff1 and the gate-on voltage Von. The third gate-off voltage Voff3 may have a level lower than that of the second gate-off voltage Voff2, the second gate-off voltage Voff2 may have a level lower than that of the first gate-off voltage Voff1, and the first gate-off voltage Voff1 may have a level lower than that of the gate-on voltage Von. In this case, even when the gate-on voltage Von is applied between the second transistor T2 and the third transistor T3 as the fourth transistor T4 is turned on, the third gate-off voltage Voff3 having the lowest potential is applied to the gate electrode of the third transistor T3, and thus, it is possible to prevent leakage of the gate high voltage VGH to the pull-up node Q through the third transistor T3.

Figure 30:
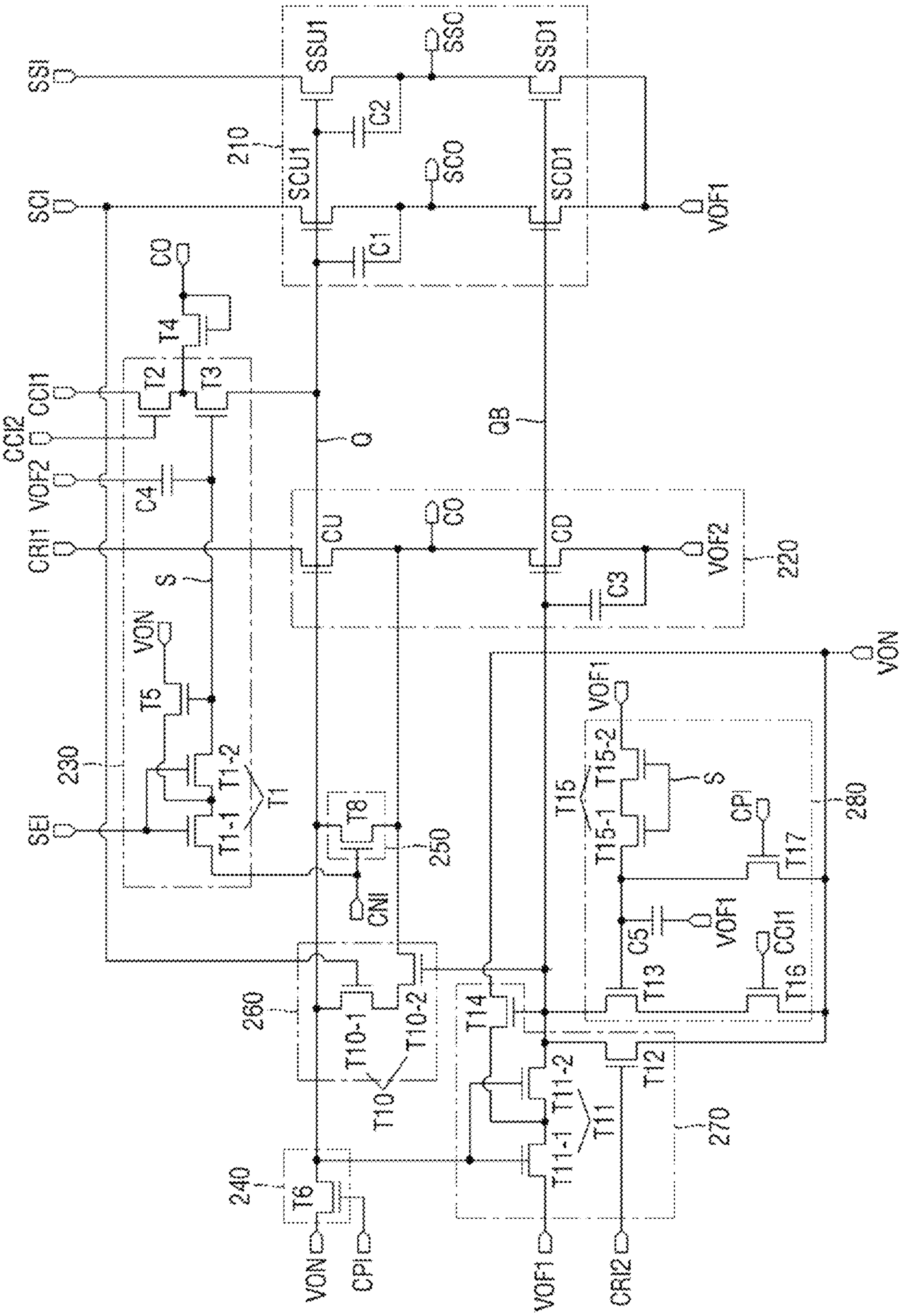
FIG. 30 is a circuit diagram showing the $k^{th}$ stage of a scan signal driver according to an exemplary embodiment of the present inventive concept.

FIG. 30 is a circuit diagram showing the $k^{th}$ stage of a scan signal driver according to an exemplary embodiment of the present inventive concept.

The exemplary embodiment shown in FIG. 30 is different from the exemplary embodiment of FIG. 28 in that a sensing controller 230 further includes a fifth transistor T5, an inverter 270 further includes a fourteenth transistor T14, and the $k^{th}$ stage STk further includes a pull-down node controller 280 having the fifteenth to seventeenth transistors T15, T16 and T17.

Referring to FIG. 30, the gate electrode of a fourth transistor T4 may be connected to a carry output terminal CO instead of a pull-up node Q, and the second electrode of the fourth transistor T4 may be connected to the carry output terminal CO instead of a gate-on terminal VON.

The fifth transistor T5 is turned on by the gate-on voltage Von of the sensing control node S to connect the gate-on terminal VON to which the gate-on voltage Von is applied between a $(1\text{-}1)^{th}$ transistor T1-1 and a $(1\text{-}2)^{th}$ transistor T1-2. By virtue of the fifth transistor T5, it is possible to prevent or reduce the gate-on voltage of the sensing control node S from leaking through the $(1\text{-}1)^{th}$ transistor T1- and the $(1\text{-}2)^{th}$ transistor T1-2. The gate electrode of the fifth transistor T5 may be connected to the sensing control node S, the first electrode of the fifth transistor T5 may be connected between the $(1\text{-}1)^{th}$ transistor T1-1 and the $(1\text{-}2)^{th}$ s transistor T1-2, and the second electrode of the fifth transistor T5 may be connected to the gate-on terminal VON.

The second electrode of a $(11\text{-}1)^{th}$ transistor T11-1 may be connected to a first gate-off terminal VOF1 to which a first gate-off voltage Voff1 is applied, instead of a second carry clock terminal CPI2.

The fourteenth transistor T14 is turned on by the gate-on voltage Von of the pull-down node QB to connect the gate-on terminal VON to which the gate-on voltage Von is applied between a $(11\text{-}1)^{th}$ transistor T11-1 and a $(11\text{-}2)^{th}$ transistor T11-2. By virtue of the fourteenth transistor T14, it is possible to prevent the threshold voltages of the $(11\text{-}1)^{th}$ transistor T11-1 and the $(11\text{-}2)^{th}$ transistor T1-2 from being negatively shifted, and thus, it is possible to prevent or reduce the gate-on voltage of the pull-down node QB from leaking through the $(11\text{-}1)^{th}$ transistor T11-1 and the $(11\text{-}2)^{th}$ transistor T11-2. The gate electrode of the fourteenth transistor T14 may be connected to the pull-down node QB, the first electrode of the fourteenth transistor T14 may be connected between the $(11\text{-}1)^{th}$ transistor T11-1 and the $(11\text{-}2)^{th}$ transistor T11-2, and the second electrode of the fourteenth transistor T14 may be connected to the gate-on terminal VON.

The pull-down node controller 280 does not apply the gate-on voltage Von to the pull-down node QB when the sensing control node S has the gate-on voltage Von. When the sensing control node S has the second gate-off voltage Voff2, the pull-down node controller 280 applies the gate-on voltage Von to the pull-down node QB. The pull-down node controller 280 may include thirteenth and fifteenth to seventeenth transistors T13, T15, T16 and T17 and a fifth capacitor C5.

The thirteenth transistor T13 is substantially identical to the thirteenth transistor T13 of FIG. 8 except that its second electrode is connected to the first electrode of the sixteenth transistor T16, instead of the gate-on terminal VON.

The fifteenth transistor T15 may include a $(15\text{-}1)^{th}$ transistor T15-1 and a $(15\text{-}2)^{th}$ transistor T15-2. The $(15\text{-}1)^{th}$ transistor T15-1 and the $(15\text{-}2)^{6}$ transistor T15-2 are turned on by the gate-on voltage Von of the sensing control node S, to connect the gate electrode of the thirteenth transistor T13 with the first gate-off terminal VOF1 to which the first gate-off voltage Voff1 is applied. The gate electrode of the $(15\text{-}1)^{th}$ transistor T15-1 may be connected to the sensing control node S, the first electrode of the $(15\text{-}1)^{th}$ transistor T15-1 may be connected to the second electrode of the (15-2) transistor T15-2, and the second electrode of the $(15\text{-}1)^{th}$ transistor T15-1 may be connected to the gate electrode of the thirteenth transistor T13. The gate electrode of the $(15\text{-}2)^{th}$ transistor T15-2 may be connected to the sensing control node S, the first electrode of the (15-2) transistor T15-2 may be connected to the first gate-off terminal VOF1, and the second electrode of the $(15\text{-}2)^{th}$ transistor T15-2 may be connected to the first electrode of the $(15\text{-}1)^{th}$ transistor T15-1. The first electrode of the $(15\text{-}2)^{th}$ transistor T15-2 may be connected to a second gate-off terminal VOF2 to which a second gate-off voltage Voff2 is applied, instead of the first gate-off terminal VOF1.

The sixteenth transistor T16 is turned on by the gate-on voltage Von of the first control clock signal S_CLK1 input to the first control clock terminal CCI1, to connect the gate-on terminal VON to which the gate-on voltage Von is applied with the second electrode of the thirteenth transistor T13. The gate electrode of the sixteenth transistor T16 may be connected to the first control clock terminal CCI1, the first electrode of the sixteenth transistor T16 may be connected to the second electrode of the thirteenth transistor T13, and the second electrode of the sixteenth transistor T16 may be connected to the gate-on terminal VON.

The seventeenth transistor T17 is turned on by the gate-on voltage Von of the carry signal CRk−2 of the $(k-2)^{th}$ stage ST(k−2) input to the start terminal CPI, to connect the gate-on terminal VON to which the gate-on voltage Von is applied with the gate electrode of the thirteenth transistor T13. The gate electrode of the seventeenth transistor T17 may be connected to the start terminal CPI, the first electrode of the seventeenth transistor T17 may be connected to the gate electrode of the thirteenth transistor T13, and the second electrode of the seventeenth transistor T7 may be connected to the gate-on terminal VON.

The fifth capacitor C5 is disposed between the gate electrode of the thirteenth transistor T13 and the first gate-off terminal VOF1 to which the first gate-off voltage Voff1 is applied. One electrode of the fifth capacitor C5 may be connected to the gate electrode of the thirteenth transistor T13, and the other electrode of the fifth capacitor C5 may be connected to the first gate-off terminal VOF1. Since the fifth capacitor C5 stores the voltage difference between the gate electrode of the thirteenth transistor T13 and the first gate-off terminal VOF1, the voltage difference between the gate electrode of the thirteenth transistor T13 and the first gate-off terminal VOF1 can be held by the fifth capacitor C5.

As shown in FIG. 30, during the vertical blank period, the pull-down node controller 280 of the $k^{th}$ stage STk does not apply the gate-on voltage Von to the pull-down node QB when the sensing control node S has the gate-on voltage Von to output the $k^{th}$ scan signal SCk and the $k^{th}$ sensing signal SSk. In addition, since the pull-down node controller 280 of the $k^{th}$ stage STk does not output the $k^{th}$ scan signal SCk and the k sensing signal SSk during the vertical blank period, when the sensing control node S does not have the gate-on voltage, it may apply the gate-on voltage Von to the pull-down node QB to stably hold the potential of the pull-down node QB.

Figure 31:
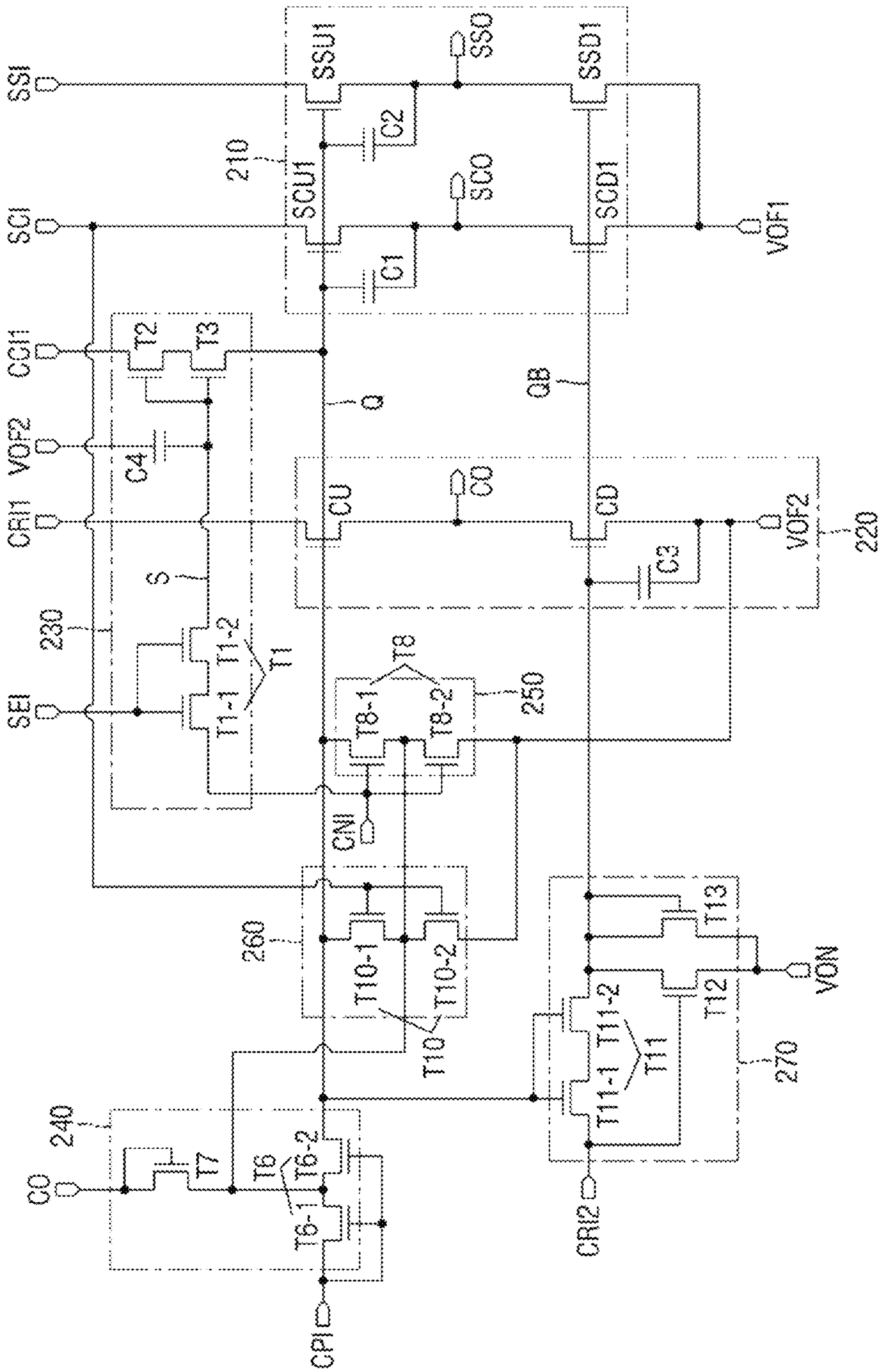
FIG. 31 is a circuit diagram showing the $k^{th}$ stage of a scan signal driver according to an exemplary embodiment of the present inventive concept.

FIG. 31 is a circuit diagram showing the $k^{th}$ stage of a scan signal driver according to an exemplary embodiment of the present inventive concept.

The exemplary embodiment shown in FIG. 31 is different from the exemplary embodiment of FIG. 8 in that a first pull-up node controller 240 further includes a seventh transistor T7, and that an eighth transistor T8 of a second pull-up node controller 250 and a tenth transistor T10 of a third pull-up node controller 260 are connected to a second gate-off terminal VOF2 to which a first gate-off voltage Voff1 is applied, instead of the carry output terminal CO.

Referring to FIG. 31, a sixth transistor T6 may include a $(6\text{-}1)^{th}$ transistor T6- and a $(6\text{-}2)^{th}$ transistor T6-2. The $(6\text{-}1)^{th}$ transistor T6-1 and the (6-2) transistor T6-2 are turned on by the gate-on voltage of the carry signal of the (k−2) stage ST(k−2) input to the start terminal CPI, to connect pull-up node Q with the gate-on terminal VON. This way, the gate-on voltage may be applied to the pull-up node Q. The gate electrode and the second electrode of the $(6\text{-}1)^{th}$ transistor T6-1 may be connected to a start terminal CP, and the first electrode of the $(6\text{-}1)^{th}$ transistor T6-1 may be connected to the second electrode of the $(6\text{-}2)^{th}$ transistor 16-2. The gate electrode of the $(6\text{-}2)^{th}$ transistor T6-2 may be connected to the start terminal CPI, the first electrode of the $(6\text{-}2)^{th}$ transistor T6-2 may be connected to the pull-up node Q, and the second electrode of the $(6\text{-}2)^{th}$ transistor T6-2 may be connected to the first electrode of the $(6\text{-}1)^{th}$ transistor T6-1.

The eighth transistor T8 may include an $(8\text{-}1)^{th}$ transistor T8-1 and an $(8\text{-}2)^{th}$ transistor T8-2. The $(8\text{-}1)^{th}$ transistor T8-1 and the $(8\text{-}2)^{th}$ transistor T8-2 are turned on by the gate-on voltage of the carry signal of the $(k+2)^{th}$ stage ST(k+2) input to the next carry input terminal CNI, to connect the pull-up node Q with the second gate-off terminal VOF2 to which the first gate-off voltage Voff1 is applied. This way, the first gate-off voltage may be applied to the pull-up node Q. The gate electrode of the $(8\text{-}1)^{th}$ transistor T8-1 may be connected to the next carry input terminal CNI, the first electrode of the $(8\text{-}1)^{th}$ transistor T8-1 may be connected to the second electrode of the $(8\text{-}2)^{th}$ transistor T8-2, and the second electrode of the $(8\text{-}1)^{th}$ transistor T8-1 may be connected to the pull-up node Q. The gate electrode of the $(8\text{-}2)^{th}$ transistor T8-2 may be connected to the next carry input terminal CNI, the first electrode of the $(8\text{-}2)^{th}$ transistor may be connected to the second gate-off terminal VOF2, and the second electrode of the $(8\text{-}2)^{th}$ transistor may be connected to the first electrode of the $(8\text{-}1)^{th}$ transistor T8-1.

The tenth transistor T10 may include a $(10\text{-}1)^{th}$ transistor T10-1 and a $(10\text{-}2)^{th}$ transistor T10-2. The $(10\text{-}1)^{6}$ transistor T10-1 and the $(10\text{-}2)^{th}$ transistor T10-2 may be turned on by the gate-on voltage of the third scan clock signal or the third sensing clock signal to connect the pull-up node Q with the second gate-off terminal VOF2 to which the first gate-off voltage Voff1 is applied. The gate electrode of the $(10\text{-}1)^{th}$ transistor T10-1 may be connected to the scan clock terminal SCI or the sensing clock terminal SSI, the first electrode of the $(10\text{-}1)^{th}$ transistor T10-1 may be connected to the second electrode of the $(10\text{-}2)^{th}$ transistor T10-2, and the second electrode of the $(10\text{-}1)^{th}$ transistor T10-1 may be connected to the pull-up node Q. The gate electrode of the $(10\text{-}2)^{th}$ transistor T10-2 may be connected to the scan clock terminal SCI or the sensing clock terminal SSI, the first electrode of the $(10\text{-}2)^{th}$ transistor T10-2 may be connected to the second gate-off terminal VOF2, and the second electrode of the $(10\text{-}2)^{th}$ transistor T10-2 may be connected to the first electrode of the (10-1) transistor T10-1.

The seventh transistor T7 may be turned on by the gate-on voltage Von of the carry output terminal CO to connect between the $(6\text{-}1)^{th}$ transistor T6-1 and the $(6\text{-}2)^{th}$ transistor T6-2, between the $(8\text{-}1)^{th}$ transistor T8-1 and the (8-2) transistor T8-2 and between the $(10\text{-}1)^{th}$ transistor T10-1 and the (10-2) transistor T10-2. By virtue of the seventh transistor T7, it is possible to prevent or reduce the gate-on voltage of the pull-up node Q from leaking through the (6-1) transistor T6- and the $(6\text{-}2)^{th}$ transistor T6-2. In addition, by virtue of the seventh transistor T7, it is possible to prevent or reduce the gate-on voltage of the pull-up node Q from leaking through the $(8\text{-}1)^{th}$ transistor T8-1 and the $(8\text{-}2)^{th}$ transistor T8-2. In addition, by virtue of the seventh transistor 17, it is possible to prevent or reduce the gate-on voltage of the pull-up node Q from leaking through the $(10\text{-}1)^{th}$ transistor T10-1 and the $(10\text{-}2)^{th}$ transistor T10-2.

Figure 32:
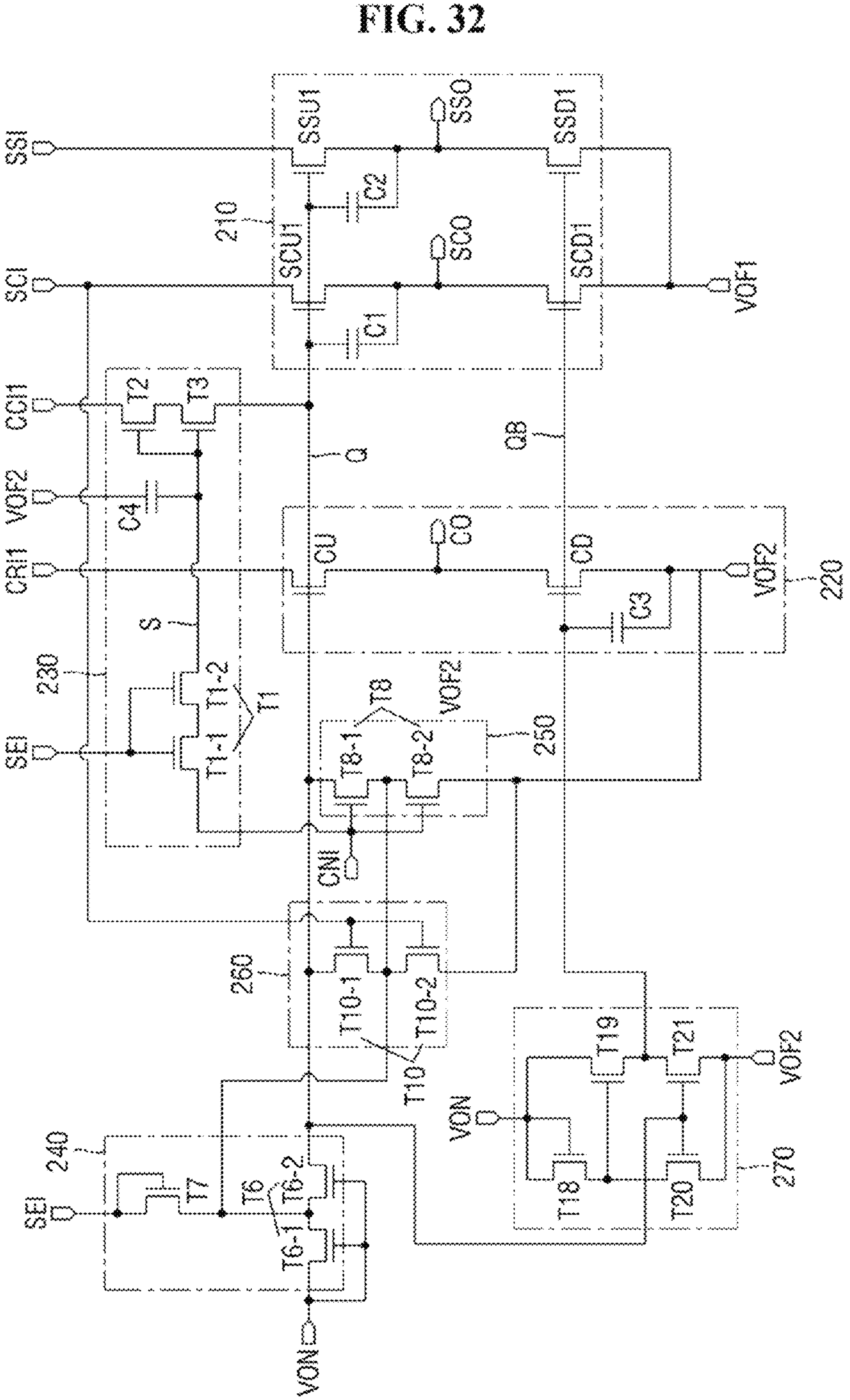
FIG. 32 is a circuit diagram showing the $k^{th}$ stage of a scan signal driver according to an exemplary embodiment of the present inventive concept.

FIG. 32 is a circuit diagram showing the $k^{th}$ stage of a scan signal driver according to an exemplary embodiment of the present inventive concept.

The exemplary embodiment shown in FIG. 32 is different from the exemplary embodiment of FIG. 31 in that an inverter 270 includes eighteenth to twenty-first transistors T18, T19, T20 and T21, instead of the eleventh to thirteenth transistors T11, T12 and T13.

Referring to FIG. 32, the eighteenth transistor T18 is turned on by the gate-on voltage Von of the gate-on terminal VON to apply the gate-on voltage Von to the gate electrode of the nineteenth transistor T19. The gate electrode and the second electrode of the eighteenth transistor T18 may be connected to the gate-on terminal VON, and the first electrode of the eighteenth transistor T18 may be connected to the gate electrode of the nineteenth transistor T19. The gate electrode and the second electrode of the eighteenth transistor T18 may be connected to the second carry clock terminal CRI2, instead of the gate-on terminal VON.

The nineteenth transistor T19 is turned on when the gate-on voltage Von is applied to its gate electrode, to connect the pull-down node QB with the gate-on terminal VON. The gate electrode of the nineteenth transistor T19 may be connected to the first electrode of the eighteenth transistor T18, the first electrode of the nineteenth transistor T19 may be connected to the pull-down node QB, and the second electrode of the nineteenth transistor T19 may be connected to the gate-on terminal VON.

A twentieth transistor T20 may be turned on by the gate-on voltage Von of the pull-up node Q to connect the gate electrode of the nineteenth transistor T19 with the second gate-off terminal VOF2 to which the second gate-off voltage Voff2 is applied. The gate electrode of the twentieth transistor T20 may be connected to the pull-up node Q, the first electrode of the twentieth transistor T20 may be connected to the second gate-off terminal VOF2, and the second electrode of the twentieth transistor T20 may be connected to the gate electrode of the nineteenth transistor T19. The first electrode of the twentieth transistor T20 may be connected to a third gate-off terminal VOF3 to which a third gate-off voltage Voff3 lower than the second gate-off voltage Voff2 is applied, instead of the second gate-off terminal VOF2.

A twenty-first transistor T21 may be turned on by the gate-on voltage Von of the pull-down node QB to connect the pull-down node QB with the second gate-off terminal VOF2.

The gate electrode of the twenty-first transistor T21 may be connected to the pull-up node Q, the first electrode of the twenty-first transistor T21 may be connected to the second gate-off terminal VOF2, and the second electrode of the twenty-first transistor T21 may be connected to the pull-down node QB. The first electrode of the twenty-first transistor T21 may be connected to the third gate-off terminal VOF3 instead of the second gate-off terminal VOF2.

Figure 33:
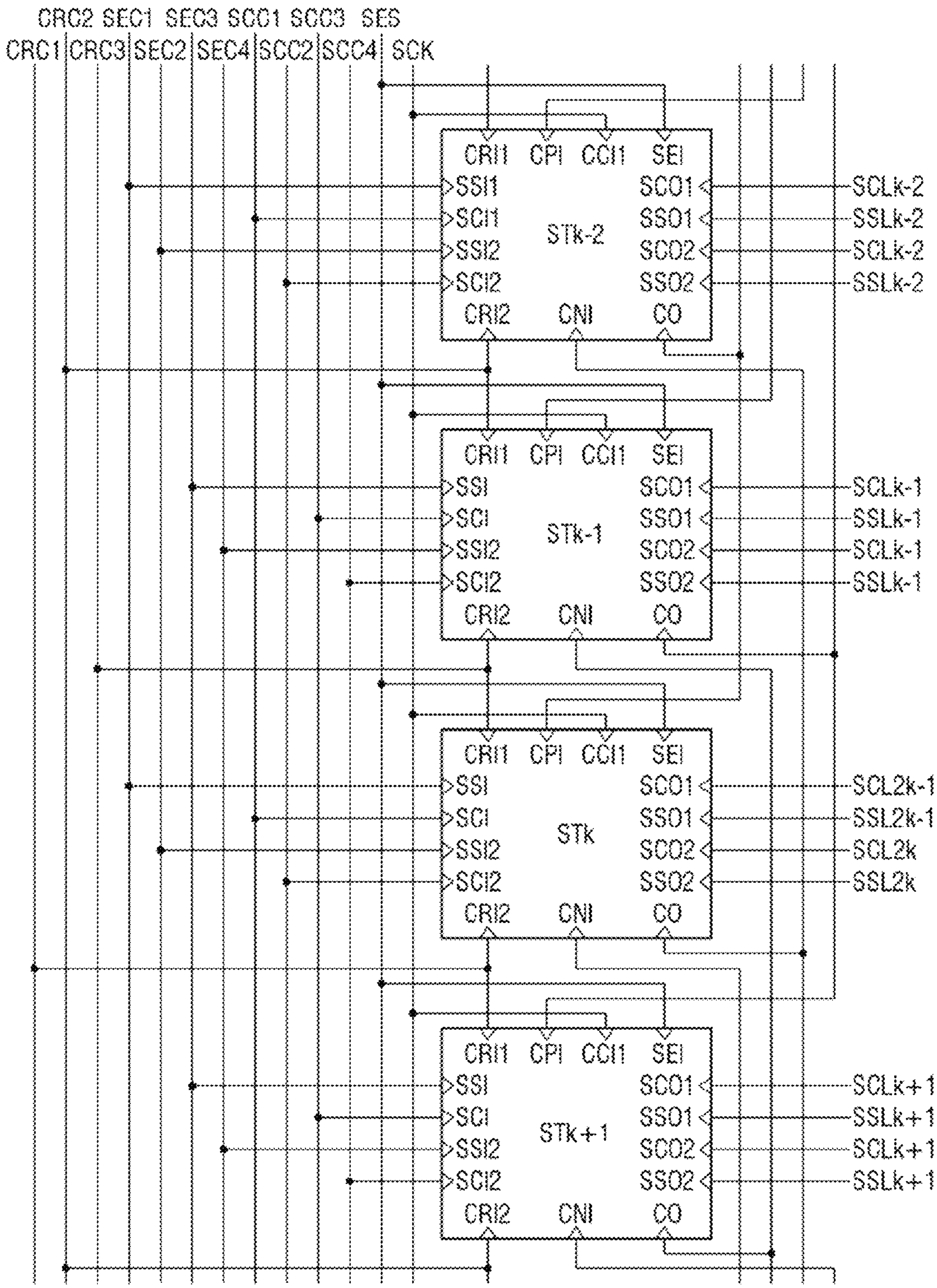
FIG. 33 is a view showing an example of a scan signal driver according to an exemplary embodiment of the present inventive concept.

FIG. 33 is a view showing a scan signal driver according to an exemplary embodiment of the present inventive concept.

The exemplary embodiment shown in FIG. 33 is different from the exemplary embodiment of FIG. 7 in that each of the stages ST(k−2) to ST(k+1) further includes a second scan clock terminal SCI2, a second sensing clock terminal SSI2, a second scan output terminal SCO2, and a second sensing output terminal SSO2.

Referring to FIG. 33, each of the first scan clock terminal SCI1 and the second scan clock terminal SCI2 of each of the stages ST(k−2) to ST(k+1) may be connected to one of the scan clock lines SCC1 to SCC4. The scan clock lines SCC1 to SCC4 may be sequentially connected to the first scan clock terminals SCI1 and the second scan clock terminals SCI2 of the stages ST(k−2) to ST(k+2). For example, as shown in FIG. 33, the third scan clock line SCC3 may be connected to the first scan clock terminal SCI1 of each of the $(k-1)^{th}$ stage ST(k−1) and the $(k+1)^{th}$ stage ST(k+1), and the fourth scan clock line SCC4 may be connected to the second scan clock terminal SCI2 thereof. The first scan clock line SCC1 may be connected to the first scan clock terminal SCI1 of each of the $(k-2)^{th}$ stage ST(k−2) and the $k^{th}$ stage STk, and the second scan clock line SCC2 may be connected to the second scan clock terminal SC2 thereof. In each of the stages ST(k−2) to ST(k+1), one of the odd scan clock lines may be connected to the first scan clock terminal SCI1, and one of the even scan clock lines may be connected to the second scan clock terminal SCI2.

Each of the first sensing clock terminal SSI1 and the second sensing clock terminal SSI2 of each of the stages ST(k−2) to ST(k+1) may be connected to one of the sensing clock lines SEC1 to SEC4. The sensing clock lines SEC1 to SEC4 may be sequentially connected to the first sensing clock terminals SSI1 and the second sensing clock terminals SSI2 of the stages ST(k−2) to ST(k+1). For example, as shown in FIG. 33, in each of the $(k-2)^{th}$ stage ST(k−2) and the $k^{th}$ stage STk, the first sensing clock line SEC1 may be connected to the first sensing clock terminal SSI1, and the second sensing clock line SEC2 may be connected to the second sensing clock terminal SSI2. In each of the $(k-1)^{th}$ stage ST(k−1) and the $(k+1)^{th}$ stage STk+1, the third sensing clock line SEC3 may be connected to the first sensing clock terminal SSI, and the fourth sensing clock line SEC4 may be connected to the second sensing clock terminal SSI2. In each of the stages ST(k−2) to ST(k+1), one of the odd scan clock lines may be connected to the first sensing clock terminal SSI, and one of the even sensing clock lines may be connected to the second sensing clock terminal SSI2.

In each of the stages ST(k−2) to ST(k+1), the first scan output terminal SCO1 is connected to an odd scan signal line to output an odd scan signal, while the second scan output terminal SCO2 is connected to an even scan signal line to output an even scan signal. For example, as shown in FIG. 33, the first scan output terminal SCO1 of the $k^{th}$ stage STk may be connected to a (2k−1) scan signal line SCL2*k*−1 to output a (2k−1) scan signal, and the second scan output terminal SCO2 may be connected to the $k^{th}$ scan signal line SCL2*k* to output a 2k scan signal.

In each of the stages ST(k−2) to ST(k+1), the first sensing output terminal SSO1 is connected to an odd sensing signal line to output an odd sensing signal, while the second sensing output terminal SSO2 is connected to an even sensing signal line to output an even sensing signal. For example, as shown in FIG. 33, the first sensing output terminal SSO1 of the $k^{th}$ stage STk may be connected to the $(2k-1)^{th}$ sensing signal line SSL2*k*−1 to output a $(2k-1)^{th}$ sensing signal, and the second sensing output terminal SSO2 may be connected to the k sensing signal line SSL2*k* to output a 2kth sensing signal.

As shown in FIG. 33, each of the stages ST(k−2) to ST(k+1) may simultaneously output two scan signals and two sensing signals. Therefore, the scan signal driver 200 includes a single stage for outputting a plurality of scan signals and a plurality of sensing signals simultaneously. Therefore, it is possible to reduce the area of the scan signal driver 200 compared with one including a stage for outputting a scan signal and another stage for outputting a sensing signal.

Figure 34:
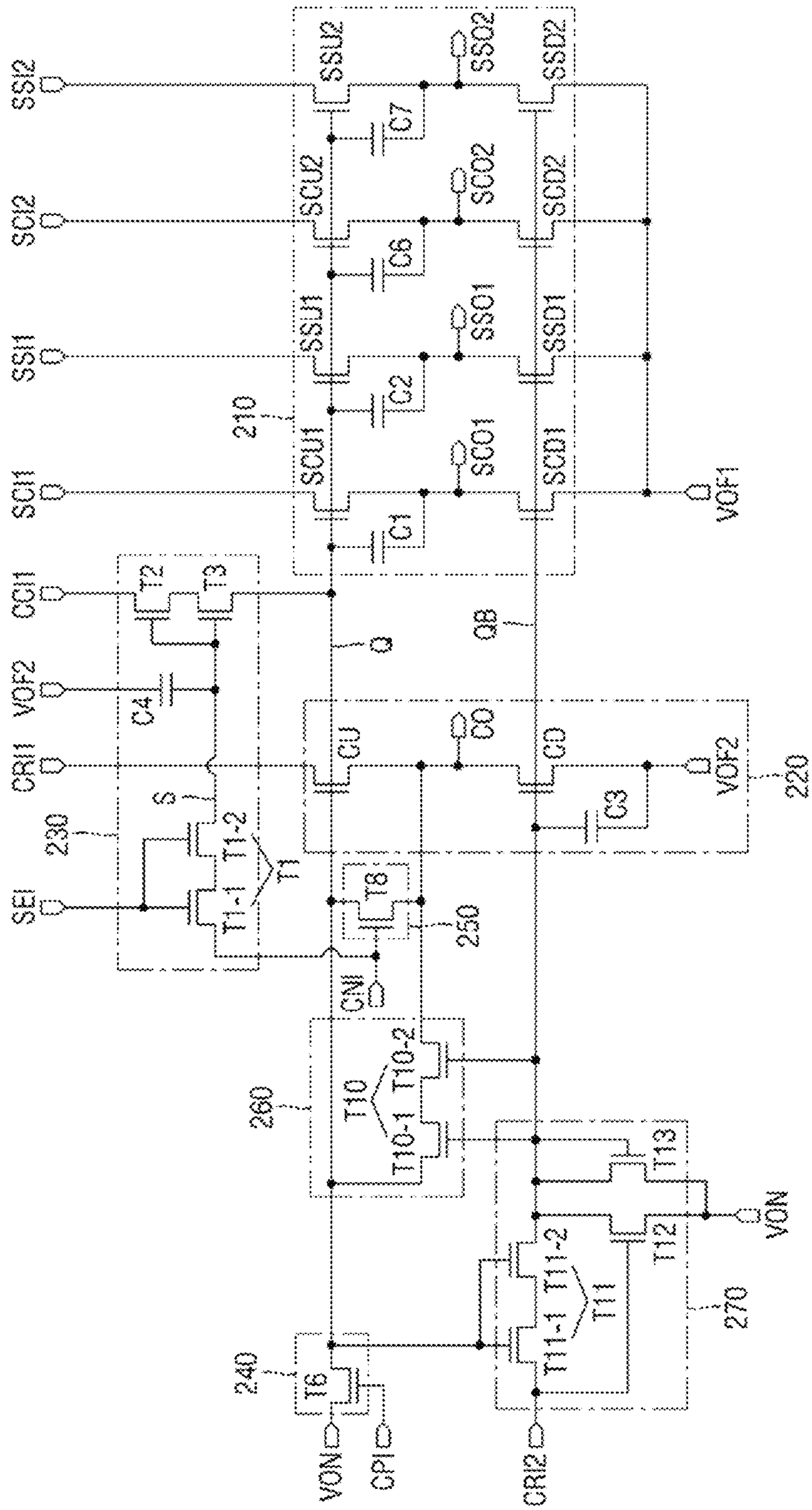
FIG. 34 is a circuit diagram showing the $k^{th}$ stage of a scan signal driver according to an exemplary embodiment of the present inventive concept.

FIG. 34 is a circuit diagram showing the $k^{th}$ stage of a scan signal driver according to an exemplary embodiment of the present inventive concept.

The exemplary embodiment shown in FIG. 34 is different from the exemplary embodiment of FIG. 8 in that a first output unit 210 of the $k^{th}$ stage STk further includes a second scan pull-up transistor SCU2, a second sensing pull-up transistor SSU2, a second scan pull-down transistor SCD2 and a second sensing pull-down transistor SSD2, and that the gate electrode of a $(10-1)^{th}$ transistor T10-1 is connected to the pull-down node QB.

Referring to FIG. 34, when the pull-up node Q has the gate-on voltage, the first output unit 210 outputs a third scan clock signal input to the first scan clock terminal SCI1 to the first scan output terminal SCO1, and outputs a third sensing clock signal input to the first sensing clock terminal SSI1 to the first sensing output terminal SSO1. In addition, when the pull-up node Q has the gate-on voltage, the first output unit 210 outputs a fourth scan clock signal input to the second scan clock terminal SCI2 to the second scan output terminal SCO2, and outputs a fourth sensing clock signal input to the second sensing clock terminal SSI2 to the second sensing output terminal SSO2. When the pull-down node QB has the gate-on voltage, the first output unit 210 outputs the first gate-off voltage to the first scan output terminal SCO1, the first sensing output terminal SSO1, the second scan output terminal SCO2 and the second sensing output terminal SSO2.

The first output unit 210 may include a first scan pull-up transistor SCU1, a second scan pull-up transistor SCU2, a first scan pull-down transistor SCD1, a second scan pull-down transistor SCD2, a first sensing pull-up transistor SSU1, a second sensing pull-up transistor SSU2, a first sensing pull-down transistor SSD1, a second sensing pull-down transistor SSD2, a first capacitor C1, a second capacitor C2, a sixth capacitor C6 and a seventh capacitor C7.

The first scan pull-up transistor SCU1, the first scan pull-down transistor SCD1, the first sensing pull-up transistor SSU1, the first sensing pull-down transistor SSU1, the first capacitor C1 and the second capacitor C2 are substantially identical to those described above with reference to FIG. 8.

The second scan pull-up transistor SCU2 is turned on by the gate-on voltage of the pull-up node Q to output the fourth scan clock signal input to the second scan clock terminal SCI2 to the second scan output terminal SCO2. The gate electrode of the second scan pull-up transistor SCU2 may be connected to the pull-up node Q, the first electrode thereof may be connected to the second scan output terminal SCO2, and the second electrode thereof may be connected to the second scan clock terminal SCI2.

The second scan pull-down transistor SCD2 is turned on by the gate-on voltage of the pull-down node QB to output the first gate-off voltage input to the first gate-off terminal VOF1 to the second scan output terminal SCO2. The gate electrode of the second scan pull-down transistor SCD2 may be connected to the pull-down node QB, the first electrode thereof may be connected to the first gate-off terminal VOF1, and the second electrode thereof may be connected to the second scan output terminal SCO2.

The second sensing pull-up transistor SSU2 is turned on by the gate-on voltage of the pull-up node Q to output the fourth sensing clock signal input to the second sensing clock terminal SSI2 to the second sensing output terminal SSO2. The gate electrode of the second sensing pull-up transistor SSU2 may be connected to the pull-up node Q, the first electrode thereof may be connected to the second sensing output terminal SSO2, and the second electrode thereof may be connected to the second sensing clock terminal SSI2.

The second sensing pull-down transistor SSD2 is turned on by the gate-on voltage of the pull-down node QB to output the first gate-off voltage input to the first gate-off terminal VOF1 to the second sensing output terminal SSO2. The gate electrode of the second sensing pull-down transistor SSD2 may be connected to the pull-down node QB, the first electrode thereof may be connected to the first gate-off terminal VOF1, and the second electrode thereof may be connected to the second sensing output terminal SSO2.

The sixth capacitor C6 is disposed between the pull-up node Q and the second scan output terminal SCO2. One electrode of the sixth capacitor C6 may be connected to the pull-up node Q, and the other electrode thereof may be connected to the second scan output terminal SCO2. Since the second capacitor C2 stores the voltage difference between the pull-up node Q and the second scan output terminal SCO2, the voltage difference between the pull-up node Q and the second scan output terminal SCO2 can be held by the sixth capacitor C6.

The seventh capacitor C7 is disposed between the pull-up node Q and the second sensing output terminal SSO2. One electrode of the seventh capacitor C7 may be connected to the pull-up node Q, and the other electrode thereof may be connected to the second sensing output terminal SSO2. Since the seventh capacitor C7 stores the voltage difference between the pull-up node Q and the second sensing output terminal SSO2, the voltage difference between the pull-up node Q and the second sensing output terminal SSO2 can be held by the seventh capacitor C7.

The third pull-up node controller 260 applies a second gate-off voltage to the pull-up node Q when the pull-down node QB has the gate-on voltage. The third pull-up node controller 260 may include a tenth transistor T10. The tenth transistor T10 may include a $(10\text{-}1)^{th}$ transistor T10-1 and a $(10\text{-}2)^{th}$ transistor T10-2.

The $(10\text{-}1)^{th}$ transistor T10-1 and the $(10\text{-}2)^{th}$ transistor T10-2 are turned on by the gate-on voltage Von of the pull-down node QB to connect the pull-up node Q with the carry output terminal CO. The gate electrode of the $(10\text{-}1)^{th}$ transistor T10-1 may be connected to the pull-down node QB, the first electrode thereof may be connected to the second electrode of the (10-2) transistor T10-2, and the second electrode thereof may be connected to the pull-up node Q. The gate electrode of the (10-2) transistor T10-2 may be connected to the pull-down node QB, the first electrode thereof may be connected to the carry output terminal CO, and the second electrode thereof may be connected to the second electrode of the $(10\text{-}1)^{th}$ transistor T10-1.

Figure 35:
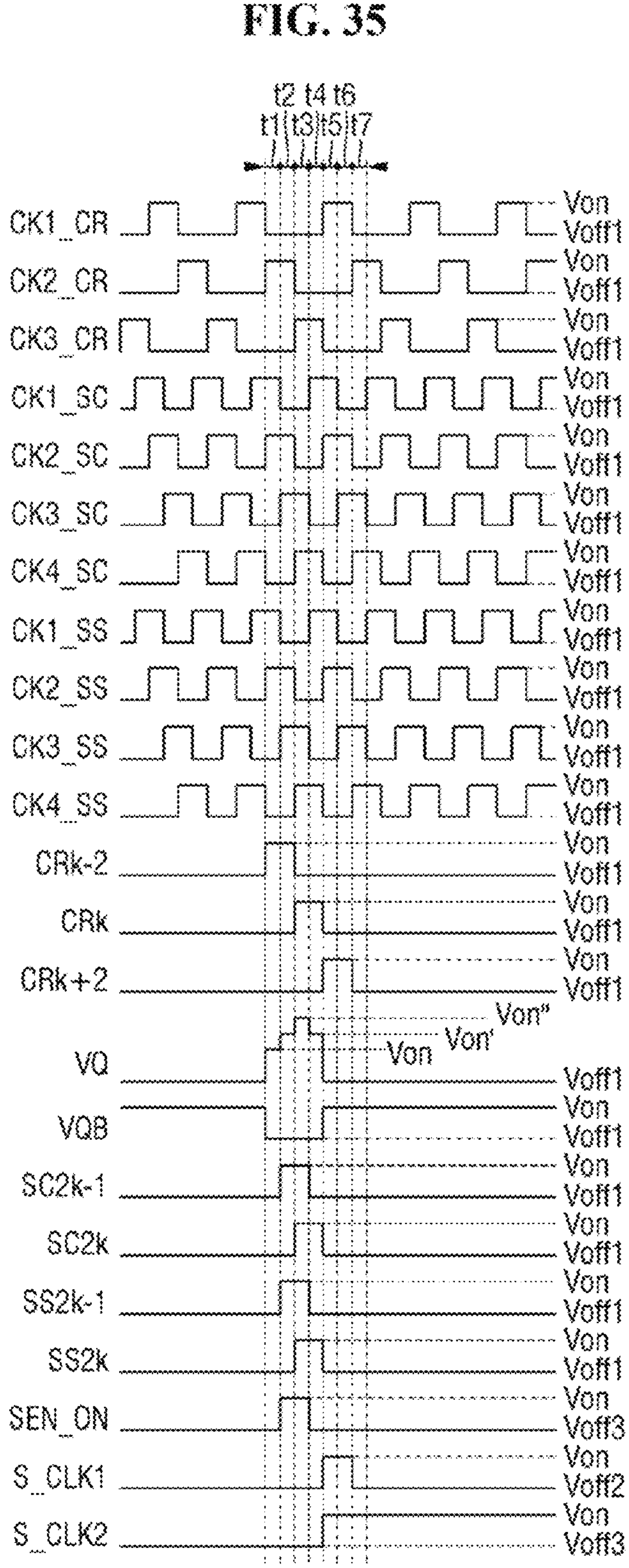
FIG. 35 is a waveform diagram showing the carry clock signals, the scan clock signals, the sensing clock signals, the sensing control signal, the (k−2) carry signal, the $k^{th}$ carry signal, the (k+2) carry signal, the voltage of the pull-up node, the voltage of the pull-down node, the $(2k-1)^{th}$ scan signal, the 2kth scan signal, the $(2k-1)^{th}$ sensing signal and the 2kth sensing signal during the active period, according to an exemplary embodiment of the present inventive concept.

FIG. 35 is a waveform diagram showing the carry clock signals, the scan clock signals, the sensing clock signals, the sensing control signal, the (k−2) carry signal, the k carry signal, the (k+2) carry signal, the voltage of the pull-up node, the voltage of the pull-down node, the (2k−1) scan signal, the 2kth scan signal, the $(2k-1)^{th}$ sensing signal and the 2kth sensing signal during the active period, according to an exemplary embodiment of the present inventive concept. FIGS. 36 to 42 are circuit diagrams illustrating operations of the $k^{th}$ stage during first to seventh periods of the active period, according to an exemplary embodiment of the present inventive concept.

Hereinafter, the operation of the $k^{th}$ stage during the first to seventh periods t1 to t7 of the active period will be described in detail with reference to FIGS. 35 to 42.

Figure 36:
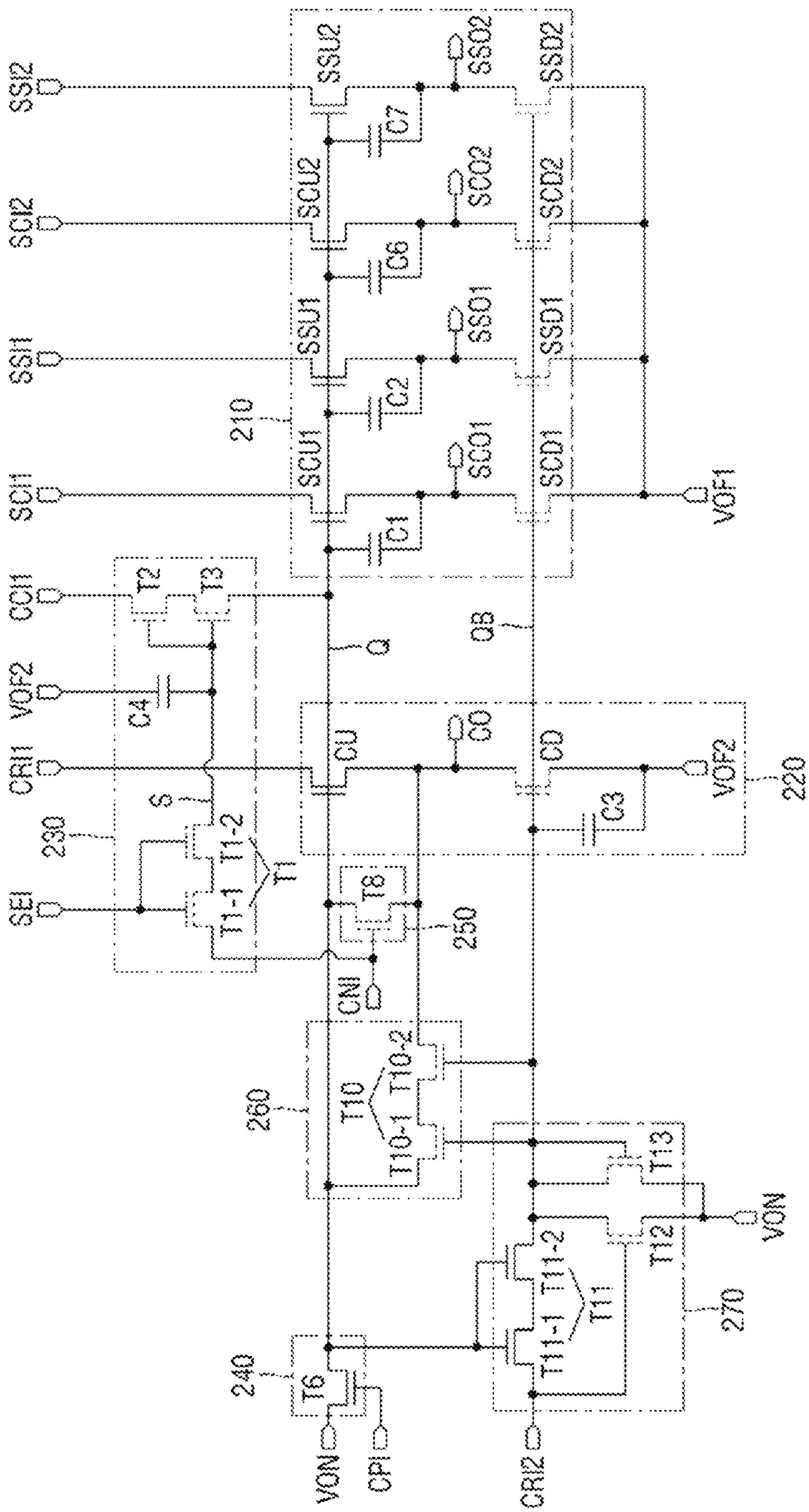
FIGS. 36, 37, 38, 39, 40, 41 and 42 are circuit diagrams illustrating operations of the $k^{th}$ stage during first to seventh periods of the active period, according to an exemplary embodiment of the present inventive concept.

First, as shown in FIGS. 35 and 36, a third scan clock signal CK3_SC of the first gate-off voltage Voff1 may be applied to the first scan clock terminal SCI1 of the $k^{th}$ stage STk, and a third sensing clock signal CK3_SS of the first gate-off voltage Voff1 may be applied to the first sensing clock terminal SSI1 during the first period ti.

The second scan pull-up transistor SCU2 is turned on by the gate-on voltage Von of the pull-up node Q to output a fourth scan clock signal CK4_SC of the first gate-off voltage Voff1 input to the second scan clock terminal SCI2 to the second scan output terminal SCO2. This way, the scan signal SC2*k* of the first gate-off voltage Voff1 may be applied to the 2kth scan signal line SCL2*k*.

The second sensing pull-up transistor SSU2 is turned on by the gate-on voltage Von of the pull-up node Q to output a fourth sensing clock signal CK4_SS of the first gate-off voltage Voff1 input to the second sensing clock terminal SSI2 to the second sensing output terminal SSO2. This way, the sensing signal SSI2*k* of the first gate-off voltage Voff1 may be applied to the 2kth sensing signal line SSL2*k*.

The operations of the sixth transistor T6, the eleventh transistor T11, the first scan pull-up transistor SCU1, the first sensing pull-up transistor SSU1 and the carry pull-up transistor CU during the first time period t1 according to the exemplary embodiment of FIG. 36 may be substantially the same as those of the first time period t1 described above with reference to FIG. 10.

Figure 37:
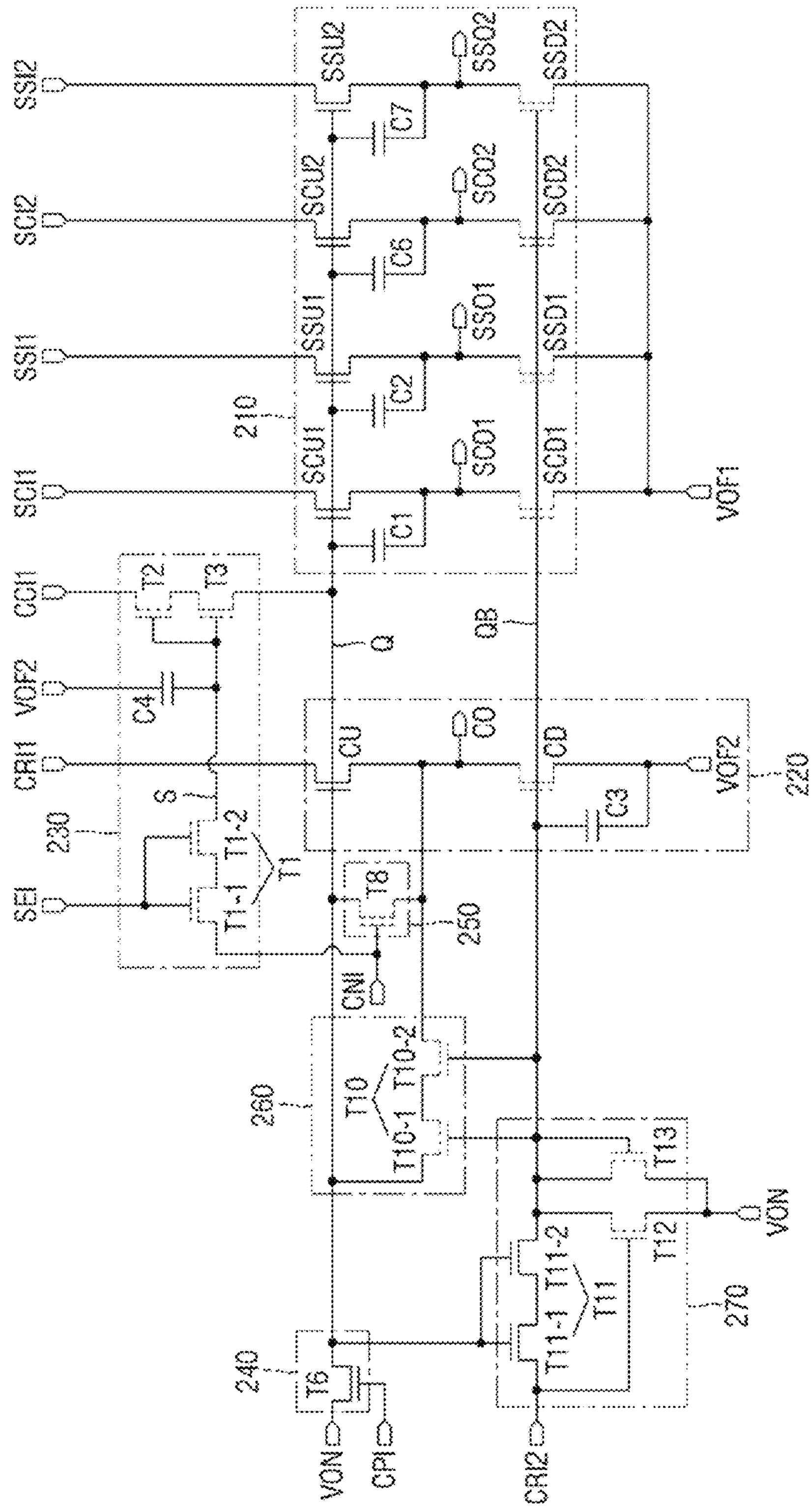

Secondly, as shown in FIGS. 35 and 37, during the second time period t2, a fourth scan clock signal CK4_SC of the first gate-off voltage Voff1 may be applied to the second scan clock terminal SCI2 of the $k^{th}$ stage STk, and a fourth sensing clock signal CK4_SS of the first gate-off voltage Voff1 may be applied to the second sensing clock terminal SSI2.

According to the exemplary embodiment of FIG. 37, operations of the second scan pull-up transistor SCU2 and the second sensing pull-up transistor SSU2 during the second period t2 may be the same as the operations during the first period t1 described above with reference to FIG. 35.

The operations of the sixth transistor T6, the eleventh transistor T11, the first scan pull-up transistor SCU1, the first sensing pull-up transistor SSU1 and the carry pull-up transistor CU during the second time period t2 according to the exemplary embodiment of FIG. 37 may be substantially the same as those of the second time period t2 described above with reference to FIG. 11.

Figure 38:
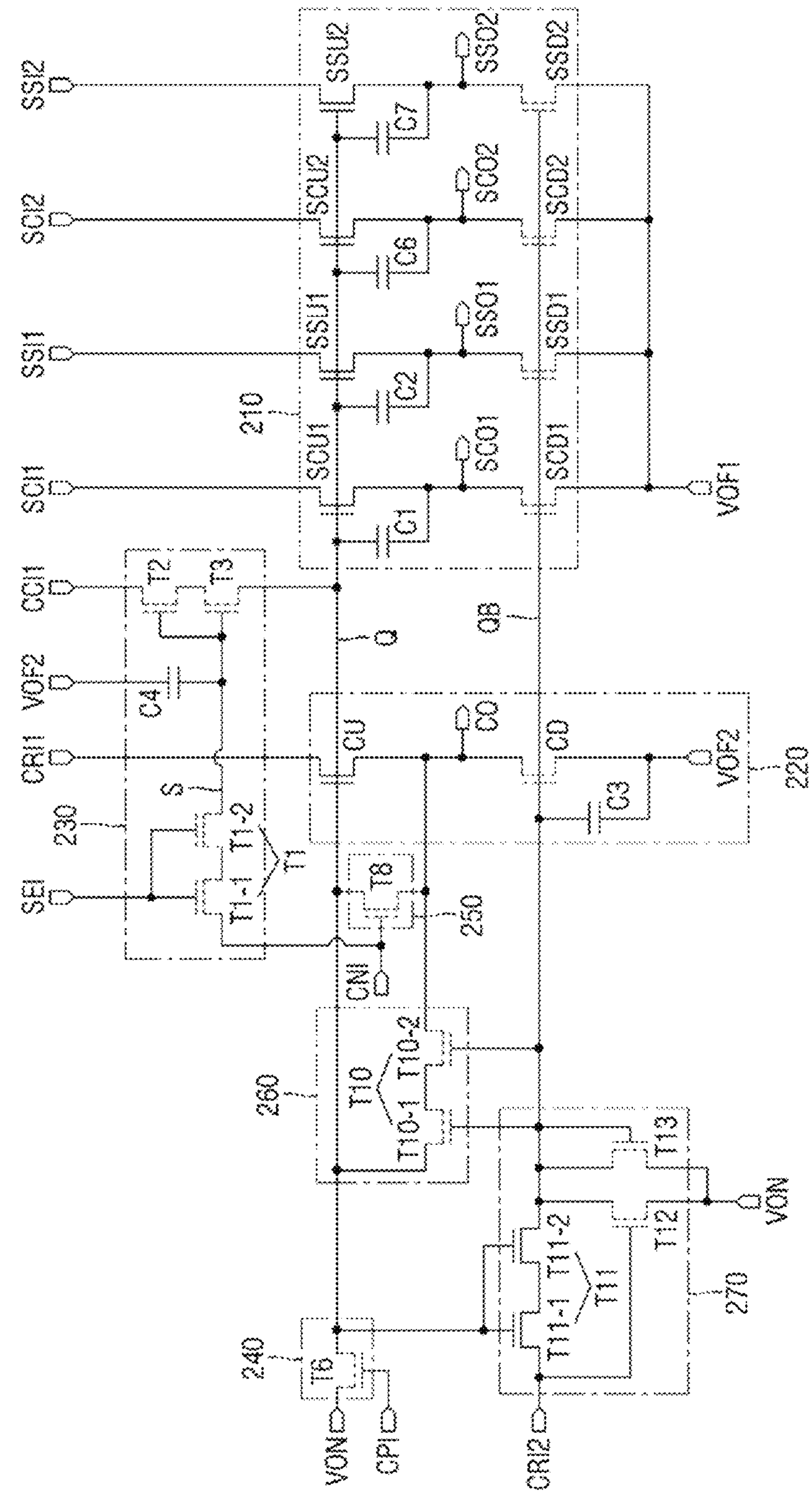

Thirdly, as shown in FIGS. 35 and 38, during the third time period t3, a fourth scan clock signal CK4_SC of the gate-on voltage Von may be applied to the second scan clock terminal SCI2 of the $k^{th}$ stage STk, and a fourth sensing clock signal CK4_SS of the gate-on voltage Von may be applied to the second sensing clock terminal SSI2.

The second scan pull-up transistor SCU2 is turned on by the gate-on voltage Von of the pull-up node Q to output a fourth scan clock signal CK4_SC of the gate-on voltage Von input to the second scan clock terminal SCI2 to the second scan output terminal SCO2. This way, the scan signal SC2*k* of the gate-on voltage Von may be applied to the 2kth scan signal line SCL2*k*.

The second sensing pull-up transistor SSU2 is turned on by the gate-on voltage Von of the pull-up node Q to output a fourth sensing clock signal CK4_SS of the gate-on voltage Von input to the second sensing clock terminal SSI2 to the second sensing output terminal SSO2. This way, the 2kth sensing signal SSI2*k* of the gate-on voltage Von may be applied to the 2kth sensing signal line SSL2*k*.

When the fourth scan clock signal CK4_SC of the gate-on voltage Von is applied to the second scan output terminal SCO2 and the fourth sensing clock signal CK4_SS of the gate-on voltage Von is applied to the second sensing output terminal SSO2, the pull-up node Q is bootstrapped by the sixth capacitor C6 and the seventh capacitor C7 so that the voltage (VQ in FIG. 35) may rise from the voltage Von' having a level higher than the gate-on voltage Von to a voltage Von''' having a level higher than Von'.

The operations of the eleventh transistor T11, the first scan pull-up transistor SCU1, the first sensing pull-up transistor SSU1 and the carry pull-up transistor CU during the third time period t3 according to the exemplary embodiment of FIG. 38 may be substantially the same as those of the third time period t3 described above with reference to FIG. 12.

Figure 39:
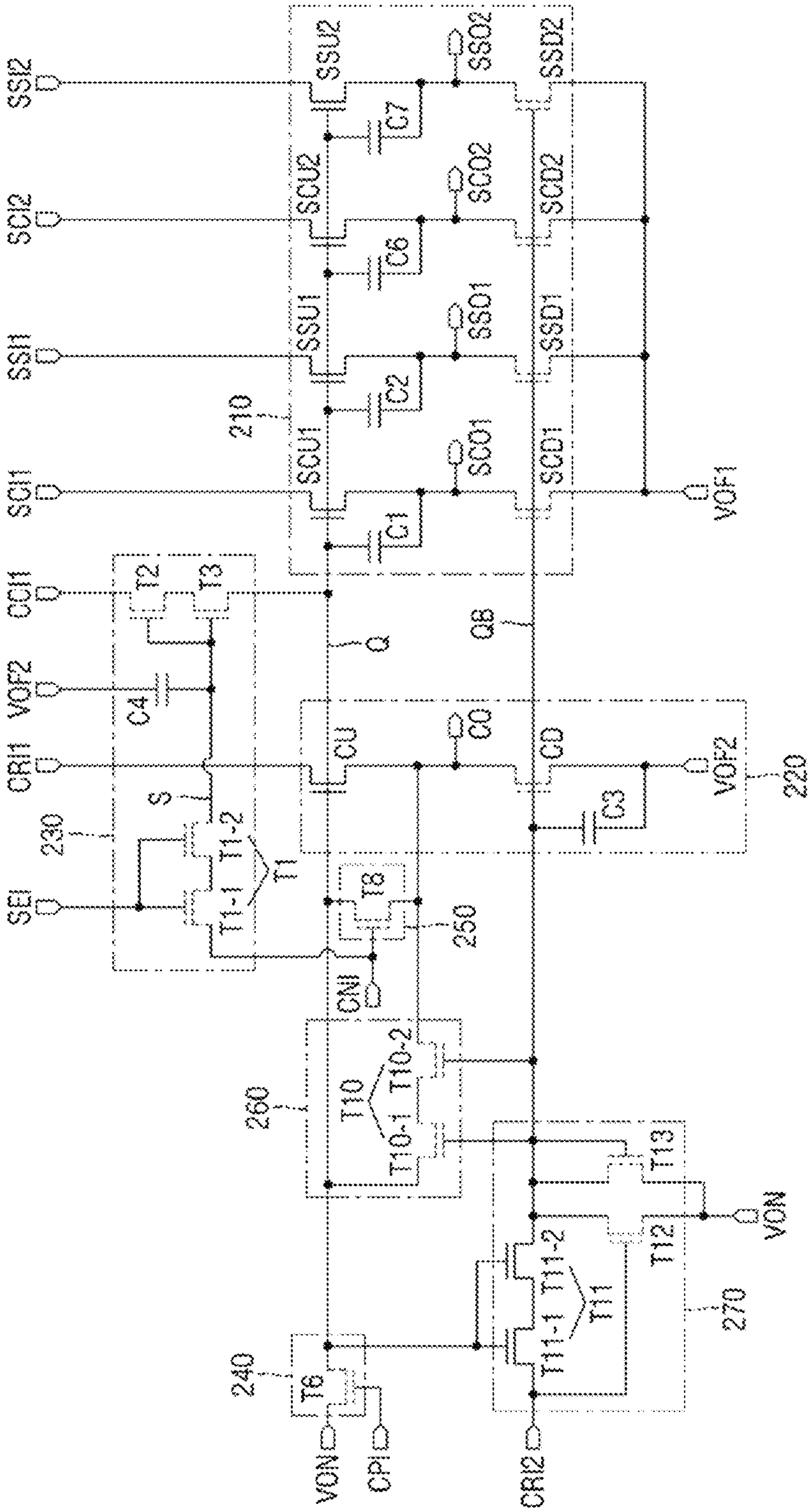

Fourthly, as shown in FIGS. 35 and 39, during the fourth time period t4, a fourth scan clock signal CK4_SC of the gate-on voltage Von may be applied to the second scan clock terminal SC2 of the $k^{th}$ stage STk, and a fourth sensing clock signal CK4_SS of the gate-on voltage Von may be applied to the second sensing clock terminal SSI2.

The operations of the second scan pull-up transistor SCU2 and the second sensing pull-up transistor SSU2 during the fourth period t4 according to the exemplary embodiment of FIG. 39 may be the same as the operations during the third time period t3 described above with reference to FIG. 38.

The operations of the eleventh transistor T11, the first scan pull-up transistor SCU1, the first sensing pull-up transistor SSU1 and the carry pull-up transistor CU during the fourth time period t4 according to the exemplary embodiment of FIG. 39 may be substantially the same as those of the fourth time period t4 described above with reference to FIG. 13.

When the third scan clock signal CK3_SC of the first gate-off voltage Voff1 is applied to the first scan output terminal SCO1 and the third sensing clock signal CK3_SS of the first gate-off voltage Voff1 is applied to the first sensing output terminal SSO1 during the fourth time period t4, the pull-up node Q is bootstrapped by the first capacitor C1 and the second capacitor C2 so that the voltage (VQ in FIG. 35) may be lowered to a voltage Von' having a level higher than the gate-on voltage Von. To stably output the fourth scan clock signal CK4_SC of the gate-on voltage Von to the second scan output terminal SCO, and the fourth sensing clock signal CK4_SS of the gate-on voltage Von to the second sensing output terminal SCO, the voltage of the pull-up node Q should not be lowered. To accomplish this, the capacitance of the first capacitor C1 may be smaller than that of the sixth capacitor C6, and the capacitance of the second capacitor C2 may be smaller than that of the seventh capacitor C7.

Figure 40:
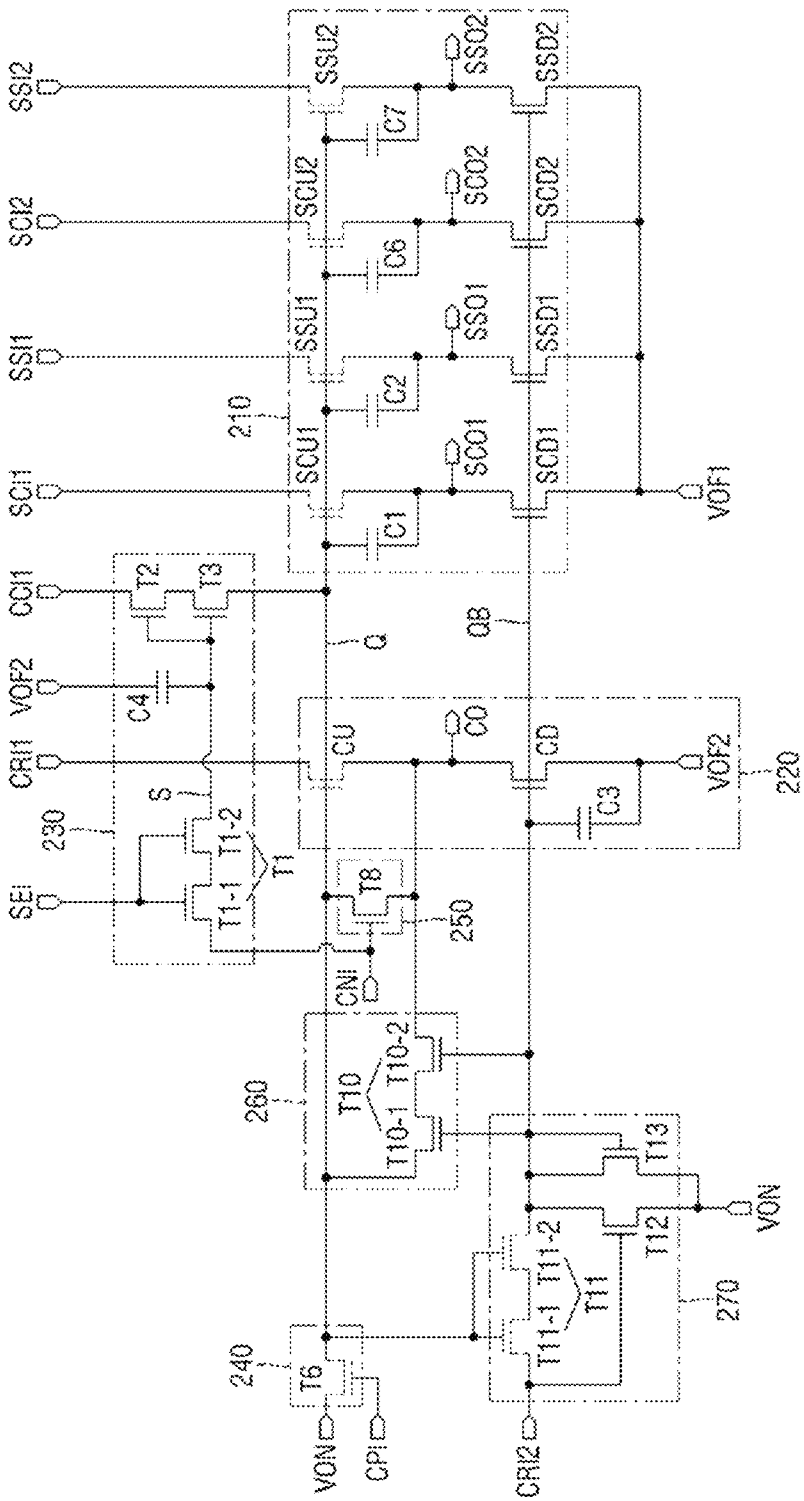

Fifthly, as shown in FIGS. 35 and 40, during the fifth time period t5, a fourth scan clock signal CK4_SC of the first gate-off voltage Voff1 may be applied to the second scan clock terminal SCI2 of the $k^{th}$ stage STk, and a fourth sensing clock signal CK4_SS of the first gate-off voltage Voff1 may be applied to the second sensing clock terminal SSI2.

The $(10\text{-}1)^{th}$ transistor T10-1 and the $(10\text{-}2)^{th}$ transistor T10-2 are turned on by the gate-on voltage Von of the pull-down node QB to connect on the pull-up node Q with the carry output terminal CO.

The second scan pull-down transistor SCD2 is turned on by the gate-on voltage Von of the pull-down node QB to output the first gate-off voltage input to the first gate-off terminal VOF1 to the second scan output terminal SCO2. This way, the scan signal SC2*k* of the first gate-off voltage Voff1 may be applied to the 2kth scan signal line SCL2*k*.

The second sensing pull-down transistor SSD2 is turned on by the gate-on voltage Von of the pull-down node QB to output the first gate-off voltage input to the first gate-off terminal VOF1 to the second sensing output terminal SSO2. This way, the sensing signal SSI2*k* of the first gate-off voltage Voff1 may be applied to the 2kth sensing signal line SSL2*k*.

The operations of the first transistor T1, the second transistor T2, the third transistor T3, the eighth transistor T8, the tenth transistor T10, the twelfth transistor T12, the thirteenth transistor T13, the first scan pull-down transistor SCD1, the first sensing pull-down transistor SSD1 and the carry pull-down transistor CD during the fifth time period t5 may be substantially the same as the operations during the fifth time period t5 described above with reference to 14.

Figure 41:
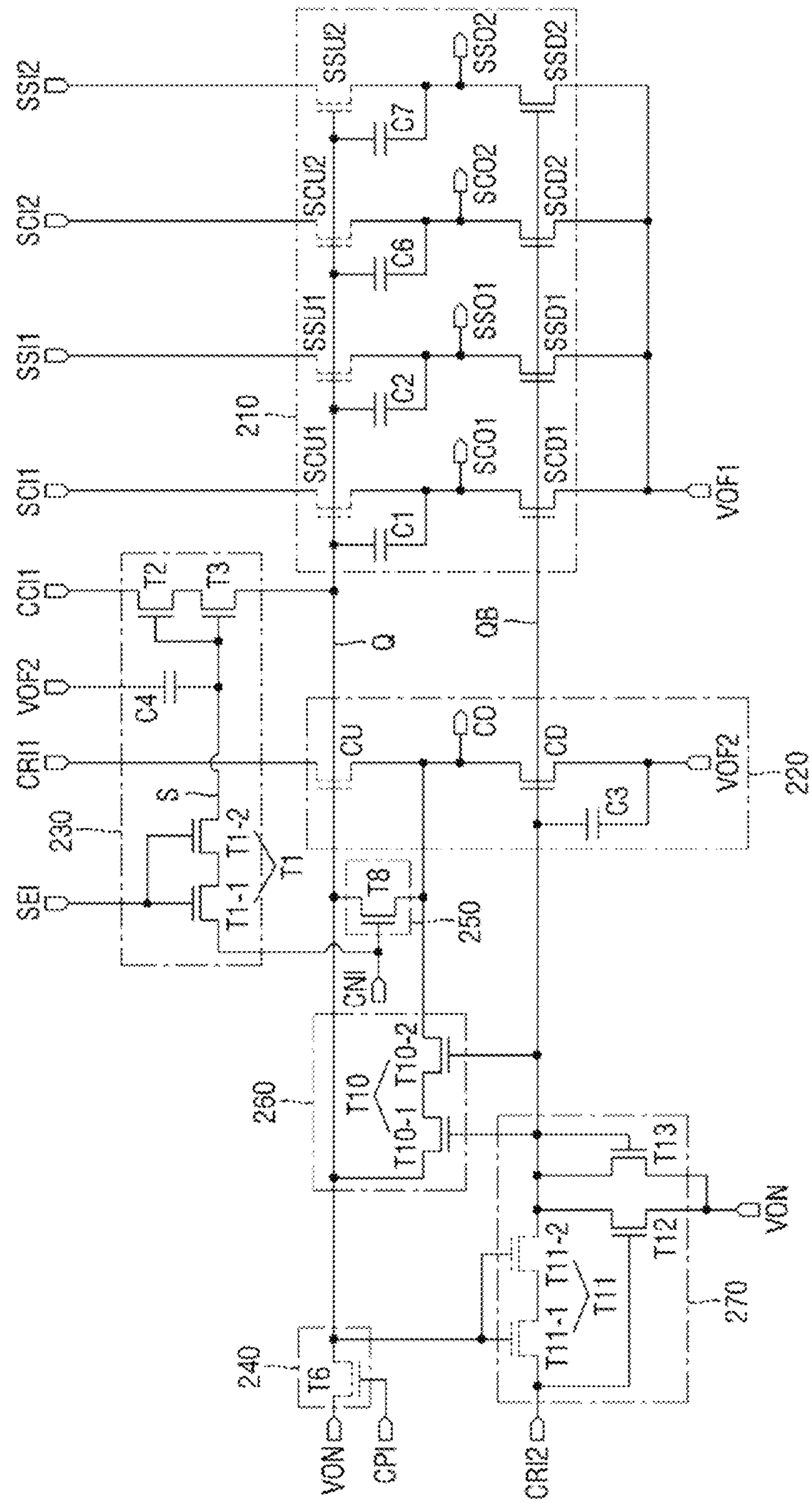

Sixthly, as shown in FIGS. 35 and 41, during the sixth time period t6, a fourth scan clock signal CK4_SC of the first gate-off voltage Voff1 may be applied to the second scan clock terminal SCI2 of the km stage STk, and a fourth sensing clock signal CK4_SS of the first gate-off voltage Voff1 may be applied to the second sensing clock terminal SSI2.

The operations of the second scan pull-down transistor SCD2 and the second sensing pull-down transistor SSD2 during the sixth time period t6 according to the exemplary embodiment of FIG. 41 may be the same as the operations during the fifth time period t5 described above with reference to FIG. 40.

In the exemplary embodiment of FIG. 41, the operations of the first transistor T1, the second transistor T2, the third transistor T3, the eighth transistor T8, the tenth transistor T10, the twelfth transistor T12, the thirteenth transistor T13, the first scan pull-down transistor SCD1, the first sensing pull-down transistor SSD1 and the carry pull-down transistor CD during the sixth period t6 may be substantially the same as the operations during the sixth period t6 described above with reference to 15.

Figure 42:
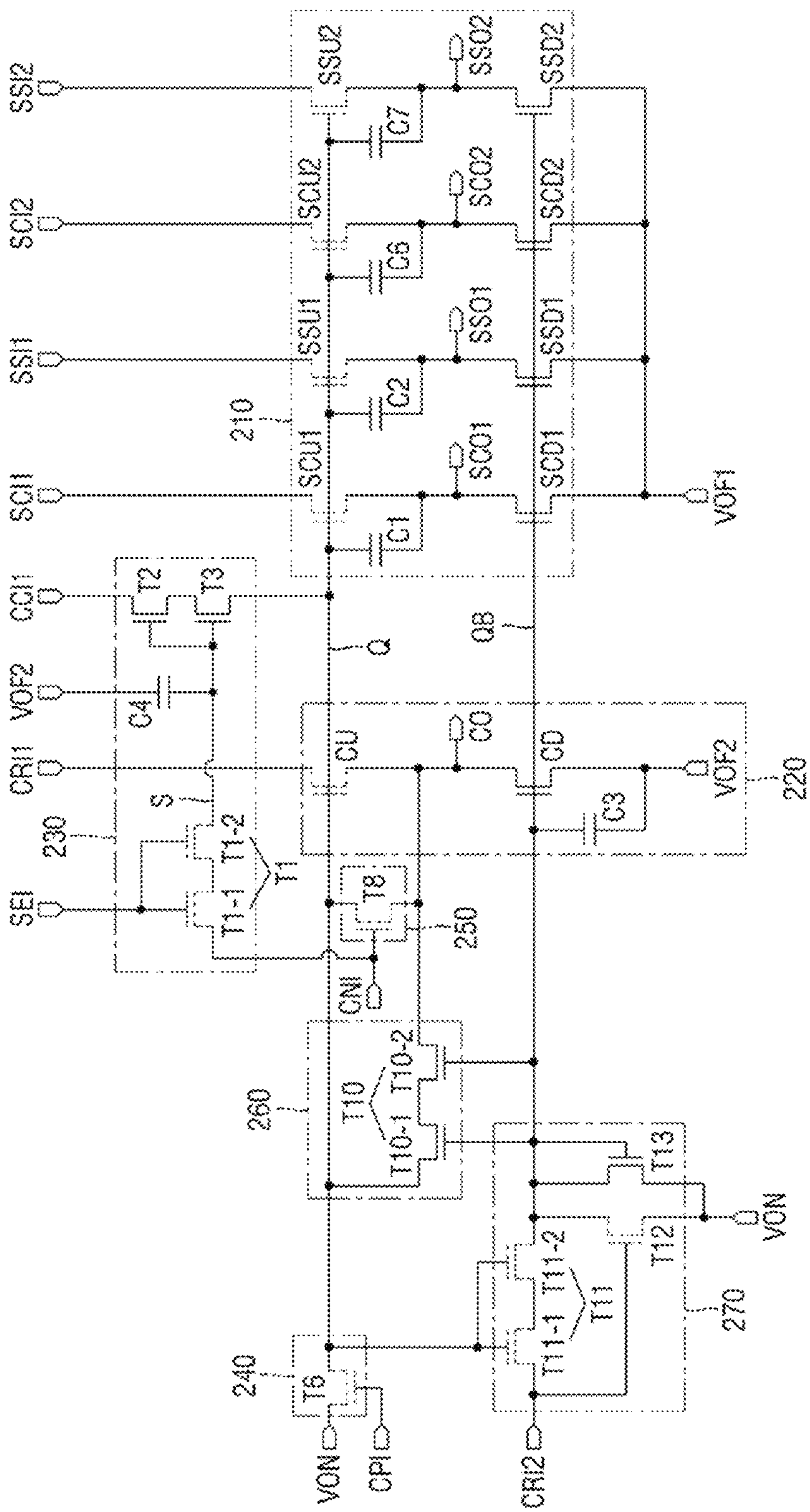

Seventhly, as shown in FIGS. 35 and 42, during the seventh time period t7, a fourth scan clock signal CK4_SC of the gate-on voltage Von may be applied to the second scan clock terminal SCI2 of the $k^{th}$ stage STk, and a fourth sensing clock signal CK4_SS of the gate-on voltage Von may be applied to the second sensing clock terminal SSI2.

The operations of the second scan pull-down transistor SCD2 and the second sensing pull-down transistor SSD2 during the seventh time period t7 according to the exemplary embodiment of FIG. 42 may be the same as the operations during the fifth time period t5 described above with reference to FIG. 40.

The operations of the second transistor T2, the third transistor T3, the tenth transistor T10, the thirteenth transistor T13, the first scan pull-down transistor SCD), the first sensing pull-down transistor SSD1 and the carry pull-down transistor CD during the seventh period t7 according to the exemplary embodiment of FIG. 42 may be substantially the same as the operations during the seventh time period t7 described above with reference to FIG. 16.

Figure 43:
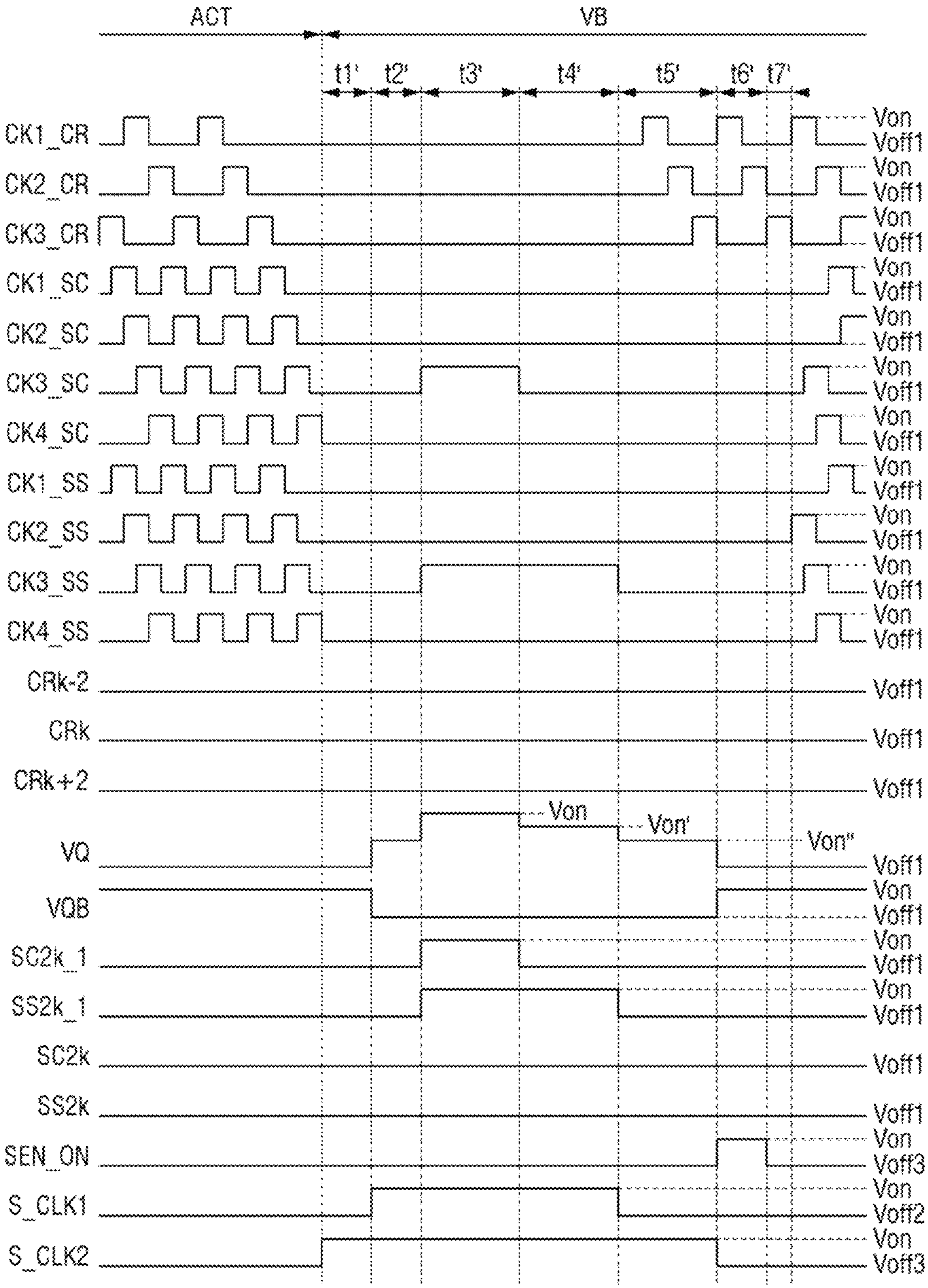
FIG. 43 is a waveform diagram showing the carry clock signals, the scan clock signals, the sensing clock signals, the sensing control signal, the (k−2) carry signal, the $k^{d}$ carry signal, the (k+2) carry signal, the voltage of the pull-up node, the voltage of the pull-down node, the $(2k-1)^{th}$ scan signal, the 2kth scan signal, the (2k−1) sensing signal and the 2kth sensing signal during the blank period, according to an exemplary embodiment of the present inventive concept.
Figure 44:
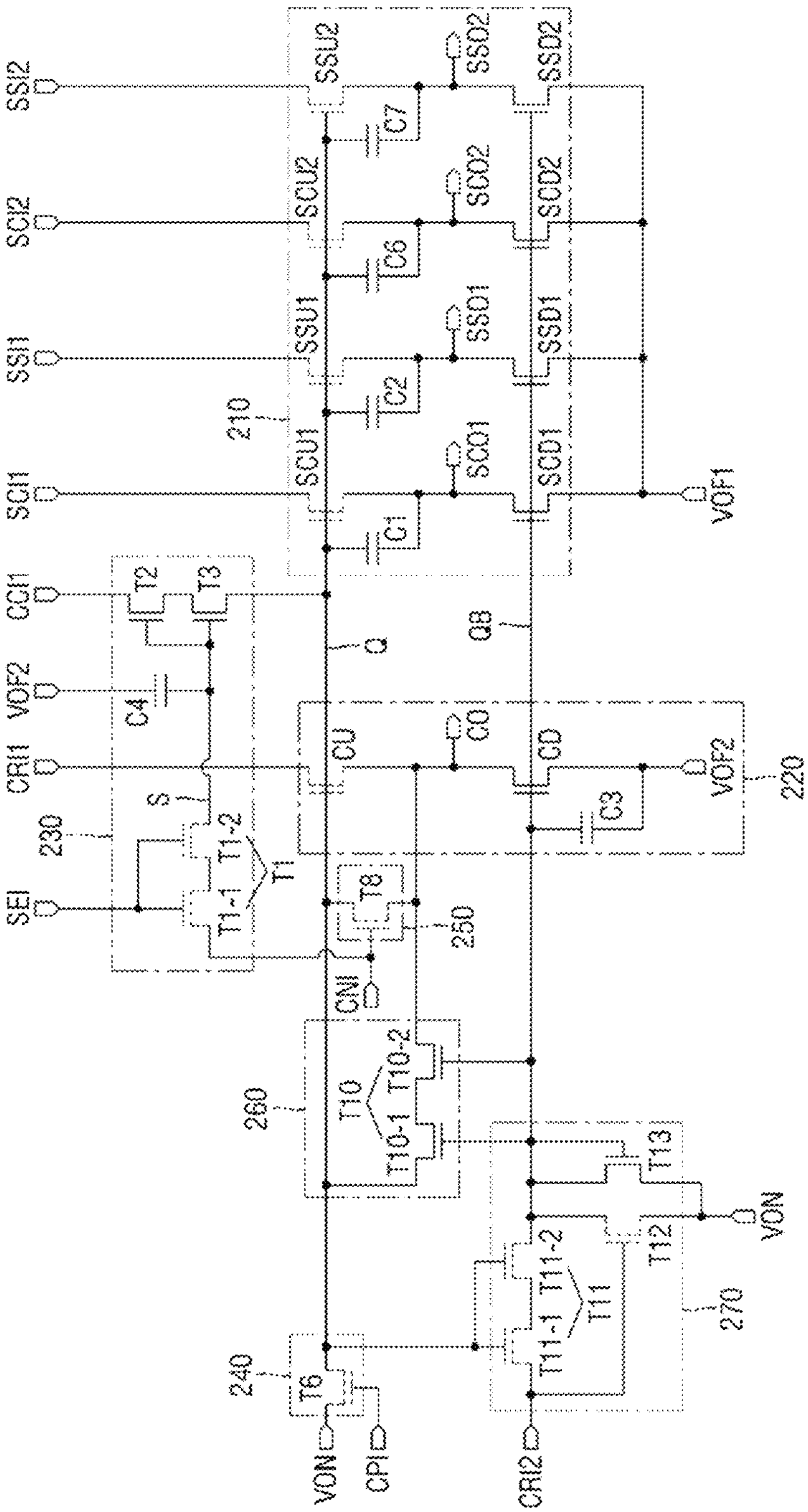
FIGS. 44, 45, 46, 47, 48, 49 and 50 are circuit diagrams illustrating operations of the $k^{th}$ stage during 1' to 7' periods of the blank period, according to an exemplary embodiment of the present inventive concept.
Figure 45:
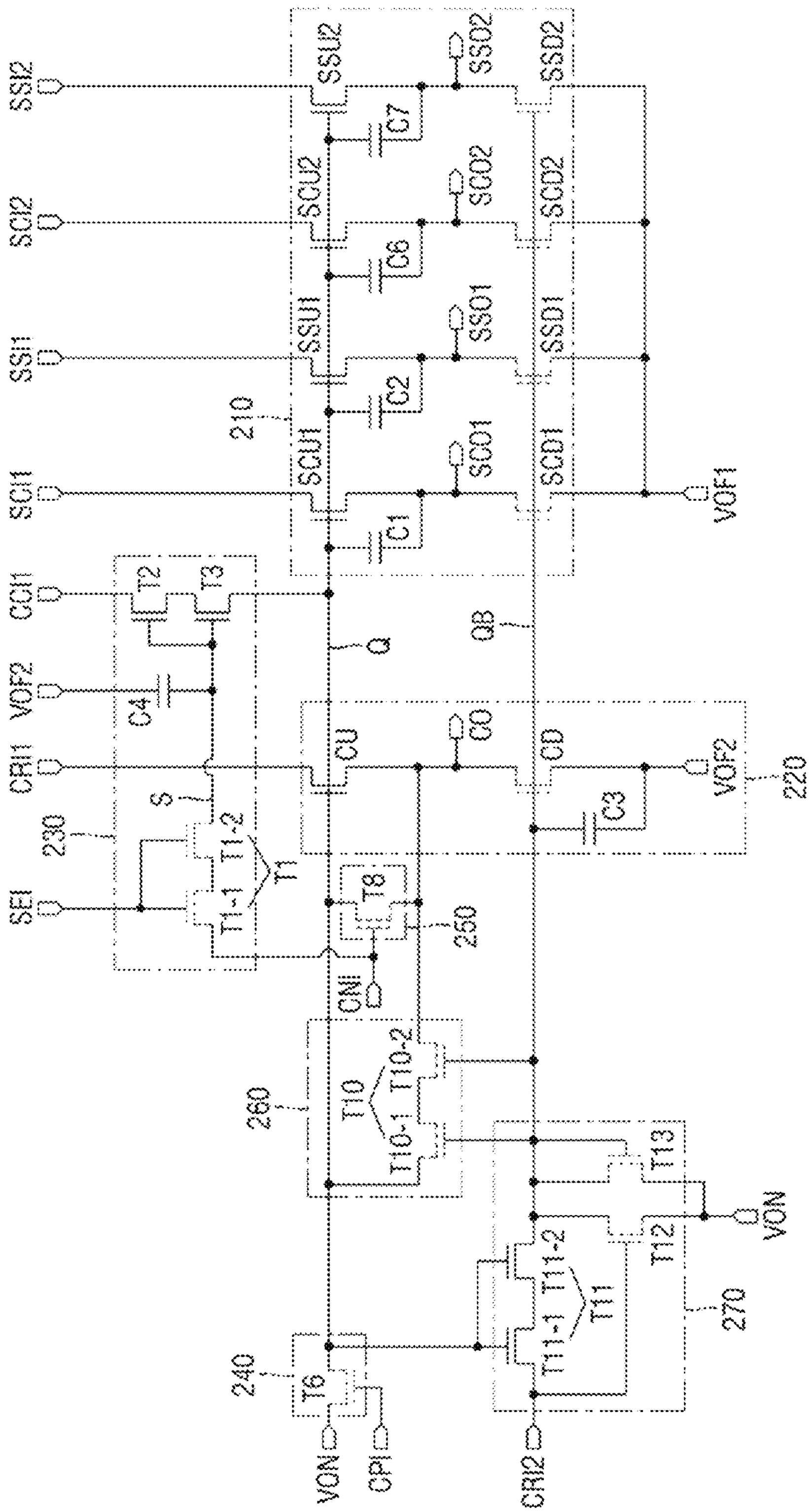
Figure 46:
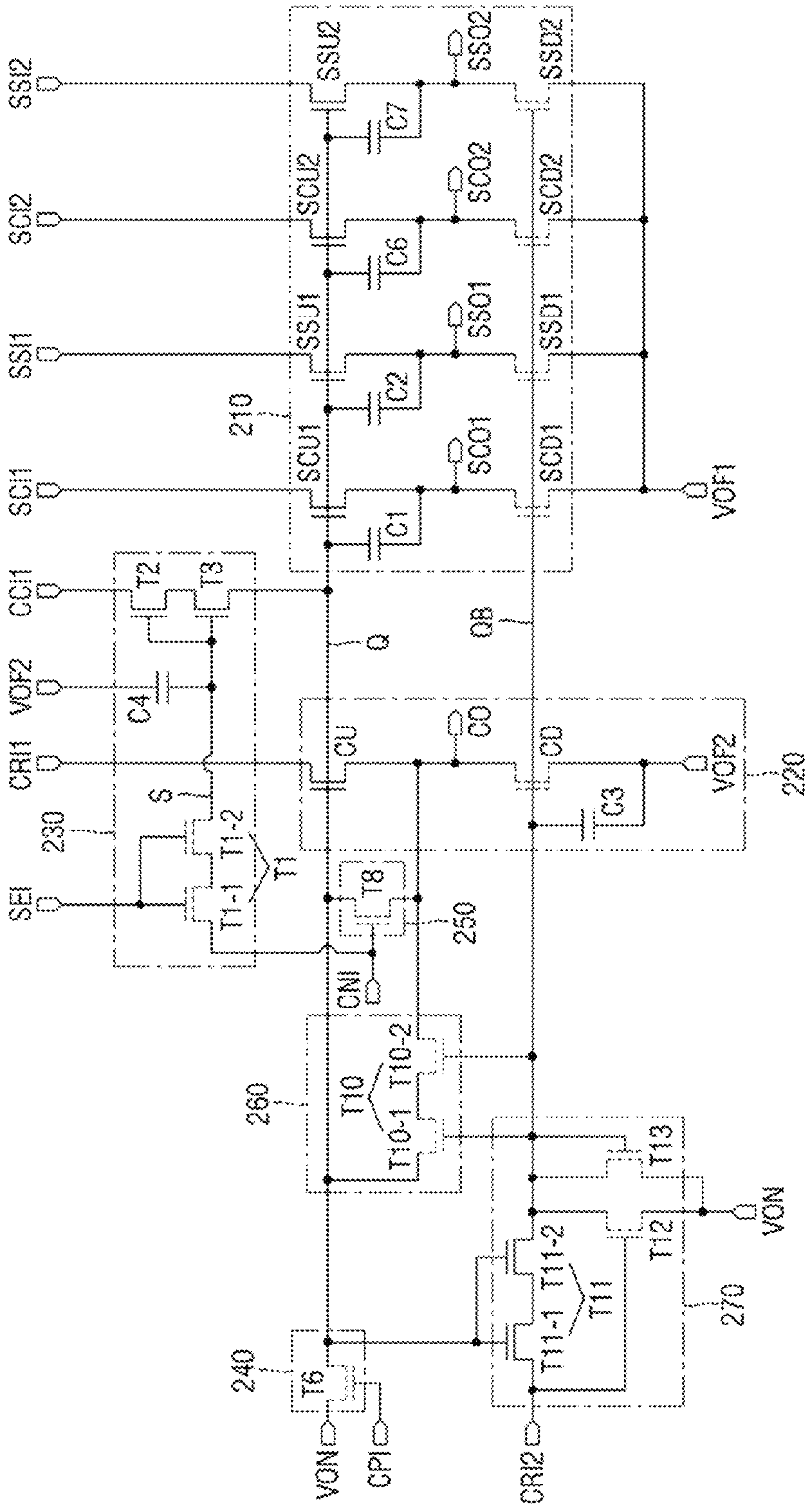
Figure 47:
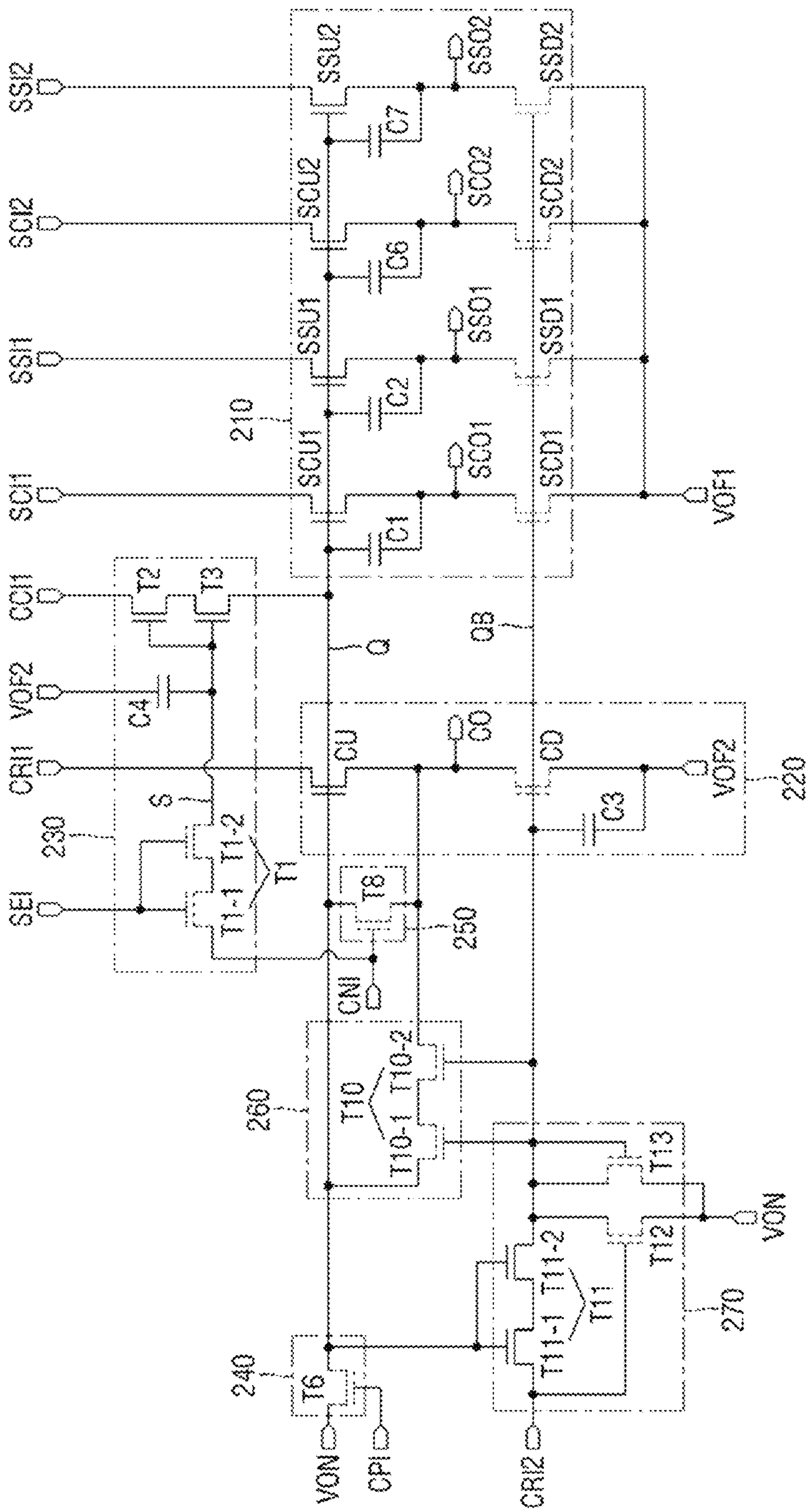
Figure 48:
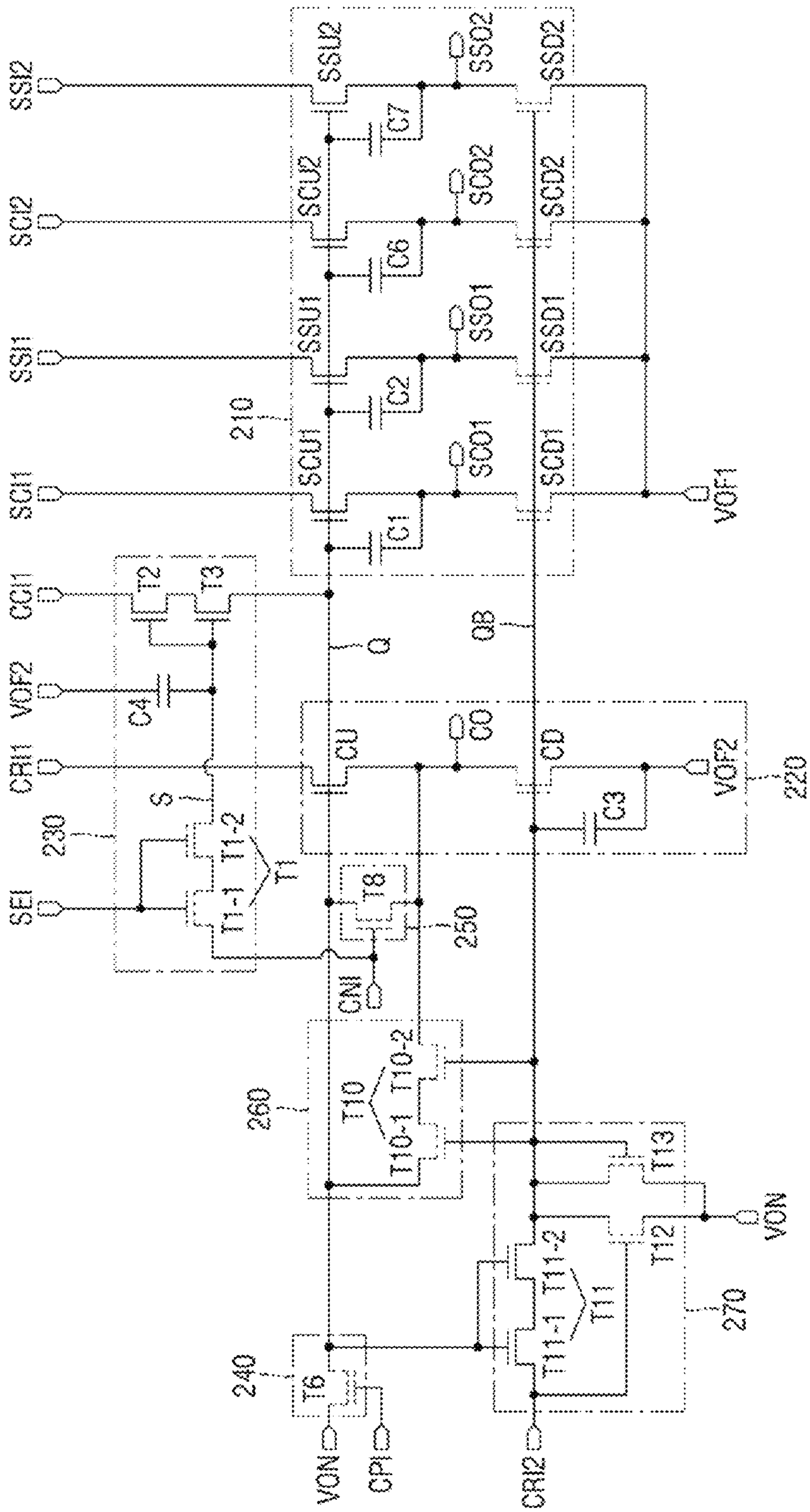
Figure 49:
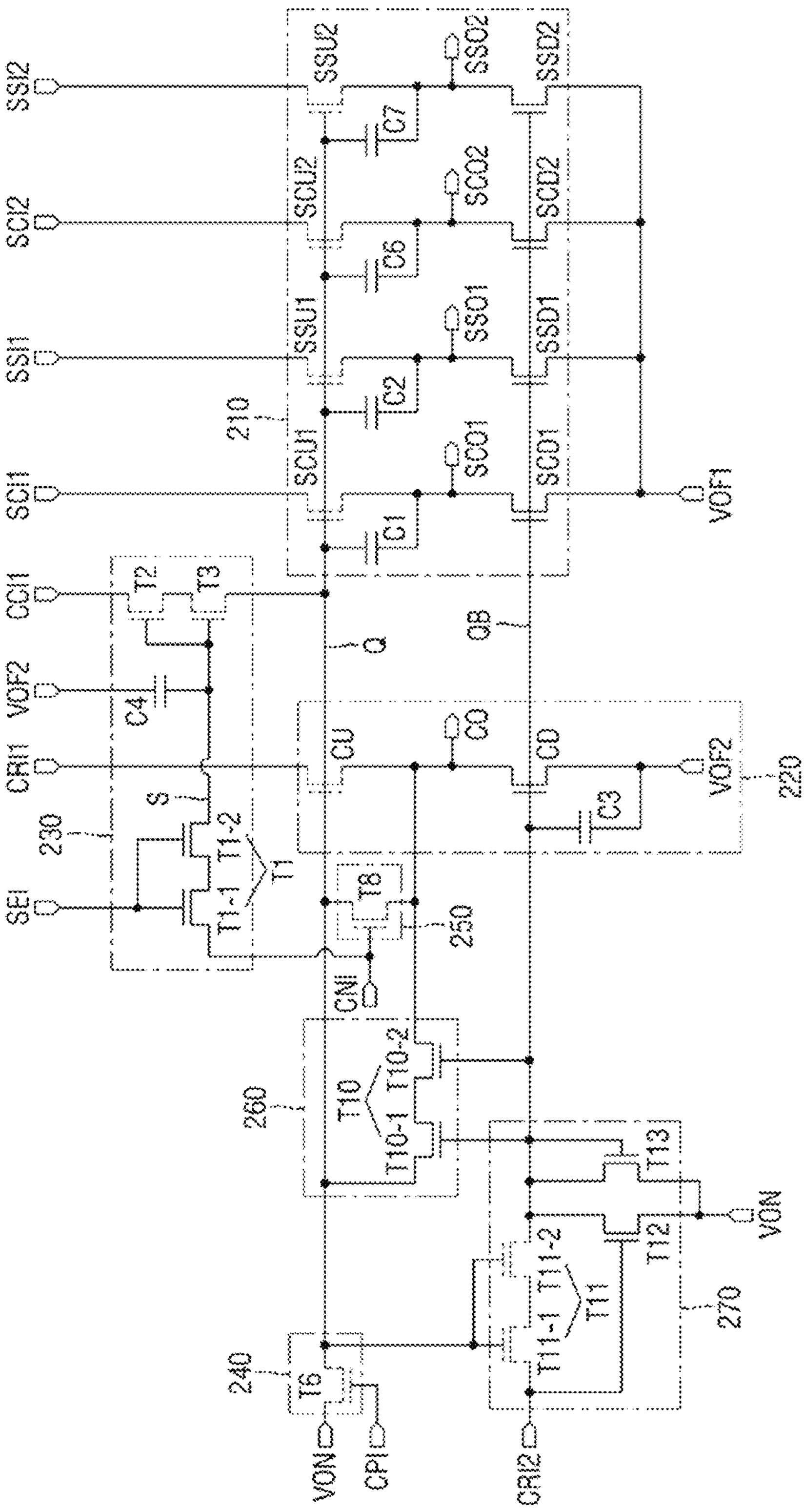
Figure 50:
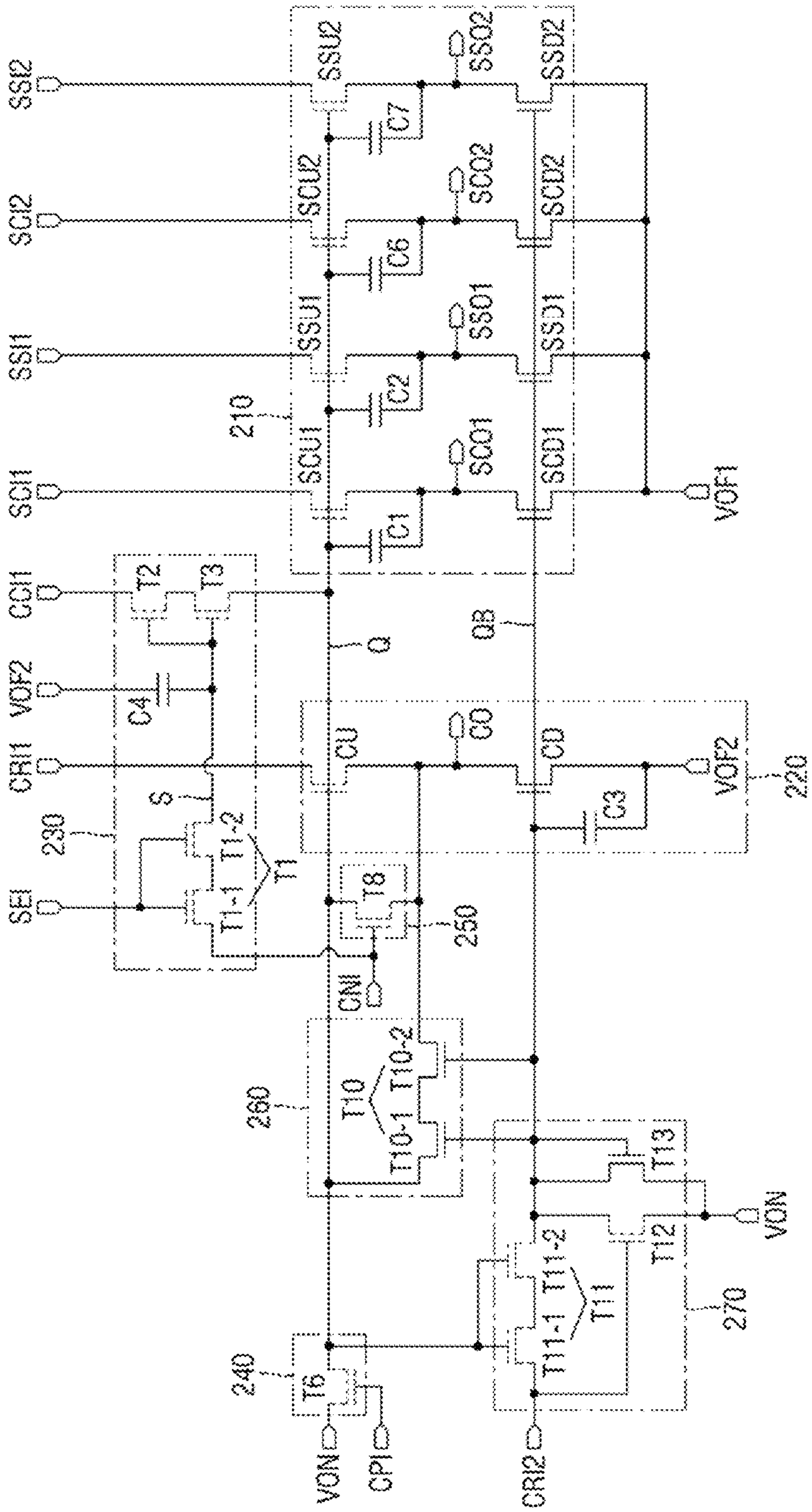

FIG. 43 is a waveform diagram showing the carry clock signals, the scan clock signals, the sensing clock signals, the sensing control signal, the (k−2) carry signal, the $k^{th}$ carry signal, the (k+2) carry signal, the voltage of the pull-up node, the voltage of the pull-down node, the $(2k-1)^{th}$ scan signal, the 2kth scan signal, the $(2k-1)^{th}$ sensing signal and the 2kth sensing signal during the blank period, according to an exemplary embodiment of the present inventive concept. FIGS. 44 to 50 are circuit diagrams illustrating operations of the $k^{th}$ stage during 1' to 7' periods of the blank period, according to an exemplary embodiment of the present inventive concept.

Referring to FIGS. 43 to 50, during the 1' to 6' time periods t1' to t6', a fourth scan clock signal CK4_SC of the first gate-off voltage Voff1 may be applied to the second scan clock terminal SCI2 of the $k^{th}$ stage STk, and a fourth sensing clock signal CK4_SS of the first gate-off voltage Voff1 may be applied to the second sensing clock terminal SSI2. Therefore, even if the second scan pull-up transistor SCU2 is turned on by a voltage higher than the gate-on voltage Von of the pull-up node Q during the second to fifth time periods t2' to t5', the second scan output terminal SCO2 outputs the first gate-off voltage Voff1. In addition, even if the second sensing pull-up transistor SSU2 is turned on by a voltage higher than the gate-on voltage Von of the pull-up node Q during the second to fifth periods t2' to t5', the second sensing output terminal SSO2 outputs the first gate-off voltage Voff1.

In addition, during the first, sixth and seventh periods t1', t6' and, t7', the second scan pull-up transistor SCU2 and the second sensing pull-up transistor SSU2 are turned off, while the second scan pull-down transistor SDU2 and the second sensing pull-down transistor SSD2 are turned on. Therefore, during the first, sixth and seventh periods t1', t6' and t7', the second scan output terminal SCO2 outputs the first gate-off voltage Voff1 of the first gate-off terminal VOF1, and the second sensing output terminal SSO2 outputs the first gate-off voltage Voff1 of the first gate-off terminal VOF1.

In the exemplary embodiment shown in FIGS. 44 to 50, operations of the transistors except for the second scan pull-up transistor SCU2, the second sensing pull-up transistor SSU2, the second scan pull-down transistor SDU2 and the second sensing pull-down transistor SSD2 during the first to seventh periods t1' to t7 may be substantially the same as those described above with reference to FIGS. 18 to 24.

Figure 51:
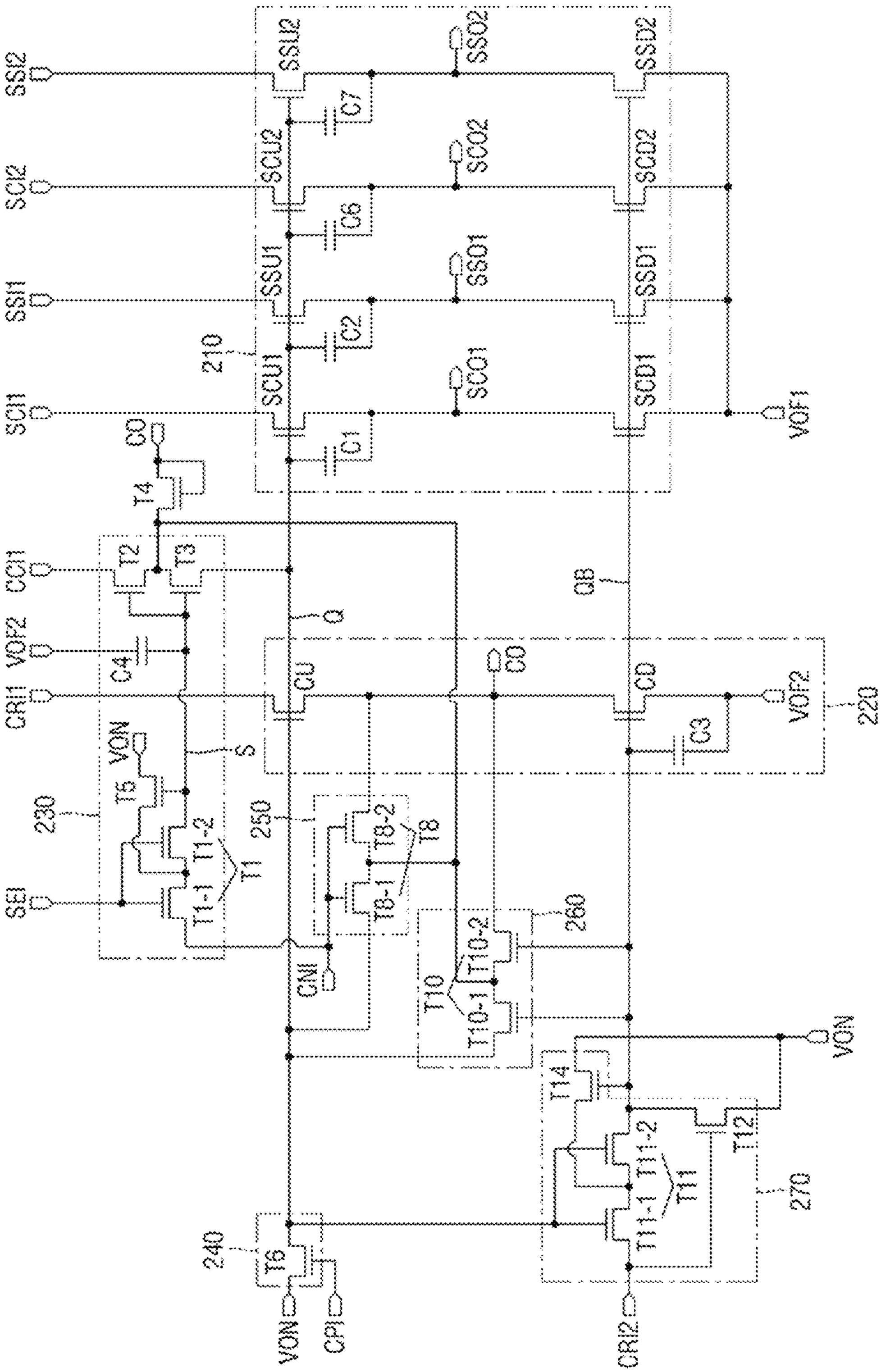
FIG. 51 is a circuit diagram showing the $k^{th}$ stage of a scan signal driver according to an exemplary embodiment of the present inventive concept.

FIG. 51 is a circuit diagram showing the $k^{th}$ stage of a scan signal driver according to an exemplary embodiment of the present inventive concept.

The exemplary embodiment shown in FIG. 51 is different from the exemplary embodiment of FIG. 34 in that a sensing controller 230 further includes a fourth transistor T4 and a fifth transistor T5, that an eighth transistor T5 of a second pull-up node controller 250 includes a $(8\text{-}1)^{th}$ transistor T8-1 and a $(8\text{-}2)^{th}$ transistor T8-2, and that an inverter 270 includes a fourteenth transistor T14 instead of a thirteenth transistor T13.

A second transistor T2, a third transistor T3 and a fourth transistor T4 of FIG. 51 are substantially identical to those described above with reference to FIG. 29.

A fourteenth transistor T14 of FIG. 51 is substantially identical to that described with reference to FIG. 30, and the thirteenth transistor T13 may be eliminated.

Referring to FIG. 51, the $(8\text{-}1)^{th}$ transistor T8-1 and the (8-2) transistor T8-2 are turned on by a carry signal of the $(k+2)^{th}$ stage ST(k+2) of the gate-on voltage, to connect the pull-up node Q with the carry output terminal CO, such that the first gate-off voltage can be applied to the pull-up node Q. The gate electrode of the $(8\text{-}1)^{th}$ transistor T8-1 may be connected to the next carry input terminal CNI, the first electrode thereof may be connected to the second electrode of the $(8\text{-}2)^{th}$ transistor T8-2, and the second electrode thereof may be connected to the pull-up node Q. The gate electrode of the $(8\text{-}2)^{th}$ transistor T8-2 may be connected to the next carry input terminal CNI, the first electrode thereof may be connected to the carry output terminal CO, and the second electrode thereof may be connected to the first electrode of the $(8\text{-}1)^{th}$ transistor T8-1.

Additionally, the fourth transistor T4 is turned on by the gate-on voltage Von of the pull-up node Q to apply the gate-on voltage Von between the second transistor T2 and the third transistor T3, between the $(8\text{-}1)^{th}$ transistor T8-1 and the $(8\text{-}2)^{th}$ transistor T8-2, and between the $(10\text{-}1)^{th}$ transistor T10-1 and the $(10\text{-}2)^{th}$ transistor T10-2. By virtue of the fourth transistor T4, it is possible to prevent or reduce the gate-on voltage of the pull-up node Q from leaking through the second transistor T2 and the third transistor T3. In addition, by virtue of the fourth transistor T4, it is possible to prevent or reduce the gate-on voltage of the pull-up node Q from leaking through the $(8\text{-}1)^{th}$ transistor T8-1 and the $(8\text{-}2)^{th}$ transistor T8-2. In addition, by virtue of the fourth transistor T4, it is possible to prevent or reduce the gate-on voltage of the pull-up node Q from leaking through the (10-1) transistor T10-1 and the $(10\text{-}2)^{th}$ transistor T10-2.

Figure 52:
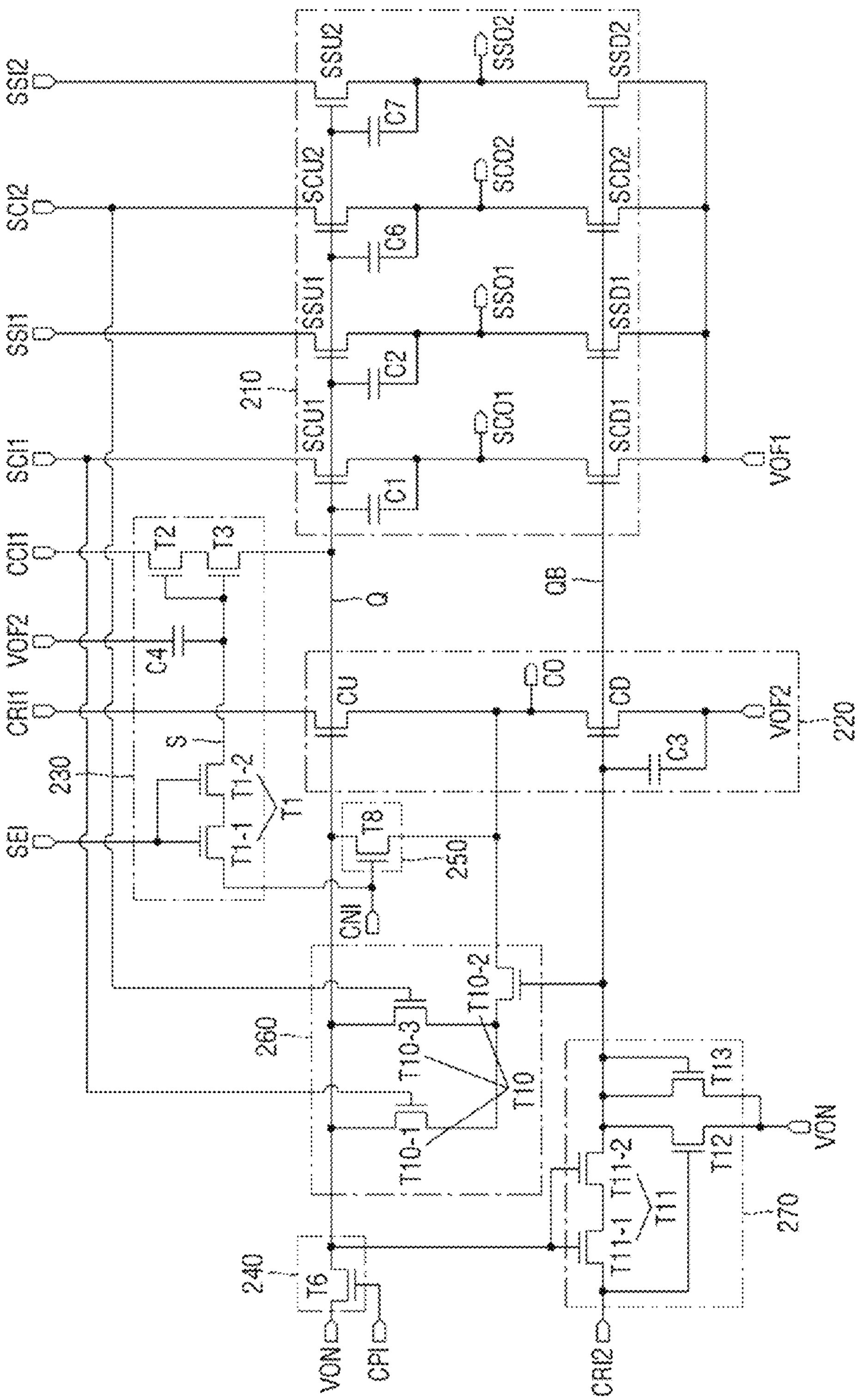
FIG. 52 is a circuit diagram showing the kV stage of a scan signal driver according to an exemplary embodiment of the present inventive concept.

FIG. 52 is a circuit diagram showing the $k^{th}$ stage of a scan signal driver according to an exemplary embodiment of the present inventive concept.

The exemplary embodiment shown in FIG. 52 is different from the exemplary embodiment of FIG. 34 in that a tenth transistor T10 of a third pull-up node controller 260 includes a $(10\text{-}1)^{th}$ transistor T10-1, a $(10\text{-}2)^{th}$ transistor T10-2, and a (10-3) transistor T10-3.

Referring to FIG. 52, the third pull-up node controller 260 applies a second gate-off voltage to a pull-up node Q when a third scan clock signal input to a first scan clock terminal SCI1 has a gate-on voltage, a fourth scan clock signal input to a second scan clock terminal SCI2 has the gate-on voltage, and the pull-down node QB has the gate-on voltage. The third pull-up node controller 260 may include the tenth transistor T10. The tenth transistor T10 may include a $(10\text{-}1)^{th}$ transistor T10-1, a $(10\text{-}2)^{th}$ transistor T0-2 and a $(10\text{-}3)^{th}$ transistor T10-3.

The $(10\text{-}1)^{th}$ transistor T10-1 is turned on by a third scan clock signal of the gate-on voltage to connect the pull-up node Q with the second electrode of the $(10\text{-}2)^{th}$ transistor T10-2. The gate electrode of the $(10\text{-}1)^{th}$ transistor T10-1 may be connected to the first scan clock terminal SCI1, the first electrode thereof may be connected to the second electrode of the $(10\text{-}2)^{th}$ transistor T10-2, and the second electrode thereof may be connected to the pull-up node Q.

The $(10\text{-}2)^{th}$ transistor T10-2 may be turned on by the gate-on voltage of the pull-down node QB to connect the carry output terminal CO with the first electrode of the $(10\text{-}1)^{th}$ transistor T10-1 and the first electrode of the $(10\text{-}3)^{th}$ transistor T10-3. The gate electrode of the $(10\text{-}2)^{th}$ transistor T10-2 may be connected to the pull-down node QB, the first electrode thereof may be connected to the carry output terminal CO, and the second electrode thereof may be connected to the first electrode of the $(10\text{-}1)^{th}$ transistor T10-1 and the first electrode of the $(10\text{-}3)^{th}$ transistor T10-3.

The $(10\text{-}3)^{th}$ transistor T10-3 is turned on by a fourth scan clock signal of the gate-on voltage to connect the pull-up node Q with the second electrode of the $(10\text{-}2)^{th}$ transistor T10-2. The gate electrode of the $(10\text{-}3)^{th}$ transistor T10-3 may be connected to the second scan clock terminal SCI2, the first electrode thereof may be connected to the second electrode of the $(10\text{-}2)^{th}$ transistor T10-2, and the second electrode thereof may be connected to the pull-up node Q.

Figure 53:
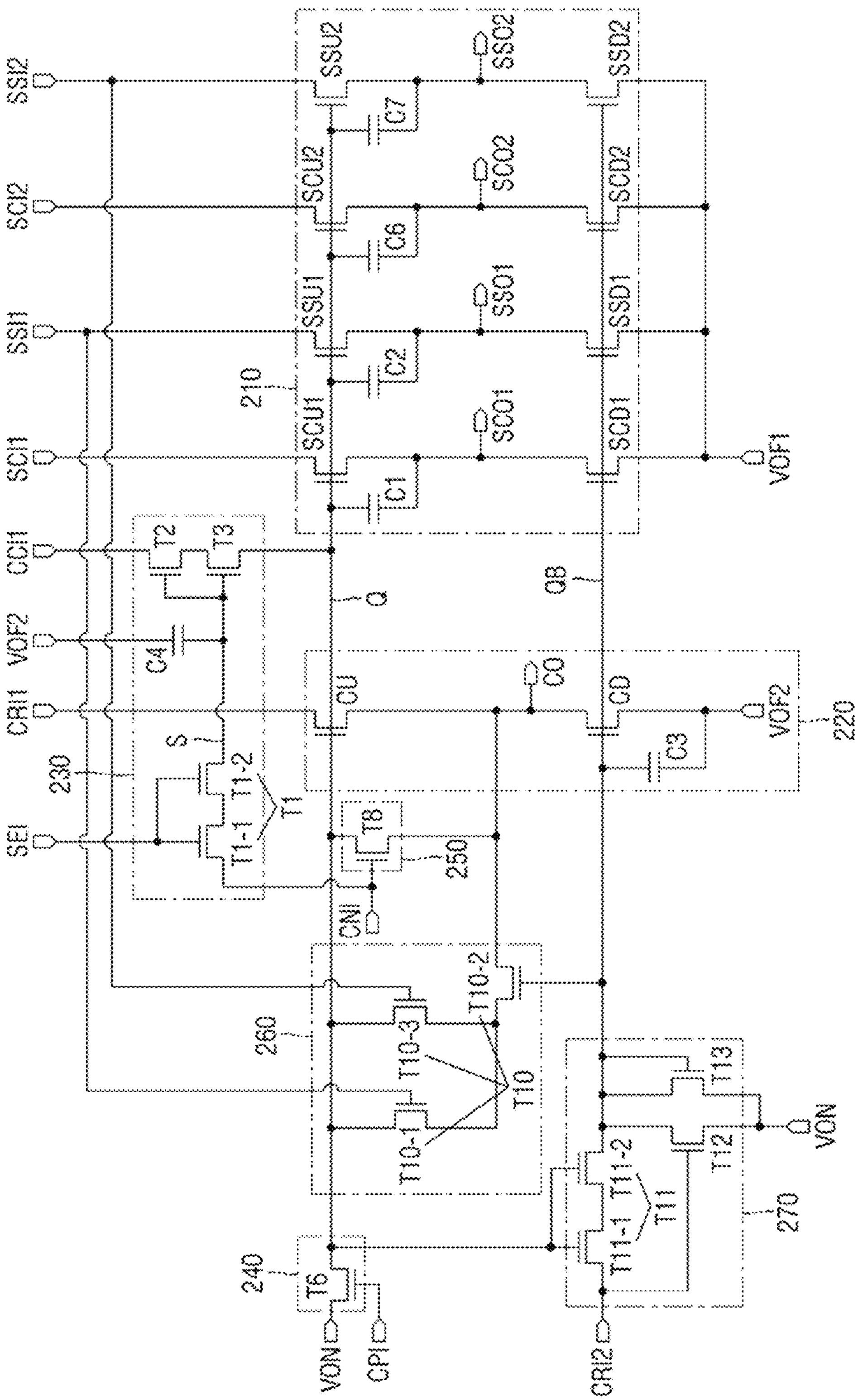
FIG. 53 is a circuit diagram showing the $k^{th}$ stage of a scan signal driver according to an exemplary embodiment of the present inventive concept.

FIG. 53 is a circuit diagram showing the $k^{th}$ stage of a scan signal driver according to an exemplary embodiment of the present inventive concept.

The exemplary embodiment shown in FIG. 53 is different from the exemplary embodiment of FIG. 52 in that the gate electrode of a $(10\text{-}1)^{th}$ transistor T10-1 is connected to a first sensing clock terminal SSI1 to which a third sensing clock signal is applied, and the gate electrode of a $(10\text{-}3)^{th}$ transistor T10-3 is connected to a second sensing clock terminal SSI2 to which a fourth sensing clock signal is applied.

Figure 54:
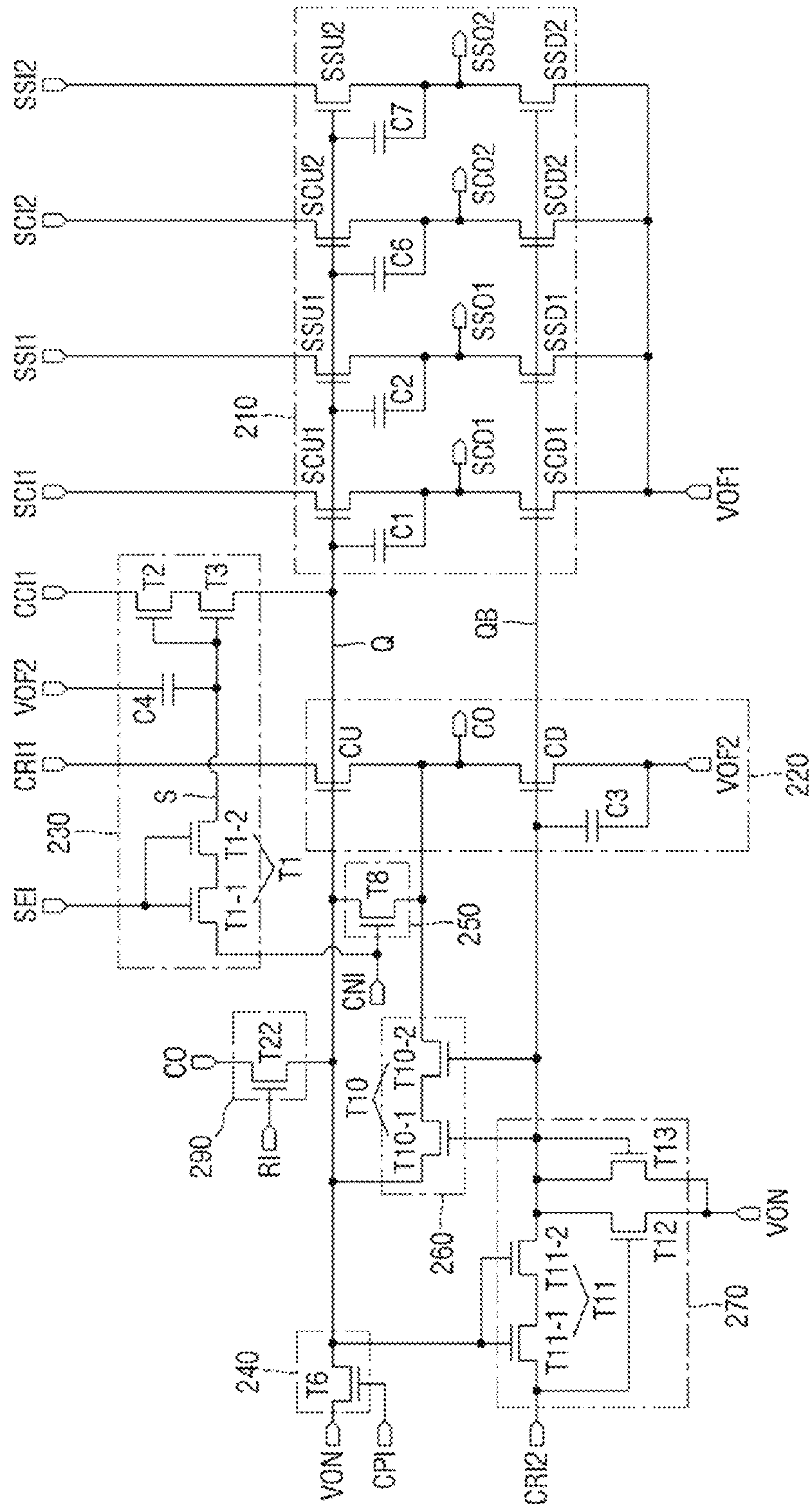
FIG. 54 is a circuit diagram showing the $k^{th}$ stage of a scan signal driver according to an exemplary embodiment of the present inventive concept.

FIG. 54 is a circuit diagram showing the $k^{th}$ stage of a scan signal driver according to an exemplary embodiment of the present inventive concept.

The exemplary embodiment shown in FIG. 54 is different from the exemplary embodiment of FIG. 34 in that the $k^{th}$ stage STk further includes a fourth pull-up node controller 290.

Referring to FIG. 54, the fourth pull-up node controller 290 applies a second gate-off voltage to a pull-up node Q when a reset signal input to a reset terminal RI of the $k^{th}$ stage STk has a gate-on voltage. The fourth pull-up node controller 290 may include a twenty-second transistor T22. The reset signal may occur at the start point of the active period ACT, at the end point of the active period ACT, or during the vertical blank period VB of the N frame period.

The twenty-second transistor T22 is turned on by the gate-on voltage of the reset signal input to the reset terminal RI to connect the pull-up node Q with the carry output terminal CO. By doing so, the second gate-off voltage of the carry output terminal CO may be applied to the pull-up node Q while the twenty-second transistor T22 is turned on. The gate electrode of the twenty-second transistor T22 may be connected to the reset terminal R1, the first electrode thereof may be connected to the carry output terminal CO, and the second electrode thereof may be connected to the pull-up node Q.

It is to be noted that the first electrode of the twenty-second transistor T22 may be connected to the second gate-off terminal VOF2 to which the second gate-off voltage Voff2 is applied, instead of the carry output terminal CO.

Figure 55:
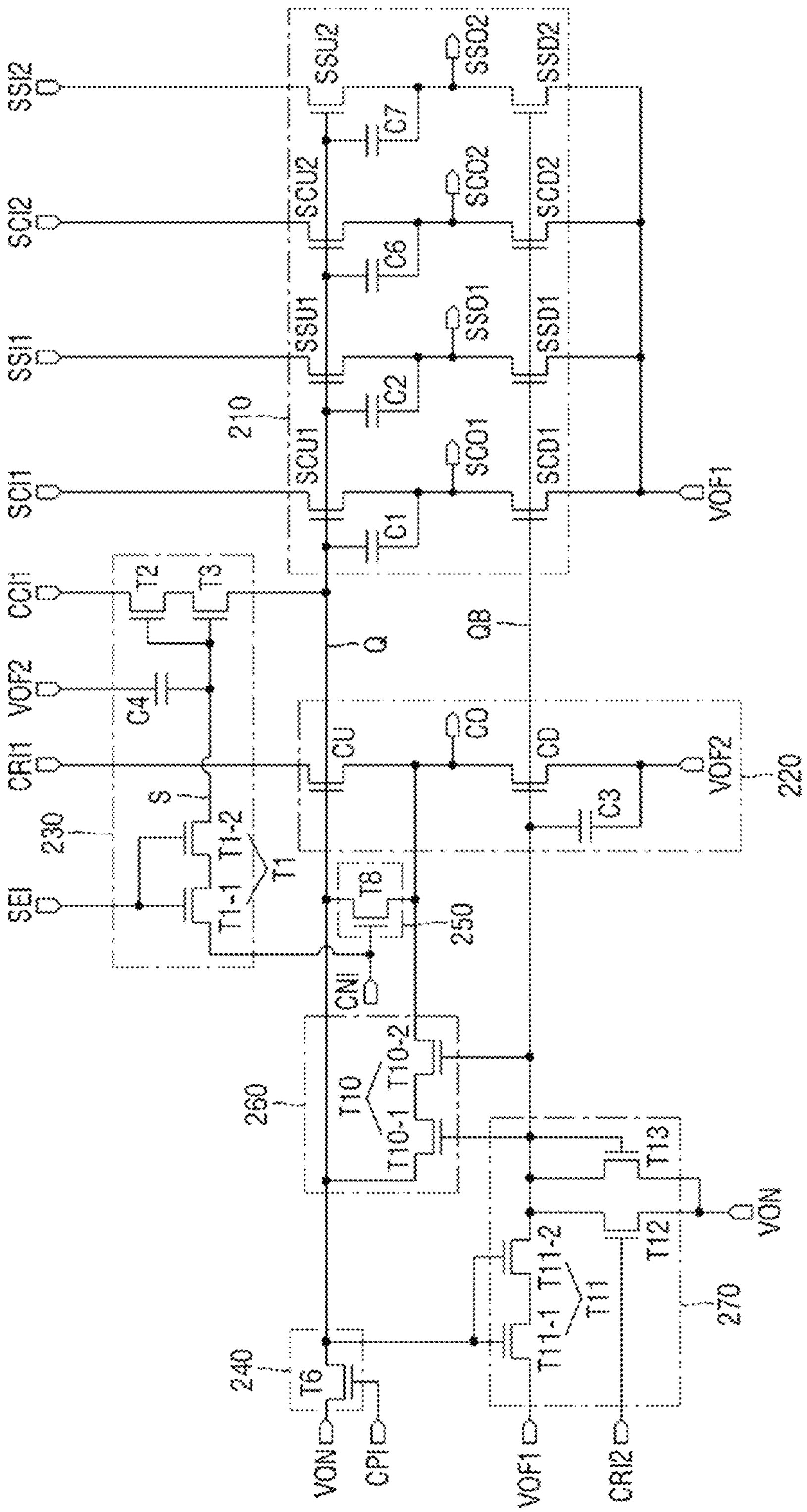
FIG. 55 is a circuit diagram showing the $k^{th}$ stage of a scan signal driver according to an exemplary embodiment of the present inventive concept.

FIG. 55 is a circuit diagram showing the $k^{th}$ stage of a scan signal driver according to an exemplary embodiment of the present inventive concept.

The exemplary embodiment shown in FIG. 55 is different from the exemplary embodiment of FIG. 34 in that the first electrode of a (11-1) transistor T11-1 may be connected to a first gate-off terminal VOF1 to which a first gate-off voltage Voff1 is applied, instead of a second carry clock terminal CRI2.

Exemplary embodiments of the present inventive concept provide a scan signal driver with a reduced area for ultra-high resolution display devices such as those equipped with 8K Ultra High Definition (UHD) resolution.

Exemplary embodiments of the present inventive concept provide ultra-high resolution display devices such as those equipped with 8K UHD resolution in which the area of a scan signal driver is reduced.

According to the aforementioned and other exemplary embodiments of the present inventive concept, a scan signal driver includes a single stage capable of outputting a scan signal and a sensing signal simultaneously, and thus it is possible to reduce the area of the scan signal driver compared with one including a stage for outputting a scan signal and another stage for outputting a sensing signal.

Further, a single stage can output different scan signals and different sensing signals during an active period and a vertical blank period.

It is to be understood that all of the transistors described herein may be implemented as MOSFETs. In addition, all of the transistors described herein may be formed of amorphous silicon (a-Si), poly silicon (poly-Si), or an oxide semiconductor.

While the present inventive concept has been particularly shown and described with reference to the exemplary embodiments thereof, it will be understood by those of ordinary skill in the art that various changes in form and detail may be made thereto without departing from the spirit and scope of the present inventive concept as set forth in the following claims.

What is claimed is:

1. A scan signal driver, comprising:

a plurality of stages for outputting scan signals and sensing signals, wherein a $k^{th}$ stage among the stages is connected to a $k^{th}$ scan signal line and a $k^{th}$ sensing signal line, and wherein the $k^{th}$ stage comprises:

a first output unit configured to output a scan clock signal input to a first scan clock terminal to the $k^{th}$ scan signal line as a $k^{th}$ scan signal and to output a sensing clock signal input to a first sensing clock terminal to the $k^{th}$ sensing signal line as a $k^{th}$ sensing signal when a pull-up node has a gate-on voltage; and a second output unit configured to output a carry clock signal input to a first carry clock terminal as a $k^{th}$ carry signal to a carry output terminal when the pull-up node has the gate-on voltage, wherein a frame period comprises an active period and a vertical blank period, and wherein the $k^{th}$ stage further comprises:

a sensing controller configured to apply the gate-on voltage to the pull-up node during the vertical blank period when a sensing control signal of the gate-on voltage is input to a sensing control terminal during the active period.

2. The scan signal driver of claim 1, wherein the first output unit comprises:

a first scan pull-up transistor configured to be turned on by the gate-on voltage of the pull-up node to output the scan clock signal to the $k^{th}$ scan signal line; and a first sensing pull-up transistor configured to be turned on by the gate-on voltage of the pull-up node to output the sensing clock signal to the $k^{th}$ sensing signal line.

3. The scan signal driver of claim 1, wherein the second output unit comprises a carry pull-up transistor configured to be turned on by the gate-on voltage of the pull-up node to output the carry clock signal to the carry output terminal.

4. The scan signal driver of claim 1, wherein the first output unit applies a first gate-off voltage to the $k^{th}$ scan signal line and the $k^{th}$ sensing line when a pull-down node has the gate-on voltage, and wherein the second output unit applies the first gate-off voltage to the carry output terminal when the pull-down node has the gate-on voltage.

5. The scan signal driver of claim 4, wherein the first output unit comprises:

a first scan pull-down transistor configured to be turned on by the gate-on voltage of the pull-down node to output the first gate-off voltage input to a first gate-off terminal to the $k^{th}$ scan signal line; and a first sensing pull-down transistor configured to be turned on by the gate-on voltage of the pull-down node to output the first gate-off voltage of the first gate-off terminal to the $k^{th}$ sensing signal line.

6. The scan signal driver of claim 4, wherein the second output unit comprises a carry pull-down transistor configured to be turned on by the gate-on voltage of the pull-down node to output the first gate-off voltage of the first gate-off terminal to the carry output terminal.

7. The scan signal driver of claim 4, wherein the k stage comprises:

a third pull-up node controller configured to hold the pull-up node at the first gate-off voltage when the scan clock signal or the sensing clock signal has the gate-on voltage and the pull-down node has the gate-on voltage; and an inverter configured to apply the first gate-off voltage to the pull-down node when the pull-up node has the gate-on voltage.

8. The scan signal driver of claim 7, wherein the third pull-up node controller comprises:

a $(10\text{-}1)^{th}$ transistor configured to be turned on by the gate-on voltage of the scan clock signal or the gate-on voltage of the sensing clock signal to connect the pull-up node with the carry output terminal; and a $(10\text{-}2)^{th}$ transistor configured to be turned on by the gate-on voltage of the pull-down node to connect the $(10\text{-}1)^{th}$ transistor with the carry output terminal.

9. The scan signal driver of claim 7, wherein the third pull-up node controller comprises:

a $(10\text{-}1)^{th}$ transistor configured to be turned on by the gate-on voltage of the scan clock signal or the gate-on voltage of the sensing clock signal to connect the pull-up node with the carry output terminal; and a $(10\text{-}2)^{th}$ transistor configured to be turned on by the gate-on voltage of the scan clock signal or the gate-on voltage of the sensing clock signal to connect the $(10\text{-}1)^{th}$ transistor with the carry output terminal.

10. The scan signal driver of claim 7, wherein the inverter comprises:

an $(11\text{-}1)^{th}$ transistor configured to be turned on by the gate-on voltage of the pull-up node to apply the first gate-off voltage to the pull-down node;

an $(11\text{-}2)^{th}$ transistor configured to be turned on by the gate-on voltage of the pull-up node to connect the pull-down node with a $(13\text{-}1)^{th}$ transistor; and a twelfth transistor configured to be turned on by the gate-on voltage of another carry clock signal input to a second carry clock terminal to apply the gate-on voltage to the pull-down node.

11. The scan signal driver of claim 7, wherein the inverter comprises a thirteenth transistor configured to be turned on by the gate-on voltage of the pull-down node to apply the gate-on voltage to the pull-down node.

12. The scan signal driver of claim 7, wherein the inverter further comprises: a fourteenth transistor configured to be turned on by the gate-on voltage of the pull-down node to apply the gate-on voltage between an $(11\text{-}1)^{th}$ transistor and an $(11\text{-}2)^{th}$ transistor.

13. The scan signal driver of claim 1, wherein the sensing controller comprises:

a first transistor configured to be turned on by the gate-on voltage of the sensing control signal to apply the gate-on voltage to a sensing control node; and a second transistor configured to be turned on by the gate-on voltage of the sensing control node to apply a first control clock signal input to a first control clock terminal to the pull-up node.

14. The scan signal driver of claim 13, wherein the sensing controller further comprises a third transistor configured to be turned on by the gate-on voltage of the sensing control node to connect the second transistor with the pull-up node.

15. The scan signal driver of claim 13, wherein the sensing controller comprises:

a third transistor configured to be turned on by a gate-on voltage of a second control clock signal input to a second control clock terminal to connect the second transistor with the first control clock terminal; and a fourth transistor configured to be turned on by the gate-on voltage of the pull-up node to apply the gate-on voltage between the second transistor and the third transistor.

16. The scan signal driver of claim 13, wherein the sensing controller further comprises:

a third transistor configured to be turned on by a gate-on voltage of a second control clock signal input to a second control clock terminal to connect the second transistor with the pull-up node; and a fourth transistor configured to be turned on by the gate-on voltage of the pull-up node to apply the gate-on voltage between the second transistor and the third transistor.

17. The scan signal driver of claim 1, wherein the sensing controller comprises:

a $(1\text{-}1)^{th}$ transistor configured to be turned on by the gate-on voltage of the sensing control signal to apply the gate-on voltage to a sensing control node;

a $(1\text{-}2)^{th}$ transistor configured to be turned on by the gate-on voltage of the sensing control signal to connect a third transistor with the sensing node; and a fifth transistor configured to be turned on by the gate-on voltage of the sensing control node to apply the gate-on voltage between the $(1\text{-}1)^{th}$ transistor and the $(1\text{-}2)^{th}$ transistor.

18. The scan signal driver of claim 1, wherein the $k^{th}$ stage comprises:

a first pull-up node controller configured to apply the gate-on voltage to the pull-up node when a carry signal of a previous stage with respect to the $k^{th}$ stage has a gate-on voltage; and a second pull-up node controller configured to apply the first gate-off voltage to the pull-up node when a carry signal of a subsequent stage with respect to the $k^{th}$ stage has a gate-on voltage.

19. The scan signal driver of claim 18, wherein the first pull-up node controller comprises: a sixth transistor configured to be turned on by the gate-on voltage of the carry signal of the previous stage to apply the gate-on voltage to the pull-up node.

20. The scan signal driver of claim 18, wherein the first pull-up node controller comprises:

a $(6\text{-}1)^{th}$ a transistor configured to be turned on by the gate-on voltage of the carry signal of the previous stage to apply the gate-on voltage to the pull-up node;

a $(6\text{-}2)^{th}$ transistor configured to be turned on by the gate-on voltage of the carry signal of the previous stage to connect the $(6\text{-}1)^{th}$ transistor with the pull-up node; and a seventh transistor configured to be turned on by the gate-on voltage of the $k^{th}$ carry signal to apply the gate-on voltage between the $(6\text{-}1)^{th}$ transistor and the $(6\text{-}2)^{th}$ transistor.

21. The scan signal driver of claim 18, wherein the second pull-up node controller comprises: an eighth transistor configured to be turned on by the gate-on voltage of the carry signal of the subsequent stage to connect the pull-up node with the carry output terminal.

22. The scan signal driver of claim 18, wherein the second pull-up node controller comprises:

an $(8\text{-}1)^{th}$ transistor configured to turned on by the gate-on voltage of the carry signal of the subsequent stage to connect the pull-up node with a first gate-off terminal to which a first gate-off voltage is applied; and an $(8\text{-}2)^{th}$ transistor configured to be turned on by the gate-on voltage of the carry signal of the subsequent stage to connect the $(8\text{-}1)^{th}$ transistor with the first gate-off terminal.

23. The scan signal driver of claim 22, wherein the second pull-up node controller comprises a ninth transistor configured to be turned on by the gate-on voltage of the carry output terminal to connect the carry output terminal between the $(8\text{-}1)^{th}$ transistor and the $(8\text{-}2)^{th}$ transistor.

24. The scan signal driver of claim 1, wherein the $k^{th}$ stage is connected to a $(k+1)^{th}$ scan signal line and a $(k+1)^{th}$ sensing signal line, and wherein the first output unit is configured to output another scan clock signal input to a second scan clock terminal to the $(k+1)^{th}$ scan signal line as a (k+1) scan signal, and to output another sensing clock signal input to a second sensing clock terminal to the $(k+1)^{th}$ sensing signal line as a (k+1) sensing signal when the pull-up node has the gate-on voltage.

25. The scan signal driver of claim 24, wherein the first output unit comprises:

a second scan pull-up transistor configured to be turned on by the gate-on voltage of the pull-up node to output the another scan clock signal to the $(k+1)^{th}$ scan signal line; and a second sensing pull-up transistor configured to be turned on by the gate-on voltage of the pull-up node to output the another sensing clock signal to the $(k+1)^{th}$ sensing signal line.

26. The scan signal driver of claim 24, wherein the first output unit applies a first gate-off voltage to the $(k+1)^{th}$ scan signal line and the $(k+1)^{th}$ sensing line when the pull-down node has the gate-on voltage.

27. The scan signal driver of claim 26, wherein the first output unit comprises:

a second scan pull-down transistor configured to be turned on by the gate-on voltage of the pull-down node to output the first gate-off voltage input to a first gate-off terminal to the $(k+1)^{th}$ scan signal line; and a second sensing pull-down transistor configured to be turned on by the gate-on voltage of the pull-down node to output the first gate-off voltage of the first gate-off terminal to the $(k+1)^{th}$ sensing signal line.

28. The scan signal driver of claim 26, wherein the $k^{th}$ stage comprises:

a first pull-up node controller configured to apply the gate-on voltage to the pull-up node when a carry signal of a previous stage with respect to the $k^{th}$ stage has a gate-on voltage;

a second pull-up node controller configured to apply the first gate-off voltage to the pull-up node when a carry signal of a subsequent stage with respect to the $k^{th}$ stage has a gate-on voltage; and a third pull-up node controller configured to hold the pull-up node at the first gate-off voltage when the pull-down node has the gate-on voltage.

29. The scan signal driver of claim 28, wherein the third pull-up node controller comprises:

a $(10\text{-}1)^{th}$ transistor configured to be turned on by the gate-on voltage of the pull-down node to connect the pull-up node with the carry output terminal; and a $(10\text{-}2)^{th}$ transistor configured to be turned on by the gate-on voltage of the pull-down node to connect the $(10\text{-}1)^{th}$ transistor with the carry output terminal.

30. The scan signal driver of claim 28, wherein the third pull-up node controller comprises:

a $(10\text{-}1)^{th}$ transistor configured to be turned on by the gate-on voltage of the scan clock signal or the gate-on voltage of the sensing clock signal to connect the pull-up node with the carry output terminal;

a $(10\text{-}2)^{th}$ transistor configured to be turned on by the gate-on voltage of the pull-down node to connect the $(10\text{-}1)^{th}$ transistor with the carry output terminal; and a $(10\text{-}3)^{th}$ transistor configured to be turned on by the gate-on voltage of the another scan clock signal or the gate-on voltage of the sensing clock signal to connect the pull-up node with the $(10\text{-}2)^{th}$ transistor.

31. The scan signal driver of claim 28, wherein the third pull-up node controller comprises:

a $(10\text{–}1)^{th}$ transistor configured to be turned on by the gate-on voltage of the pull-down node to connect the pull-up node with a first gate-off terminal to which the first gate-off voltage is applied; and a $(10\text{-}2)^{th}$ transistor configured to be turned on by the gate-on voltage of the pull-down node to connect the $(10\text{-}1)^{th}$ transistor with the first gate-off terminal.

32. A scan signal driver, comprising:

a plurality of stages for outputting scan signals and sensing signals, wherein a first stage among the stages is connected to a first scan signal line and a first sensing signal line, and wherein the first stage comprises:

a first output unit configured to output a scan clock signal input to a first scan clock terminal to the first scan signal line as a first scan signal and to output a sensing clock signal input to a first sensing clock terminal to the first sensing signal line as a first sensing signal when a pull-up node has a gate-on voltage; and a sensing controller configured to apply the gate-on voltage to the pull-up node during a vertical blank period of a frame period when a sensing control signal of the gate-on voltage is input to a sensing control terminal during an active period of the frame period.

33. A display device, comprising:

a display panel comprising data lines, scan signal lines and sensing signal lines, and pixels connected to the data lines, the scan signal lines and the sensing signal lines;

a data driver for applying data voltages to the data lines; and a scan signal driver comprising a plurality of stages for applying scan signals to the scan signal lines and applying sensing signals to the sensing signal lines, wherein a first stage among the stages is connected to a first scan signal line and a first sensing signal line, and wherein the first stage comprises:

a first output unit configured to output a scan clock signal input to a first scan clock terminal to the first scan signal line as a first scan signal and to output a sensing clock signal input to a first sensing clock terminal to the first sensing signal line as a first sensing signal when a pull-up node has a gate-on voltage; and a second output unit configured to output a carry clock signal input to a first carry clock terminal as a first carry signal to a carry output terminal when the pull-up node has the gate-on voltage, wherein the first stage is connected to a second scan-signal line and a second sensing signal line, and wherein the first output unit is configured to output another scan clock signal input to a second scan clock terminal to the second scan signal line as a second scan signal, and to output another sensing clock signal input to a second sensing clock terminal to the second sensing signal line as a second sensing signal when the pull-up node has the gate-on voltage.

* * * * *